United States Patent
Kamikawa et al.

(10) Patent No.: US 12,417,913 B2
(45) Date of Patent: Sep. 16, 2025

(54) METHOD FOR FLATTENING A SURFACE ON AN EPITAXIAL LATERAL GROWTH LAYER

(71) Applicant: The Regents of the University of California, Oakland, CA (US)

(72) Inventors: Takeshi Kamikawa, Santa Barbara, CA (US); Srinivas Gandrothula, Santa Barbara, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 577 days.

(21) Appl. No.: 17/429,570

(22) PCT Filed: Mar. 2, 2020

(86) PCT No.: PCT/US2020/020647
§ 371 (c)(1),
(2) Date: Aug. 9, 2021

(87) PCT Pub. No.: WO2020/180785
PCT Pub. Date: Sep. 10, 2020

(65) Prior Publication Data
US 2022/0108883 A1   Apr. 7, 2022

Related U.S. Application Data

(60) Provisional application No. 62/812,453, filed on Mar. 1, 2019.

(51) Int. Cl.
*H01L 21/02* (2006.01)
*H10D 62/85* (2025.01)

(52) U.S. Cl.
CPC .... *H01L 21/0254* (2013.01); *H01L 21/02458* (2013.01); *H01L 21/02639* (2013.01);
(Continued)

(58) Field of Classification Search
CPC ....... C01B 21/072–0728; C01B 21/064–0648; C01B 21/0632
See application file for complete search history.

(56) References Cited

U.S. PATENT DOCUMENTS

| | | | |
|---|---|---|---|
| 6,265,289 B1 * | 7/2001 | Zheleva | H01L 21/0254 257/190 |
| 2003/0143771 A1 * | 7/2003 | Kidoguchi | H10H 20/835 257/E33.068 |

(Continued)

FOREIGN PATENT DOCUMENTS

| | | |
|---|---|---|
| CN | 1518138 | 8/2004 |
| CN | 103608923 | 2/2014 |

(Continued)

OTHER PUBLICATIONS

Chinese First Office Action (with English translation) dated Aug. 30, 2023 for Chinese Patent Application No. 202080024824.6.

(Continued)

*Primary Examiner* — Matthew C Landau
*Assistant Examiner* — Nora T. Nix
(74) *Attorney, Agent, or Firm* — Gates & Cooper LLP

(57) ABSTRACT

A method for flattening a surface on an epitaxial lateral overgrowth (ELO) layer, resulting in obtaining a smooth surface with island-like III-nitride semiconductor layers. The island-like III-nitride semiconductor layers are formed by stopping the growth of the ELO layers before they coalesce to each other. Then, a growth restrict mask is removed before at least some III-nitride device layers are grown. Removing the mask decreases an excess gases supply to side facets of the island-like III-nitride semiconductor layers, which can help to obtain a smooth surface on the island-like III-nitride semiconductor layers. The method also avoids compensation of a p-type layer by decomposed (Continued)

n-type dopant from the mask, such as Silicon and Oxygen atoms.

7 Claims, 64 Drawing Sheets

(52) U.S. Cl.
CPC ... *H10D 62/8503* (2025.01); *H01L 21/02387* (2013.01); *H01L 21/02455* (2013.01); *H01L 21/02538* (2013.01)

(56) References Cited

U.S. PATENT DOCUMENTS

| | | | |
|---|---|---|---|
| 2006/0266281 A1 | 11/2006 | Beaumont et al. | |
| 2007/0164306 A1* | 7/2007 | Nakahata | H01L 21/02389 257/E33.033 |
| 2009/0258453 A1 | 10/2009 | Lee et al. | |
| 2010/0001289 A1 | 1/2010 | Frayssinet et al. | |
| 2015/0137137 A1 | 5/2015 | Chowdhury et al. | |
| 2015/0179875 A1* | 6/2015 | Jang | H01L 21/0254 438/492 |
| 2018/0190789 A1 | 7/2018 | Bour et al. | |
| 2022/0123166 A1 | 4/2022 | Kamikawa et al. | |

FOREIGN PATENT DOCUMENTS

| | | |
|---|---|---|
| CN | 104733365 | 6/2015 |
| CN | 113439322 | 9/2021 |
| CN | 113439322 A | 9/2021 |
| EP | 1748470 A4 | 7/2011 |
| JP | 2000277437 | 10/2000 |
| JP | 2001520169 A | 10/2001 |
| JP | 2002009004 | 1/2002 |
| JP | 2002299251 | 10/2002 |
| JP | 2006316307 | 11/2006 |
| JP | 2006316307 A | 11/2006 |
| JP | 2007001857 A | 1/2007 |
| JP | 2007184504 B | 2/2012 |
| JP | 2014520405 A | 8/2014 |
| JP | 2015500573 | 1/2015 |
| WO | 2013/089459 | 6/2013 |
| WO | 2019055936 A1 | 3/2019 |
| WO | 2019222669 A1 | 11/2019 |
| WO | 2020150511 A1 | 7/2020 |

OTHER PUBLICATIONS

PCT International Search Report and Written Opinion dated May 12, 2020 for PCT Application No. PCT/US2020/020647.
Zytkiewicz, Zr. Epitaxial Lateral Overgrowth—A Tool for Dislocation Blockade in Multilayer Systems. Acta Physica Polonica A. 1998. vol. 94(2). p. 220, figure 1; p. 225, figure 2.
Extended European Search Report dated Apr. 4, 2022 for EP Application No. 20766879.9.
Zheleva TS et al: "Pendeo-epitaxy—a new approach for lateral growth of gallium nitride structures", MRS Internet Journal of Nitride Semiconductor Research, Materials Research Society, Warrendale, PA, US, vol. 4SI, Nov. 30, 1999 (Nov. 30, 1999), 7 pages.
Japanese Final Office Action dated Aug. 23, 2023 for Japanese Application No. 2021-551540.
Chinese Office Action dated Aug. 30, 2023 for Chinese Application No. 202080024824.6.
Japanese Notice of Reasons for Rejection dated Nov. 25, 2022 for JP Application No. 2021-551540.
Chinese Second Office Action (with English translation) dated May 25, 2024 for Chinese Patent Application No. 202080024824.6.
Chinese Third Office Action (with English translation) dated Nov. 16, 2024 for Chinese Patent Application No. 202080024824.6.

* cited by examiner

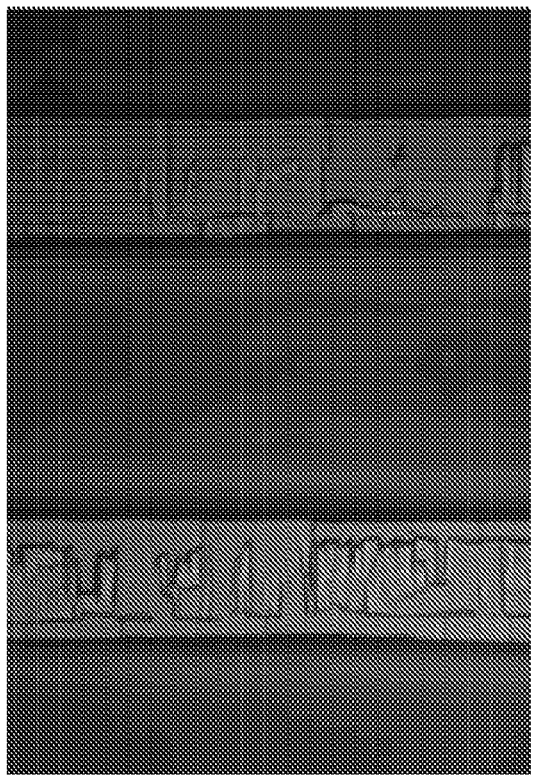
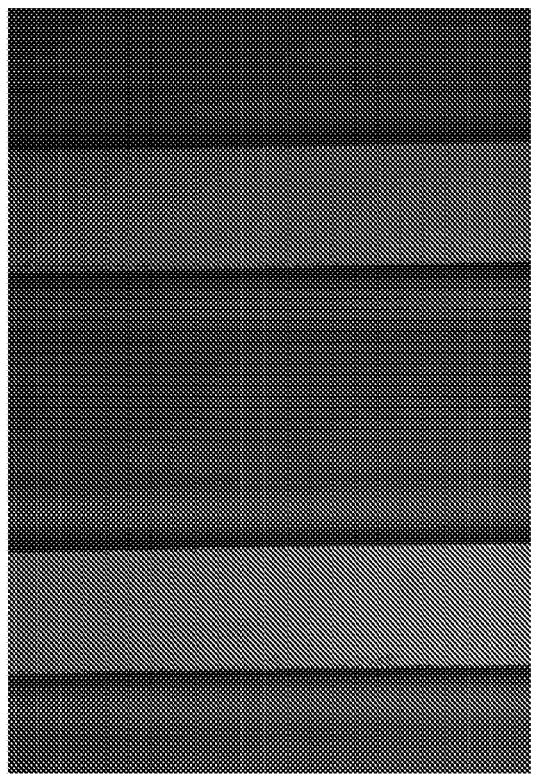
Fig. 2(c)

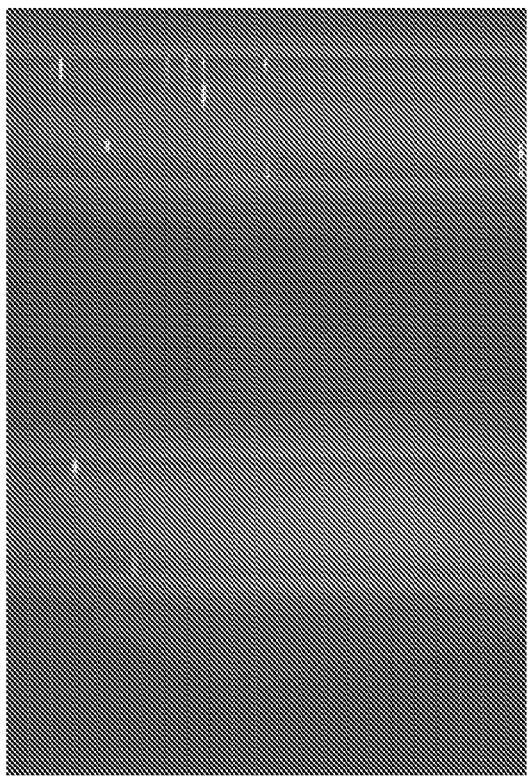
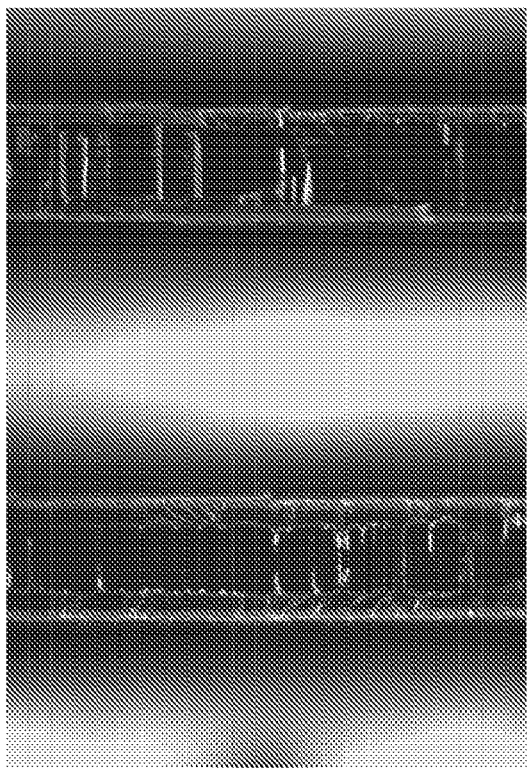
Fig. 2(d)

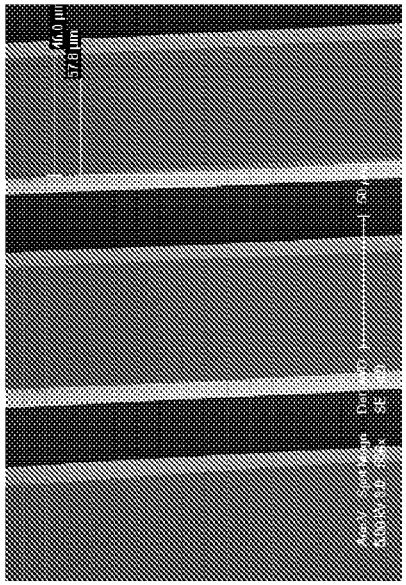
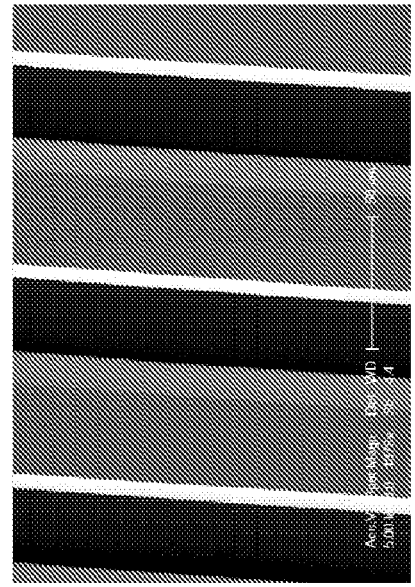
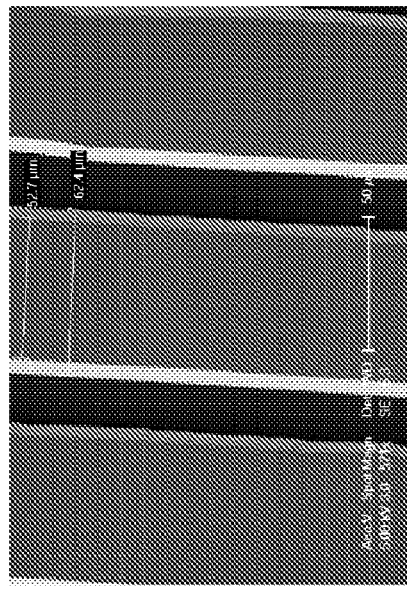
Fig. 3(b)
(1) 0 degree
(2) -0.45 degree
(3) -0.6 degree
(4) -1.0 degree

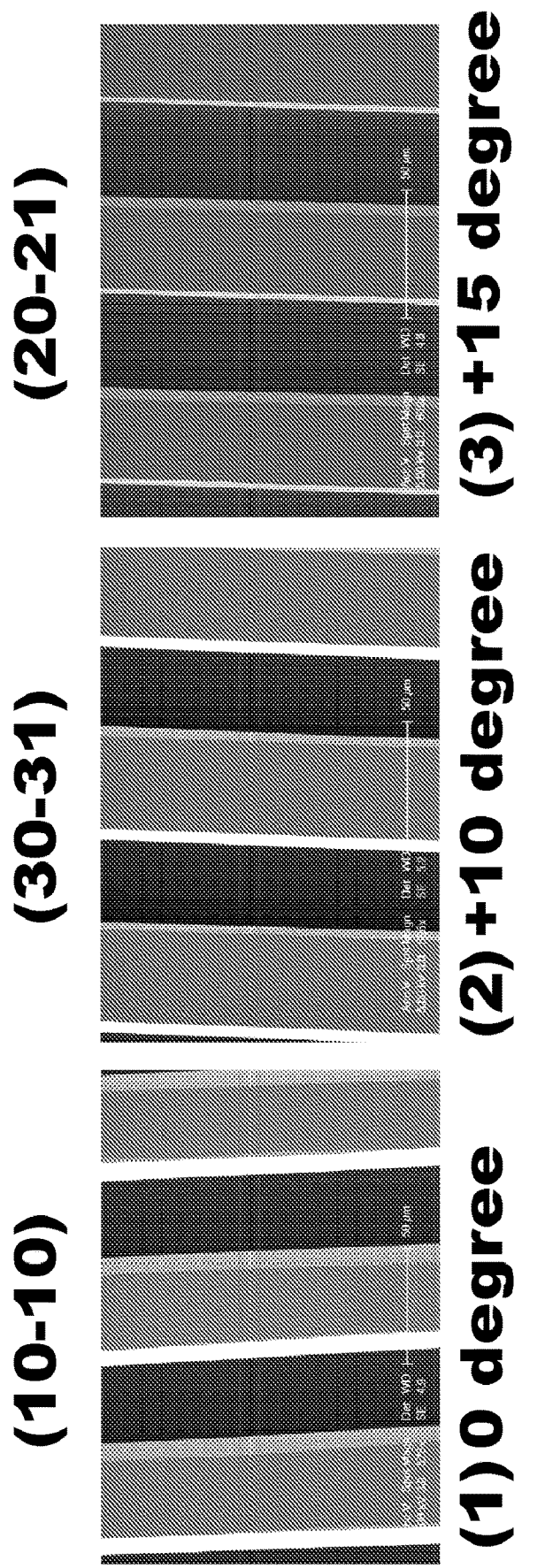

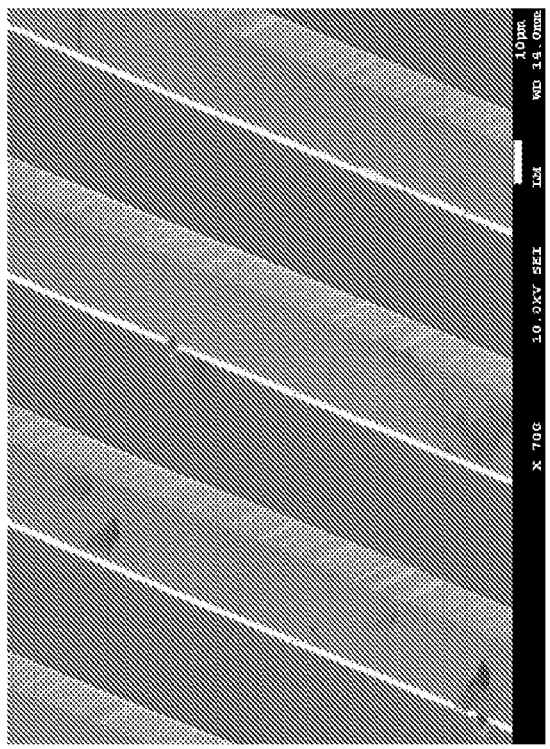
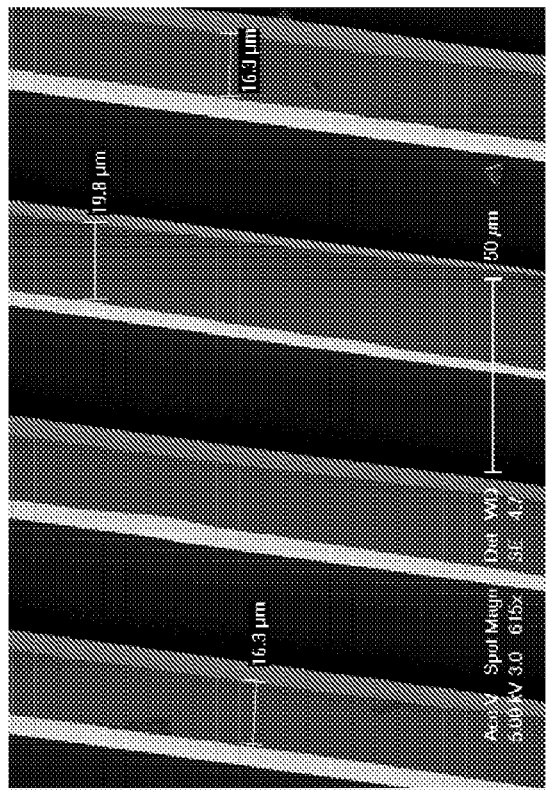
(1) 0.2 degree    (2) 0.8 degree
Fig. 3(e)

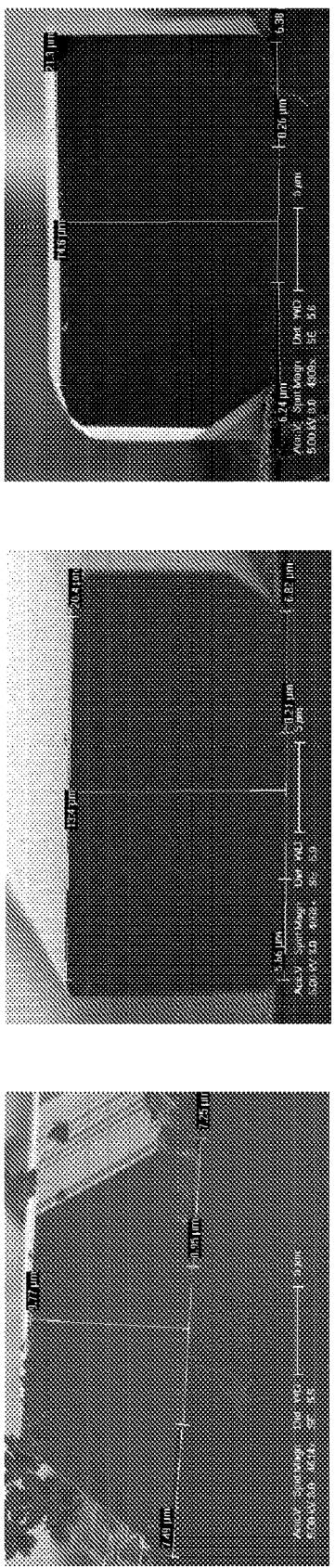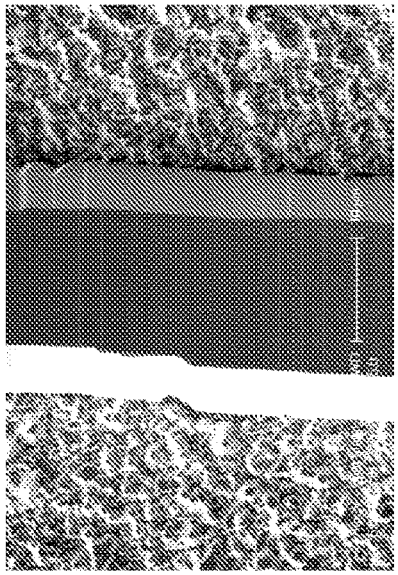
Fig. 3(f)

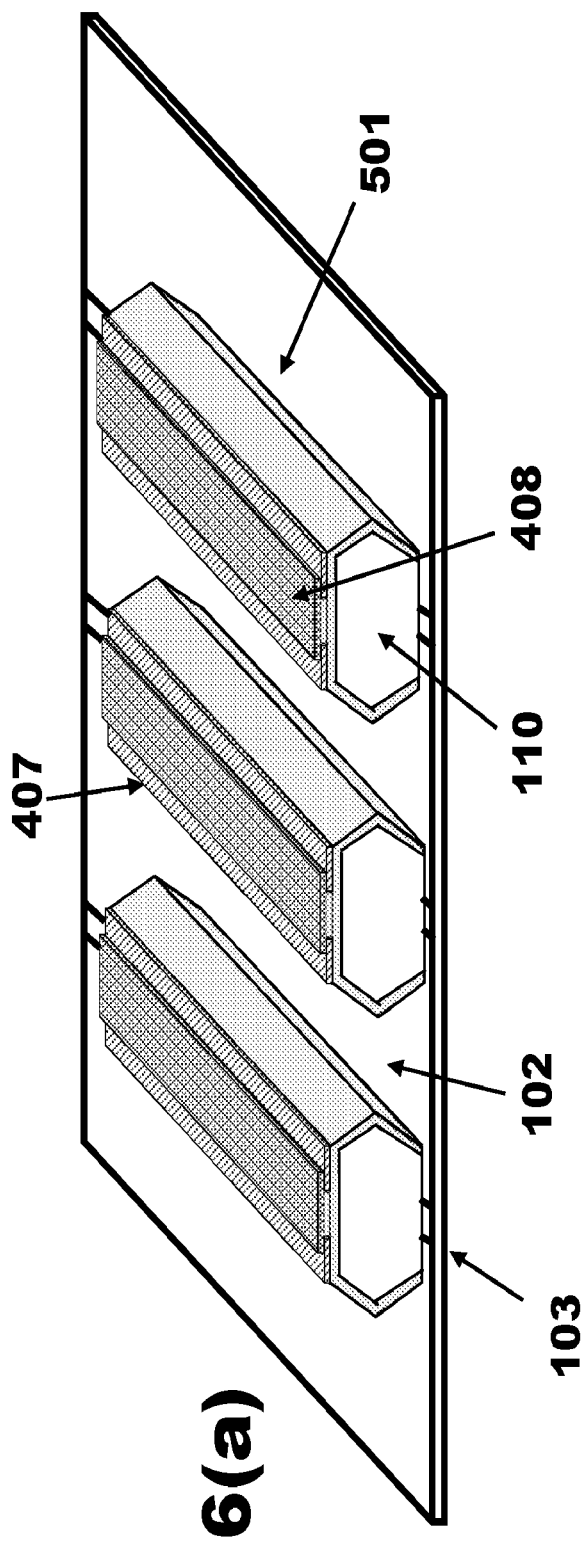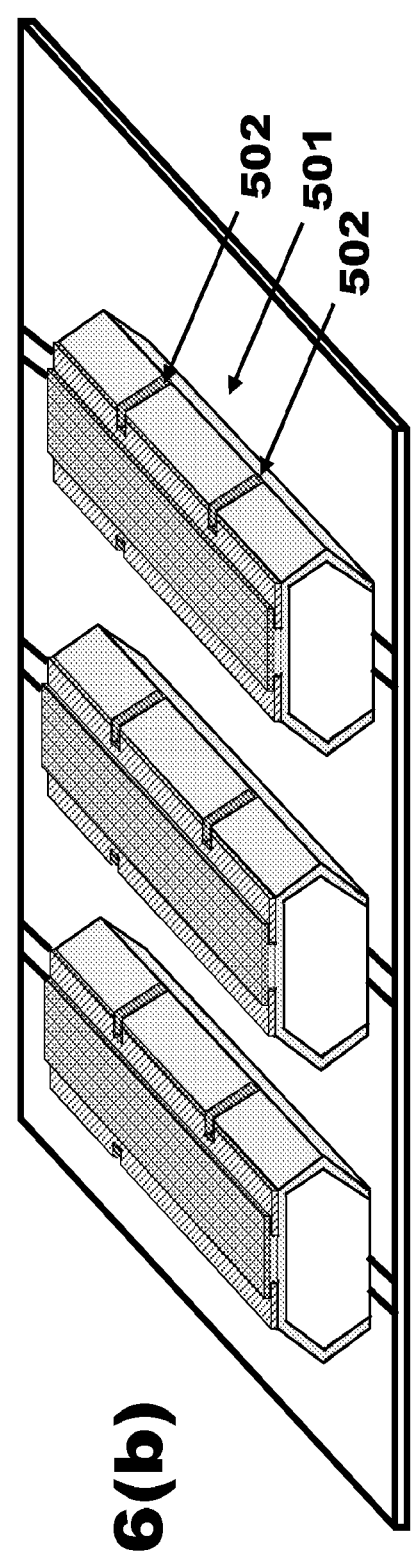
Fig. 6(a)
Fig. 6(b)

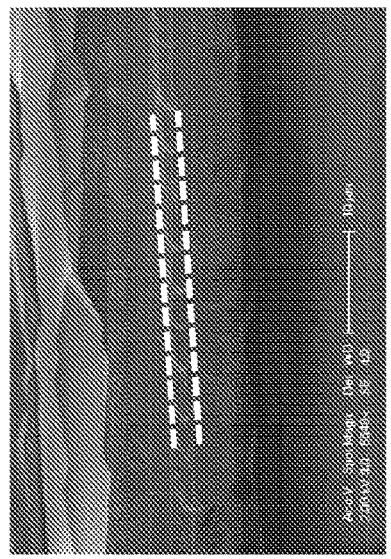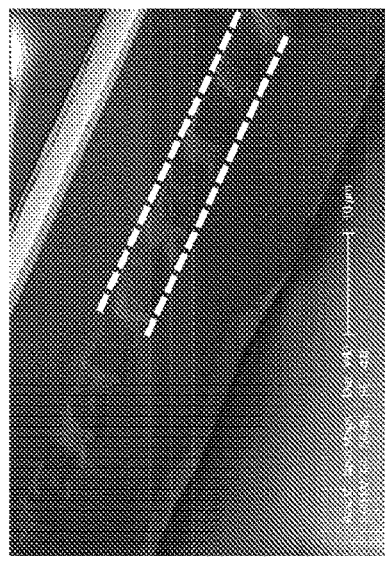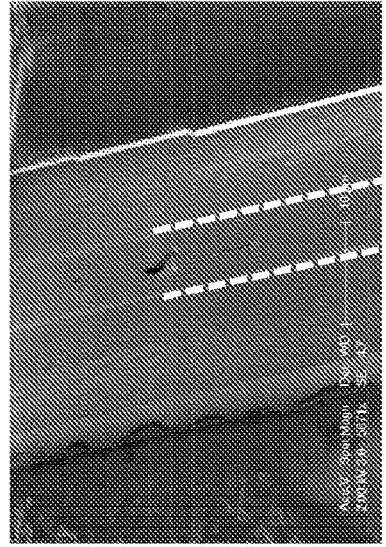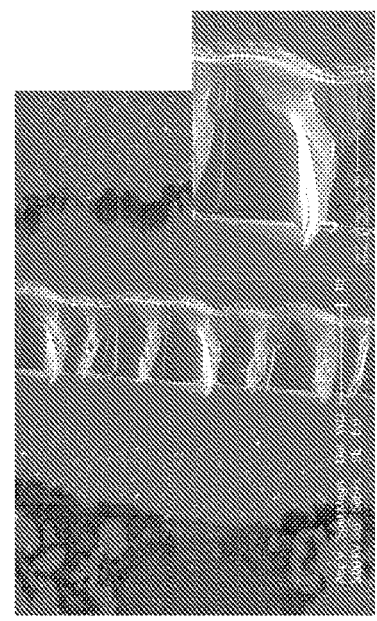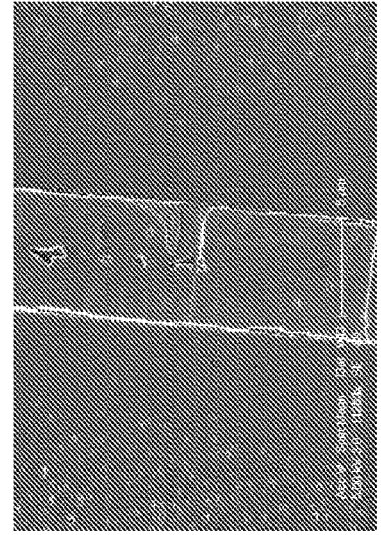
Fig. 7(a)
Fig. 7(b)

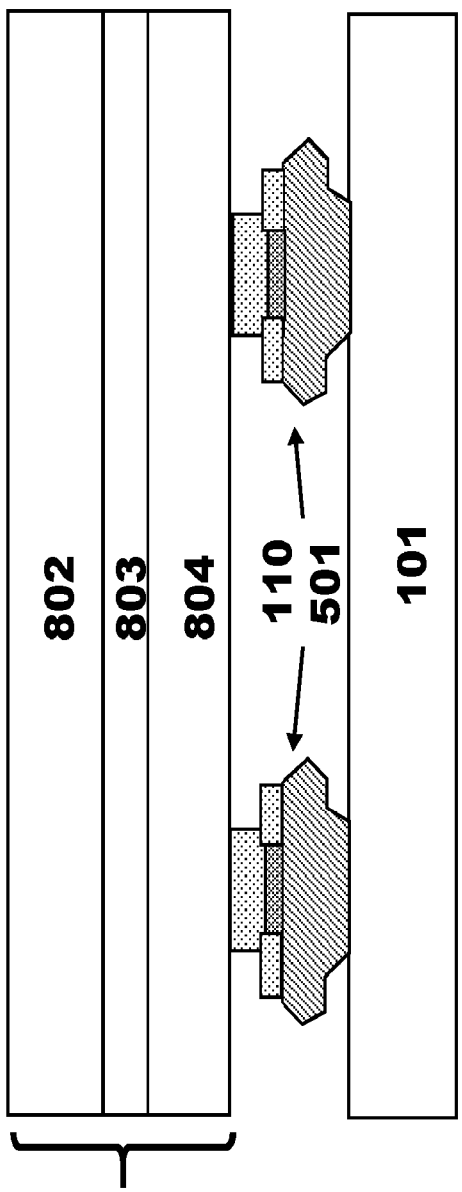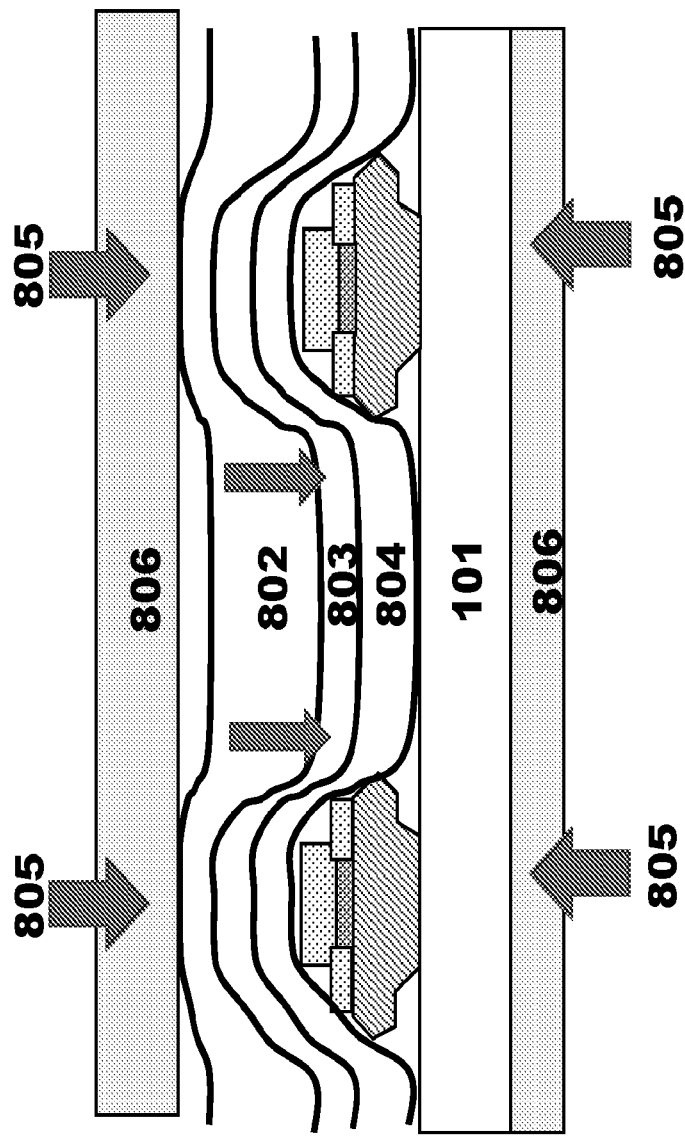
Fig. 8(a)
Fig. 8(b)

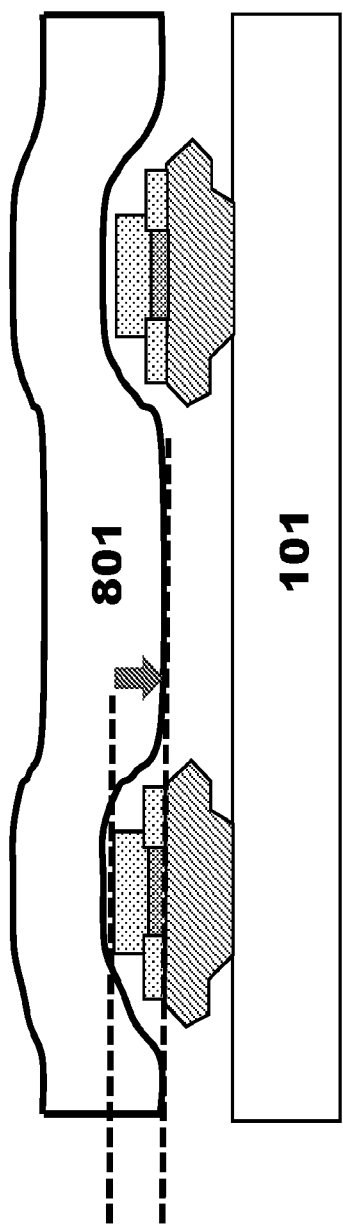
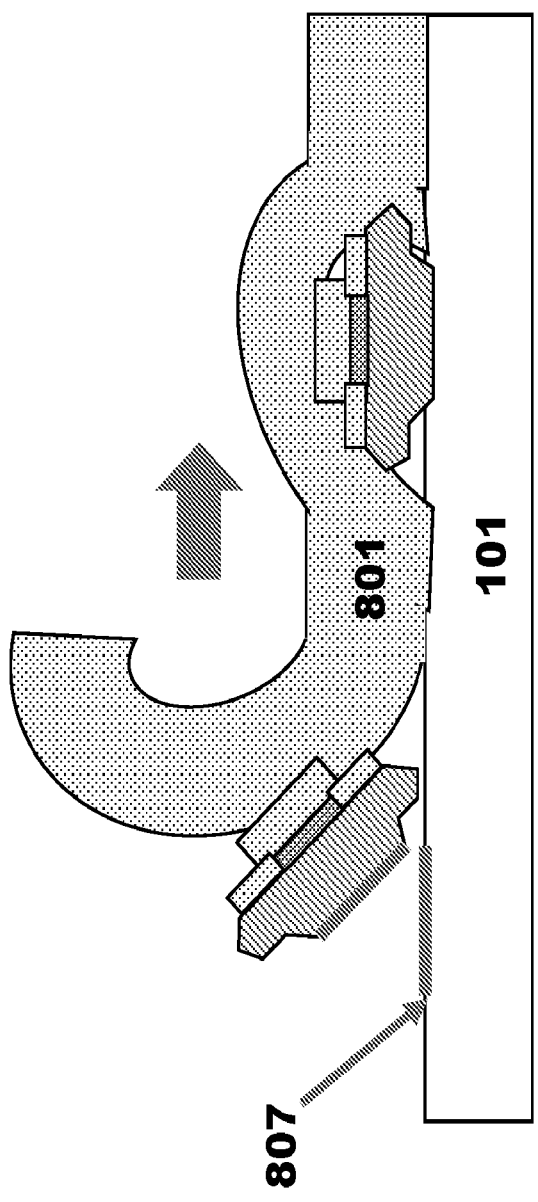
Fig. 8(d)
Fig. 8(e)

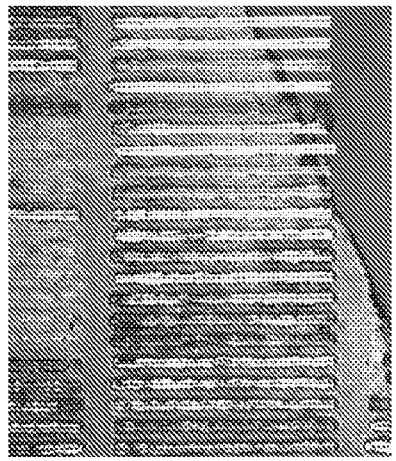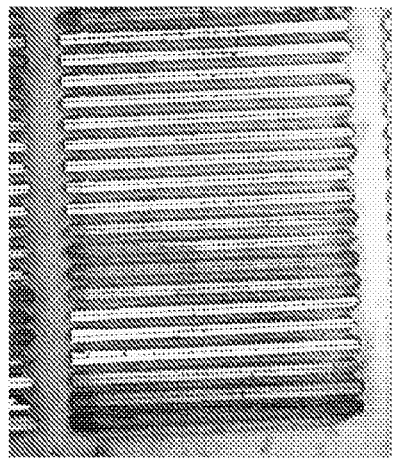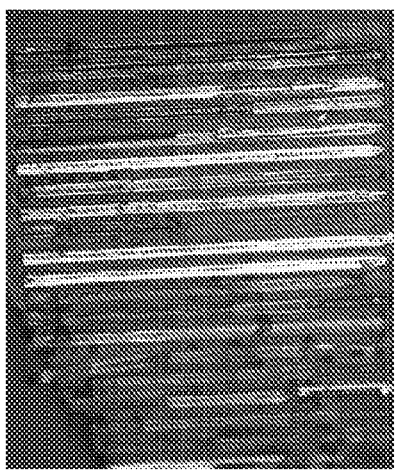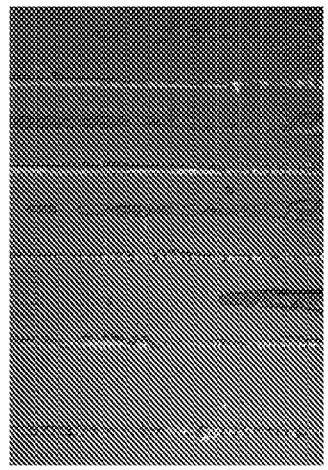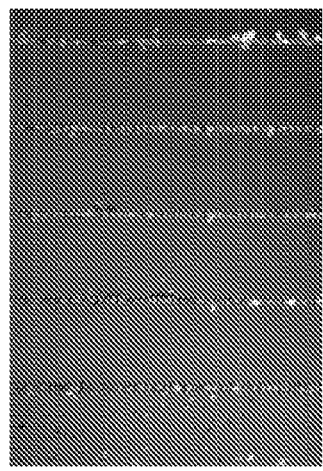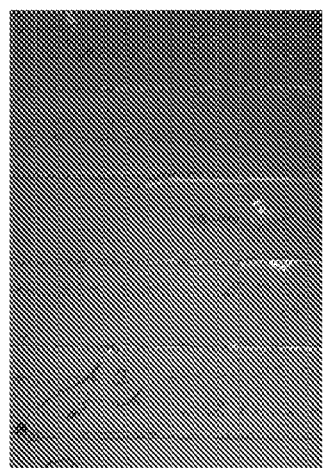
Fig. 9(a)　Fig. 9(b)

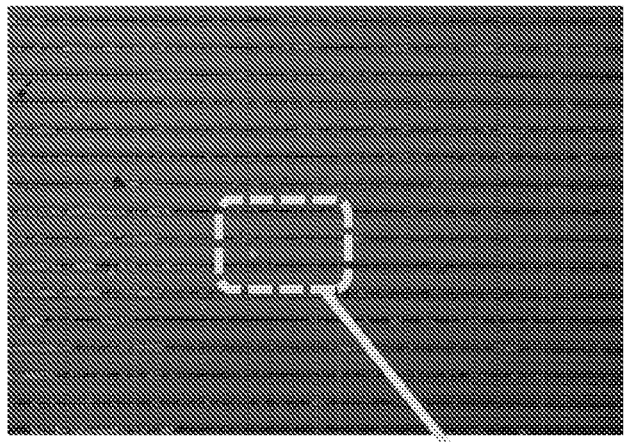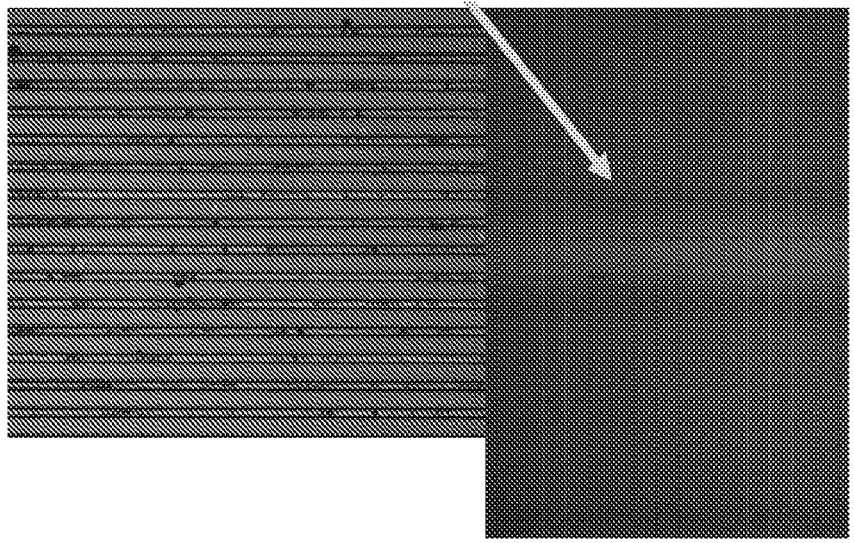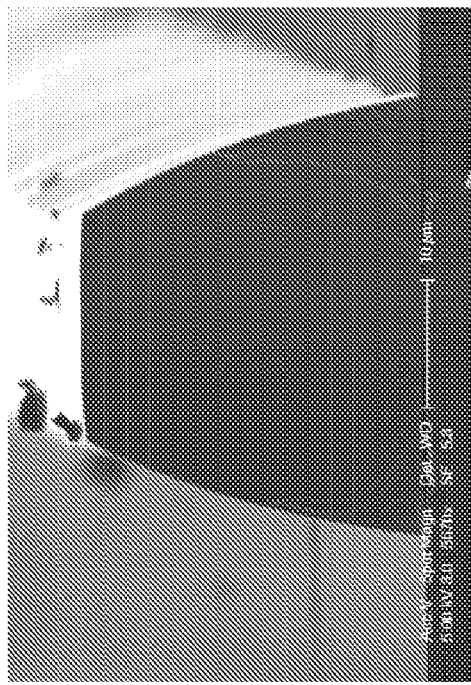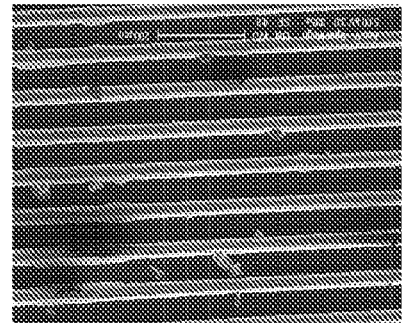

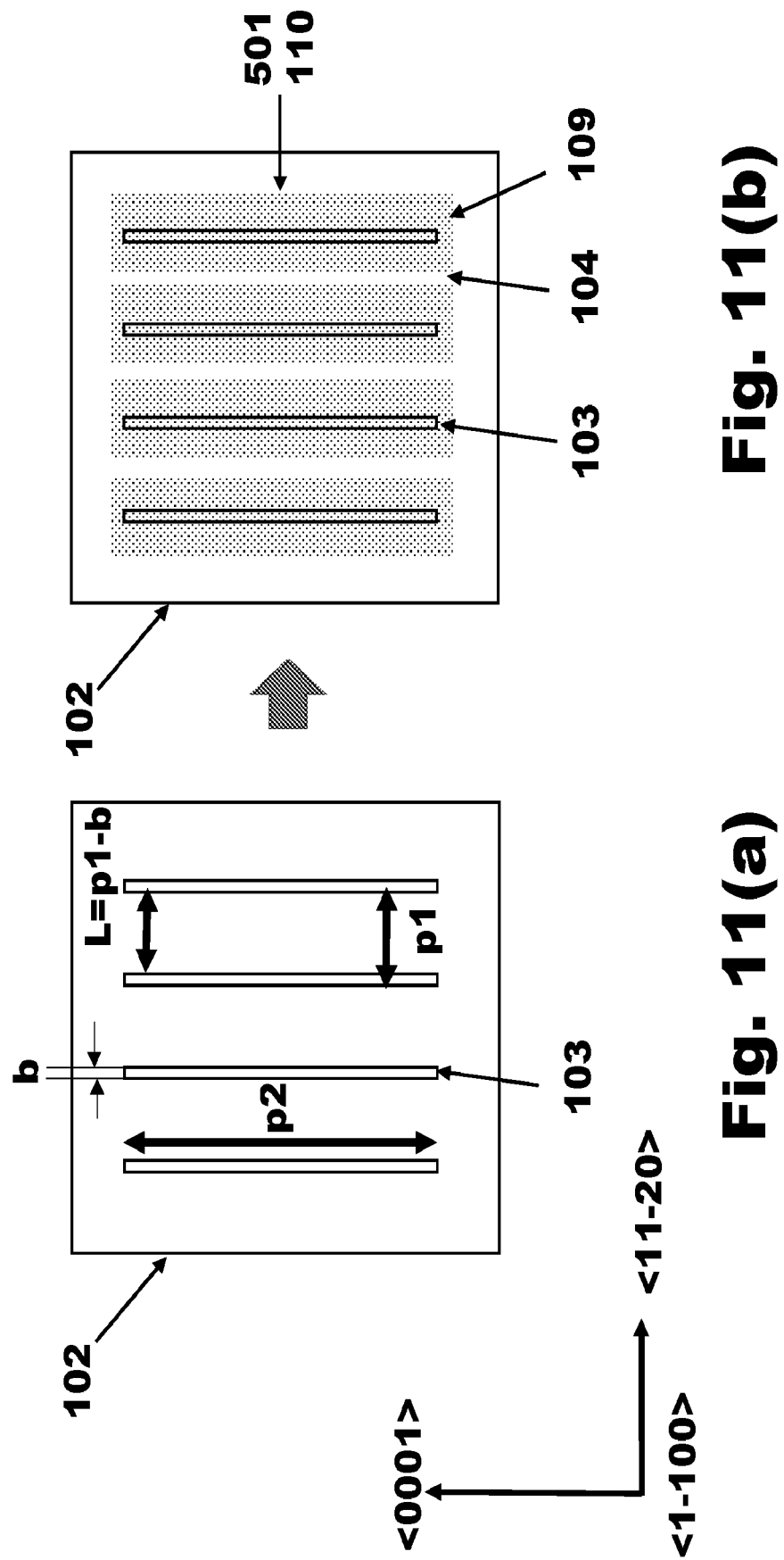

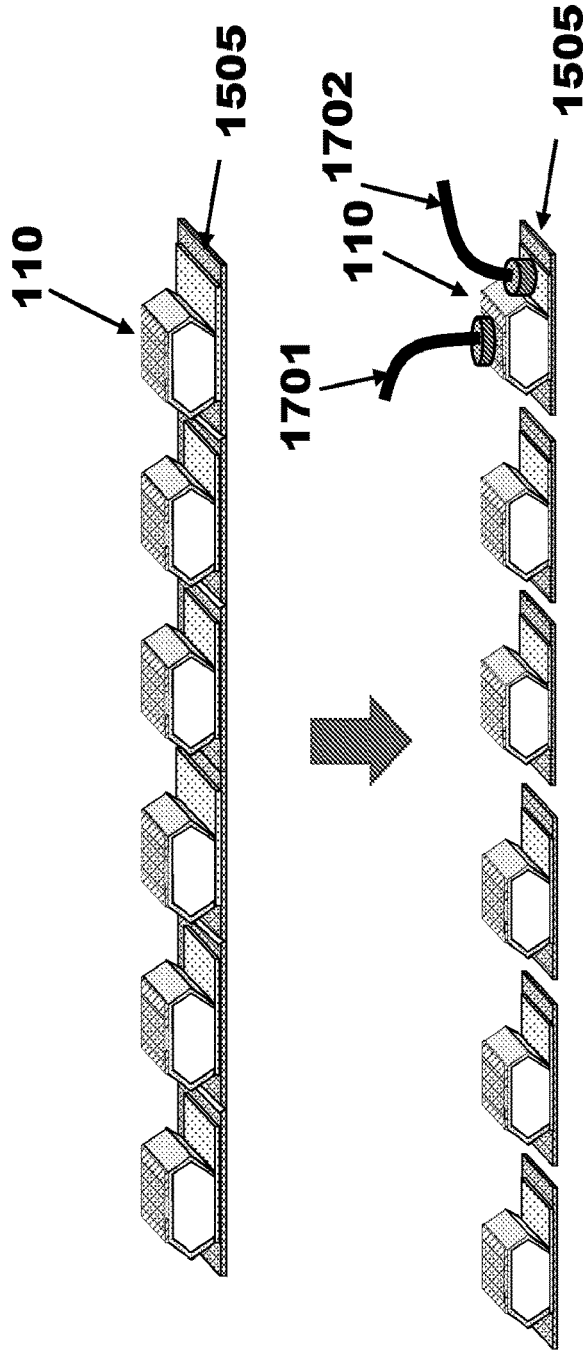

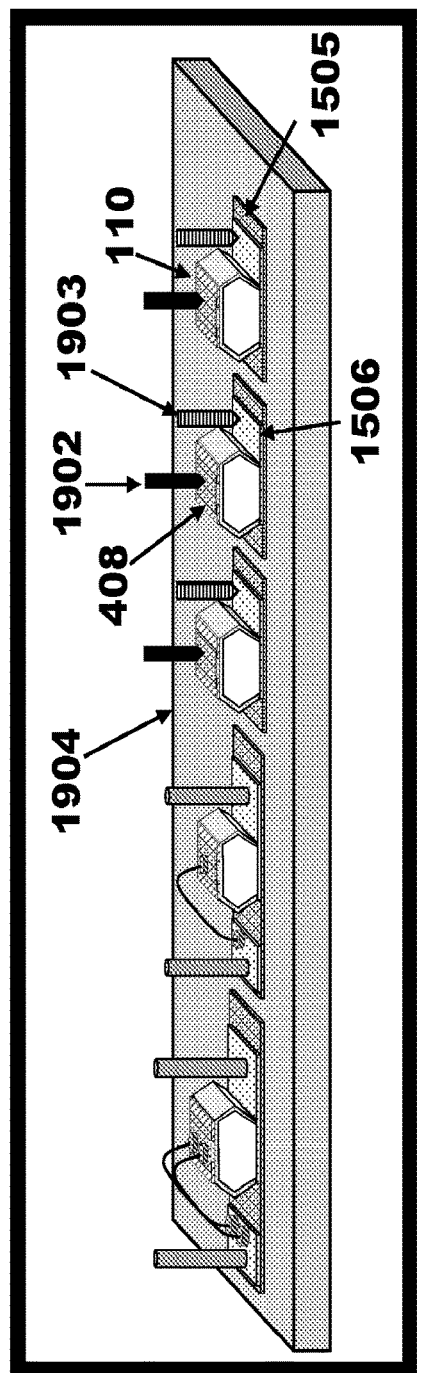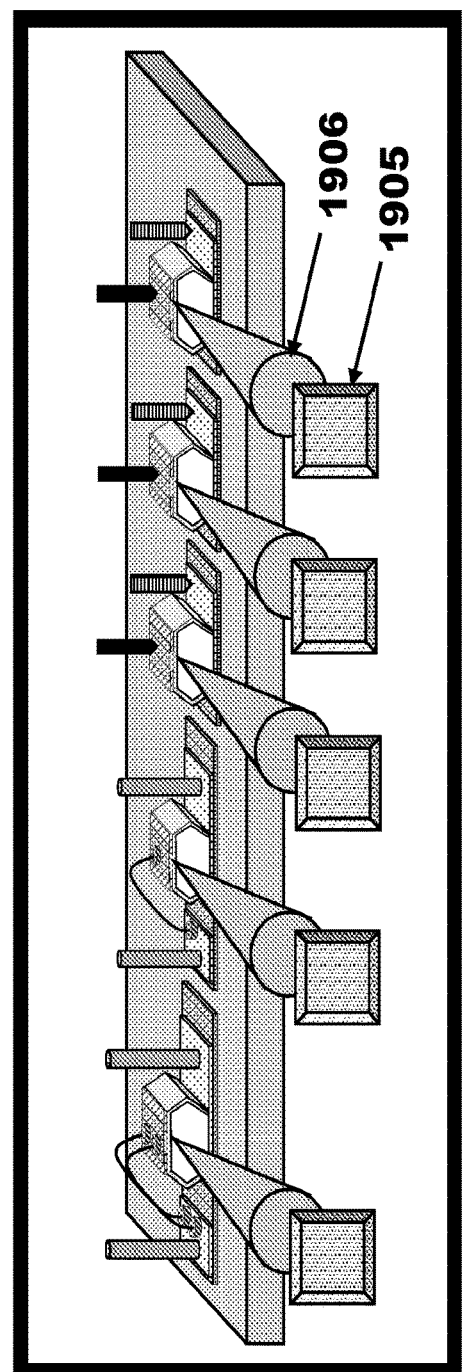
Fig. 19(a)
Fig. 19(b)

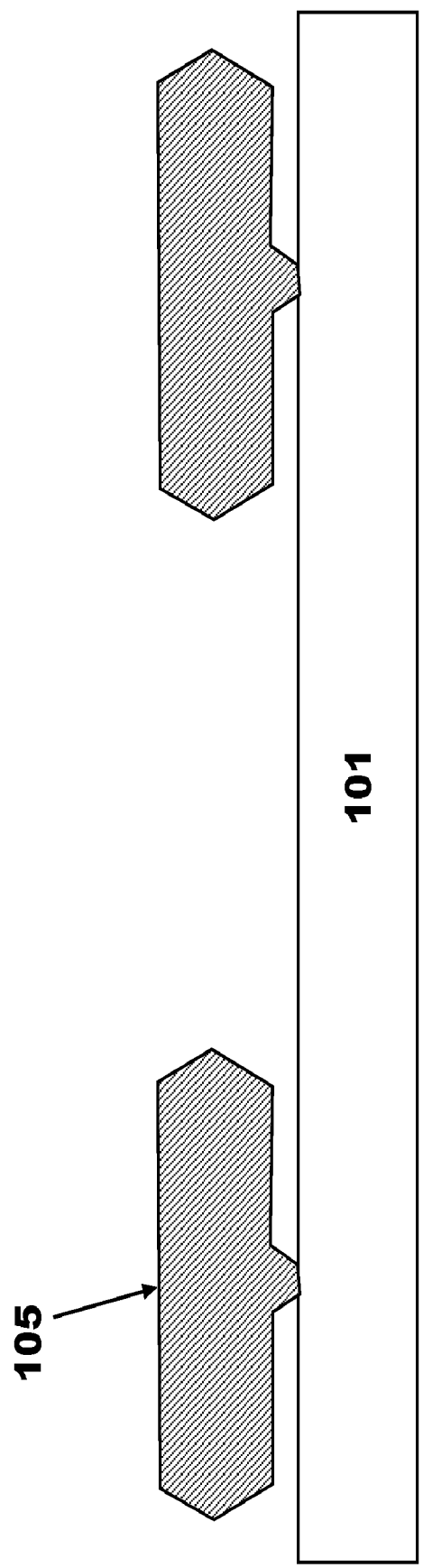

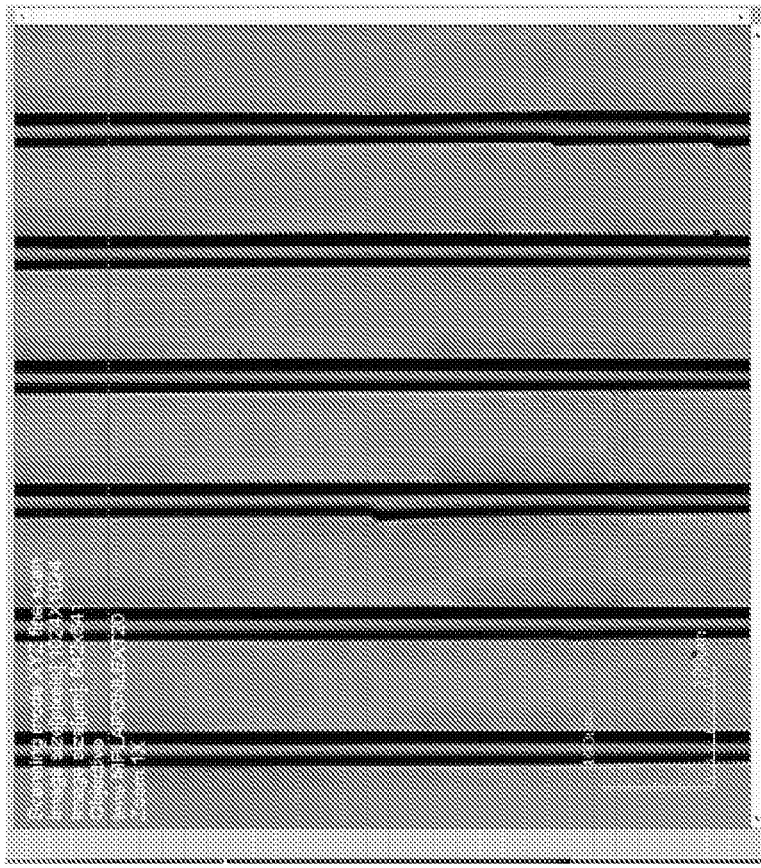
Fig. 29(a)
Fig. 29(b)

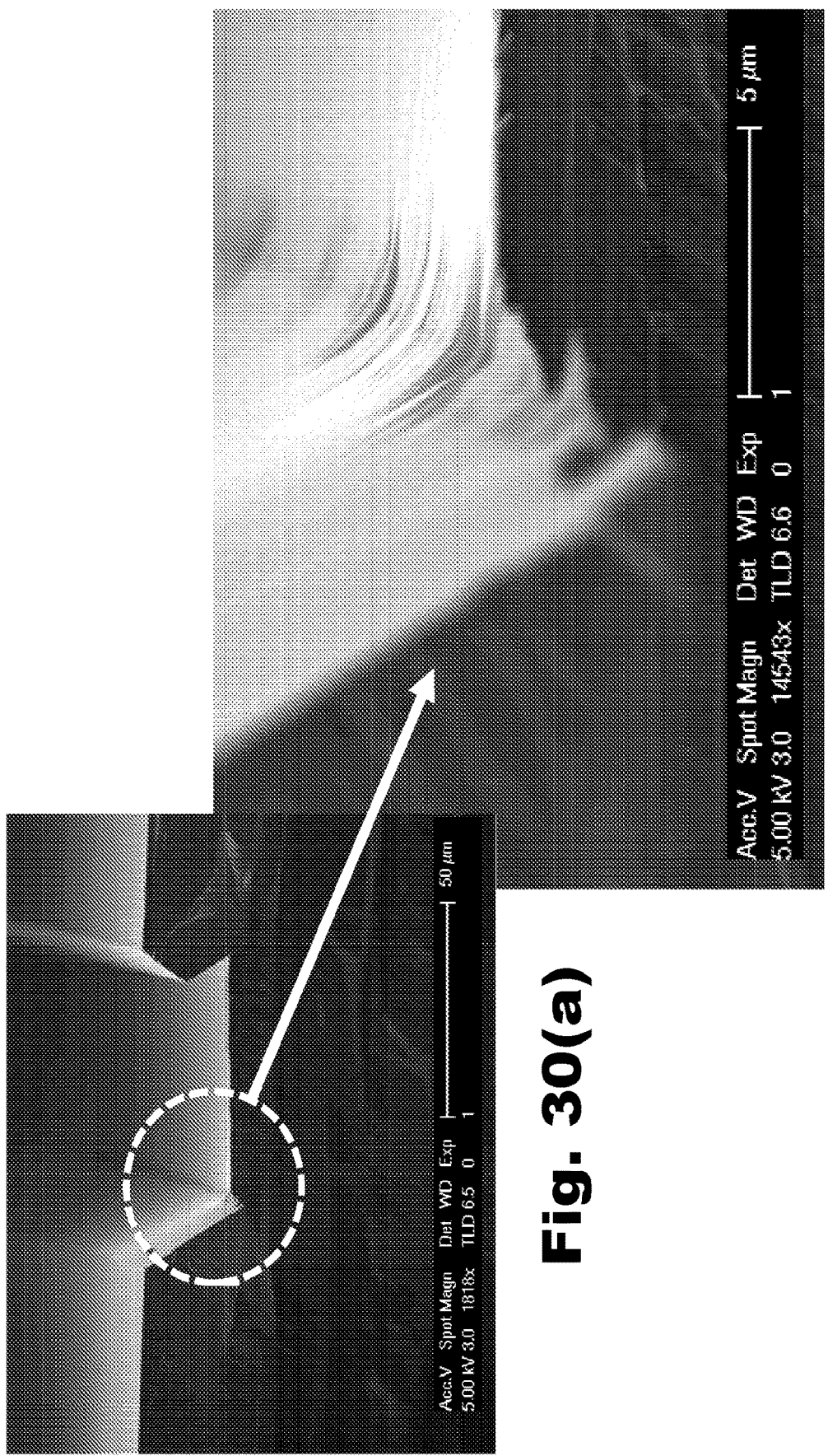

METHOD FOR FLATTENING A SURFACE ON AN EPITAXIAL LATERAL GROWTH LAYER

CROSS REFERENCE TO RELATED APPLICATIONS

This application claims the benefit under 35 U.S.C. Section 119(e) of the following co-pending and commonly-assigned application:

U.S. Provisional Application Ser. No. 62/812,453, filed on Mar. 1, 2019, by Takeshi Kamikawa and Srinivas Gandrothula; entitled "METHOD FOR FLATTENING A SURFACE ON AN EPITAXIAL LATERAL GROWTH LAYER,";

which application is incorporated by reference herein.

This application is related to the following co-pending and commonly-assigned applications:

U.S. Utility patent application Ser. No. 16/608,071; filed on Oct. 24, 2019, by Takeshi Kamikawa, Srinivas Gandrothula, Hongjian Li and Daniel A. Cohen, entitled "METHOD OF REMOVING A SUBSTRATE," which application claims the benefit under 35 U.S.C. Section 365(c) of co-pending and commonly-assigned PCT International Patent Application No. PCT/US18/31393, filed on May 7, 2018, by Takeshi Kamikawa, Srinivas Gandrothula, Hongjian Li and Daniel A. Cohen, entitled "METHOD OF REMOVING A SUBSTRATE," which application claims the benefit under 35 U.S.C. Section 119(e) of co-pending and commonly-assigned U.S. Provisional Patent Application No. 62/502,205, filed on May 5, 2017, by Takeshi Kamikawa, Srinivas Gandrothula, Hongjian Li and Daniel A. Cohen, entitled "METHOD OF REMOVING A SUBSTRATE,";

PCT International Patent Application No. PCT/US18/51375, filed on Sep. 17, 2018, by Takeshi Kamikawa, Srinivas Gandrothula and Hongjian Li, entitled "METHOD OF REMOVING A SUBSTRATE WITH A CLEAVING TECHNIQUE," which application claims the benefit under 35 U.S.C. Section 119(e) of co-pending and commonly-assigned U.S. Provisional Patent Application No. 62/559,378, filed on Sep. 15, 2017, by Takeshi Kamikawa, Srinivas Gandrothula and Hongjian Li, entitled "METHOD OF REMOVING A SUBSTRATE WITH A CLEAVING TECHNIQUE,";

PCT International Patent Application No. PCT/US19/25187, filed on Apr. 1, 2019, by Takeshi Kamikawa, Srinivas Gandrothula and Hongjian Li, entitled "METHOD OF FABRICATING NONPOLAR AND SEMIPOLAR DEVICES USING EPITAXIAL LATERAL OVERGROWTH," which application claims the benefit under 35 U.S.C. Section 119(e) of co-pending and commonly-assigned U.S. Provisional Patent Application Ser. No. 62/650,487, filed on Mar. 30, 2018, by Takeshi Kamikawa, Srinivas Gandrothula, and Hongjian Li, entitled "METHOD OF FABRICATING NONPOLAR AND SEMIPOLAR DEVICES BY USING LATERAL OVERGROWTH,";

PCT International Patent Application No. PCT/US19/32936, filed on May 17, 2019, by Takeshi Kamikawa and Srinivas Gandrothula, entitled "METHOD FOR DIVIDING A BAR OF ONE OR MORE DEVICES," which application claims the benefit under 35 U.S.C. Section 119(e) of co-pending and commonly-assigned U.S. Provisional Application Ser. No. 62/672,913, filed on May 17, 2018, by Takeshi Kamikawa and Srinivas Gandrothula, entitled "METHOD FOR DIVIDING A BAR OF ONE OR MORE DEVICES,";

PCT International Patent Application No. PCT/US19/34686, filed on May 30, 2019, by Srinivas Gandrothula and Takeshi Kamikawa, entitled "METHOD OF REMOVING SEMICONDUCTING LAYERS FROM A SEMICONDUCTING SUBSTRATE," which application claims the benefit under 35 U.S.C. Section 119(e) of co-pending and commonly-assigned U.S. Provisional Application Ser. No. 62/677,833, filed on May 30, 2018, by Srinivas Gandrothula and Takeshi Kamikawa, entitled "METHOD OF REMOVING SEMICONDUCTING LAYERS FROM A SEMICONDUCTING SUBSTRATE,";

PCT International Patent Application No. PCT/US19/59086, filed on Oct. 31, 2019, by Takeshi Kamikawa and Srinivas Gandrothula, entitled "METHOD OF OBTAINING A SMOOTH SURFACE WITH EPITAXIAL LATERAL OVERGROWTH," which application claims the benefit under 35 U.S.C. Section 119(e) of co-pending and commonly-assigned U.S. Provisional Application Ser. No. 62/753,225, filed on Oct. 31, 2018, by Takeshi Kamikawa and Srinivas Gandrothula, entitled "METHOD OF OBTAINING A SMOOTH SURFACE WITH EPITAXIAL LATERAL OVERGROWTH,"; and PCT International Patent Application No. PCT/US20/13934, filed on Jan. 16, 2020, by Takeshi Kamikawa, Srinivas Gandrothula and Masahiro Araki, entitled "METHOD FOR REMOVAL OF DEVICES USING A TRENCH," which application claims the benefit under 35 U.S.C. Section 119(e) of co-pending and commonly-assigned U.S. Provisional Application Ser. No. 62/793,253, filed on Jan. 16, 2019, by Takeshi Kamikawa, Srinivas Gandrothula and Masahiro Araki, entitled "METHOD FOR REMOVAL OF DEVICES USING A TRENCH,";

all of which applications are incorporated by reference herein.

BACKGROUND OF THE INVENTION

1. Field of the Invention

This invention relates to a method fix flattening a surface on an epitaxial lateral growth layer.

2. Description of the Related Art

Currently, some device manufacturers use III-nitride-based substrates, such as GaN or MN substrates, to produce laser diodes (LDs) and light-emitting diodes (LEDs) for lighting, optical storage, etc. However, it is well known that III-nitride-based substrates are very expensive.

Prior attempts have been made to remove III-nitride-based semiconductor layers from a III-nitride-based substrate to recycle the substrate. In one example, III-nitride layers are first grown on the substrate using epitaxial lateral overgrowth (ELO) with a growth restrict mask. The growth of the III-nitride layers is stopped before the III-nitride layers coalesce with each other. This makes it easy to remove the resulting island-like III-nitride semiconductor layers, after a device process is performed that makes a ridge structure on the island-like III-nitride semiconductor layers.

Using this method allows one to grow III-nitride device layers on the discrete ELO III-nitride layers using metal organic chemical vapor deposition (MOCVD). In conventional epitaxial growth using MOCVD, growth can be performed on a flat substrate or a flat substrate with a template layer. However, the III-nitride device layers are grown on discrete epilayers, and such growth does not obtain a flat surface epi-layer on a substrate with discrete ELO III-nitride layers.

Deteriorating surface roughness means each layer has an in-plane distribution of a thickness. To improve the characteristics of the device, the in-plane distribution of the thickness of each layer needs to decrease. For example, if the in-plane distribution of the thickness is in the p-layer, the optical confinement factor is different in each device. Improving surface roughness decreases the in-plane distribution of the thickness.

In another aspect, the growth restrict mask typically is $SiO_2$, SiN, etc. In these cases, Si and O are the n-type dopant for a GaN layer. It may be possible to compensate the n-type layers while p-type layers are growing, if the growth restrict mask is exposed or not covered by something.

The purpose of the present invention is to obtain a smooth surface after the growth of the III-nitride device layer.

SUMMARY OF THE INVENTION

To overcome the limitations in the prior art described above, and to overcome other limitations that will become apparent upon reading and understanding this specification, the present invention discloses a method for obtaining a smooth surface with a discrete ELO III-nitride layer. Moreover, the present invention has succeeded in improving the surface roughness of an III-nitride device layer on the discrete ELO III-nitride layer.

In another aspect, its critical for the sake of mounting devices with their top-side down to suppress an edge-growth at the edge of a bar of the device. Non-uniform supply of atoms from the material gases causes this phenomenon. The present invention has succeeded in suppressing the edge-growth.

Specifically, this invention performs the following steps: ELO III-nitride layers are grown on a substrate using a growth restrict mask via MOCVD or other methods; the ELO III-nitride layers remain separate and discrete from each other; the substrate is removed from the MOCVD reactor to remove the growth restrict mask; the growth restrict mask is removed by wet or dry etching; III-nitride device layers are grown on the ELO II-nitride layers and substrate after removal of the growth restrict mask, resulting in island-like III-nitride semiconductor layers; devices are fabricated using the island-like III-nitride semiconductor layers; bars of the devices are removed from the substrate; and the bars of the devices are divided into chips or individual devices using a cleaving method.

After growing the III-nitride device layers, it is difficult to flatten their surface. This is especially true for III-nitride semiconductor layers that contain ternary and quaternary compound III-nitride semiconductor layers.

Research has disclosed that unevenness in growth is caused by a non-uniform supply of gases, which affects the flatness of the surface and results in a non-uniform emitting pattern for the active layer. Moreover, the unevenness in growth happens at portions near the edges of the island-like III-nitride semiconductor layers, which is caused by a difference in the amount of supply atoms at each portion.

In the present invention, this problem of the unevenness of growth is enhanced by the ELO III-nitride layers being separated, which increases the number of edges. Furthermore, since the width of a flat surface region is narrow as compared to conventional growth using a common wafer, the unevenness of growth is more susceptible to occur. Moreover, removal of the growth restrict mask after growing the ELO III-nitride layer and before growing the III-nitride device layers, such as the p-type layer, makes the unevenness of growth more likely.

In another aspect, the III-nitride layers may be grown at a temperature above 700° C.; in some cases, the growth temperature is over 1000° C. to improve crystal quality. This high growth temperature makes the Sift growth restrict mask decompose into Si atoms and O atoms, which are released into the growth atmosphere. In this condition, the decomposed Si atoms and O atoms during growth of the p-type layer causes the compensation of the p-type layer by Si and O as n-type dopants. Unfortunately, this compensation causes an increase in the series resistance of the p-type layer. The present invention avoids this compensation of the p-type layer by removing the growth restrict mask before the growth of the p-type layer.

Generally, in an emitting device, the III-nitride device layers are grown in the order of: n-type layer, active layer, electron blocking layer (EBL), and p-type layer. Preferably, the growth restrict mask is removed before growing the p-type layer. More preferably, the growth restrict mask is removed after growing the ELO III-nitride layers. By doing this, a smooth surface can be obtained for the island-like III-nitride semiconductor layers after growing the III-nitride device layers.

Thus, there are two advantages to removing the growth restrict mask before the device process. One advantage is to obtain the smooth surface. Another advantage is to avoid the compensation of the p-type layers due to the decomposition of the growth restrict mask. Employing the present invention can solve both issues.

BRIEF DESCRIPTION OF THE DRAWINGS

Referring now to the drawings in which like reference numbers represent corresponding parts throughout:

FIGS. 2(a), 2(b), 2(c), 2(d), 2(e), 2(f), 2(g), 2(h) and 2(i) are schematics and scanning electron microscope (SEM) images comparing results obtain with and without the growth restrict mask, according to embodiments of the present invention.

FIGS. 3(a), 3(b), 3(c), 3(d), 3(e) and 3(f) are scanning electron microscope (SEM) images of island-like III-nitride-based semiconductor layers, according to one embodiment of the present invention.

FIGS. 6(a) and 6(b) also illustrate how a dividing support region is formed at periodic lengths along a bar of the device, according to one embodiment of the present invention.

FIGS. 7(a) and 7(b) show SEM images of the backside of a bar of a device after being removed and the surface of the substrate after removing the bar of the device, for the (1-100) just, (20-21), and (20-2-1) planes, respectively.

FIGS. 8(a), 8(b), 8(c), 8(d), 8(e), 8(f) and 8(g) illustrate a procedure for removing a bar of a device, according to one embodiment of the present invention.

FIGS. 9(a) and 9(b) are SEM images of a bar of a device from different substrate planes.

FIGS. 10(a), 10(b), 10(c), 10(d) and 10(e) are SEM images of a bar of a device from a c-plane (0001) substrate plane.

FIGS. 11(a) and 11(b) illustrate a growth restrict mask used for multiple bars of multiple devices, according to one embodiment of the present invention.

FIGS. 18(a) and 18(b) illustrate how a heat sink plate is divided to separate devices, according to one embodiment of the present invention.

FIGS. 19(a) and 19(b) illustrate a testing apparatus for devices, according to one embodiment of the present invention.

FIGS. 24(a), 24(b) and 24(c) are schematics illustrating growth with and without the growth restrict mask, according to embodiments of the present invention.

FIGS. 29(a) and 29(b) are SEM images illustrating the surface of the III-nitride device layers, according to embodiments of the present invention.

FIGS. 30(a) and 30(b) are SEM images illustrating the connection of III-nitride device layers after the removal of the growth restrict mask, according to embodiments of the present invention.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Device Structure

Figure 1A:
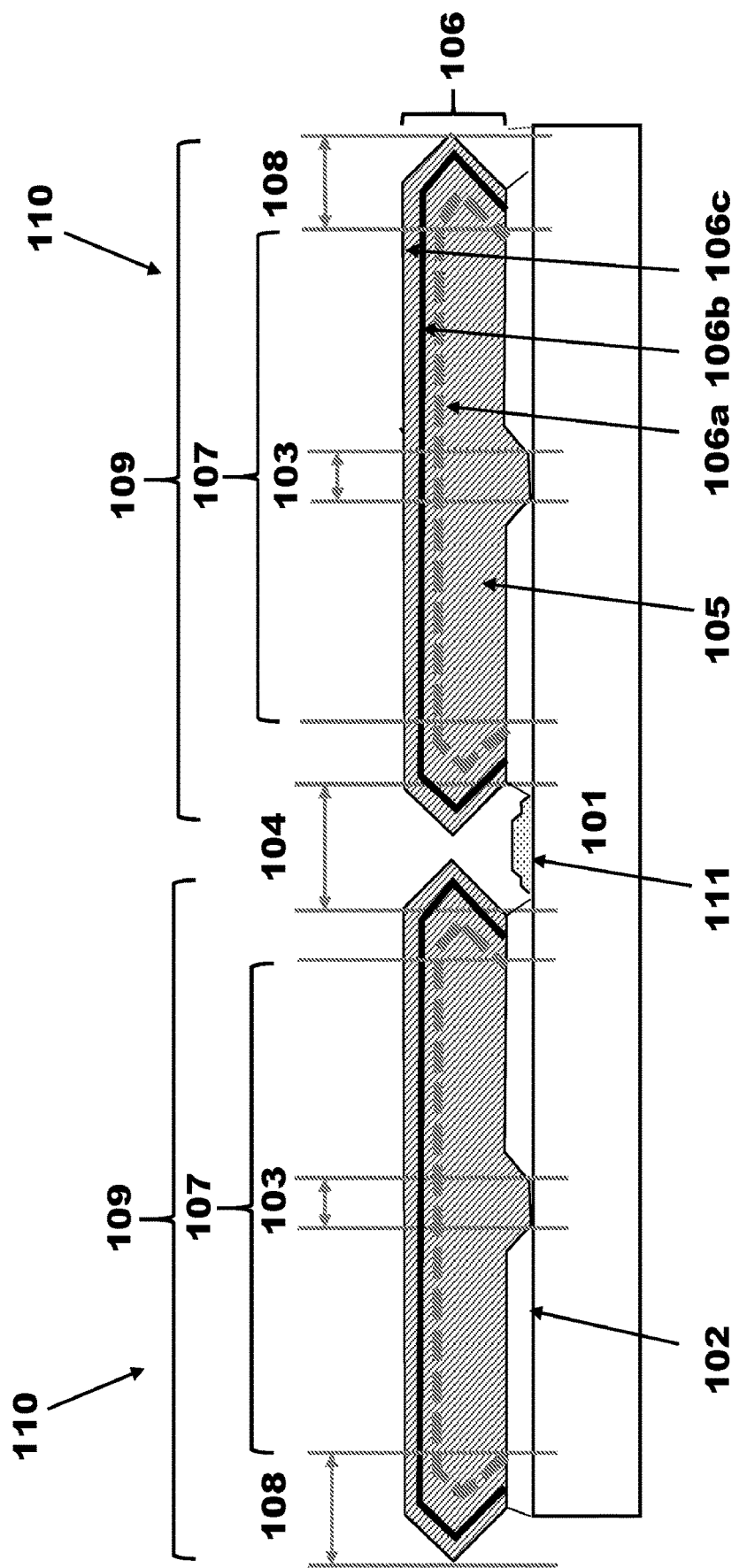
FIGS. 1(a) and 1(b) are schematics of a substrate, growth restrict mask and epitaxial layers, according to embodiments of the present invention.
Figure 1B:
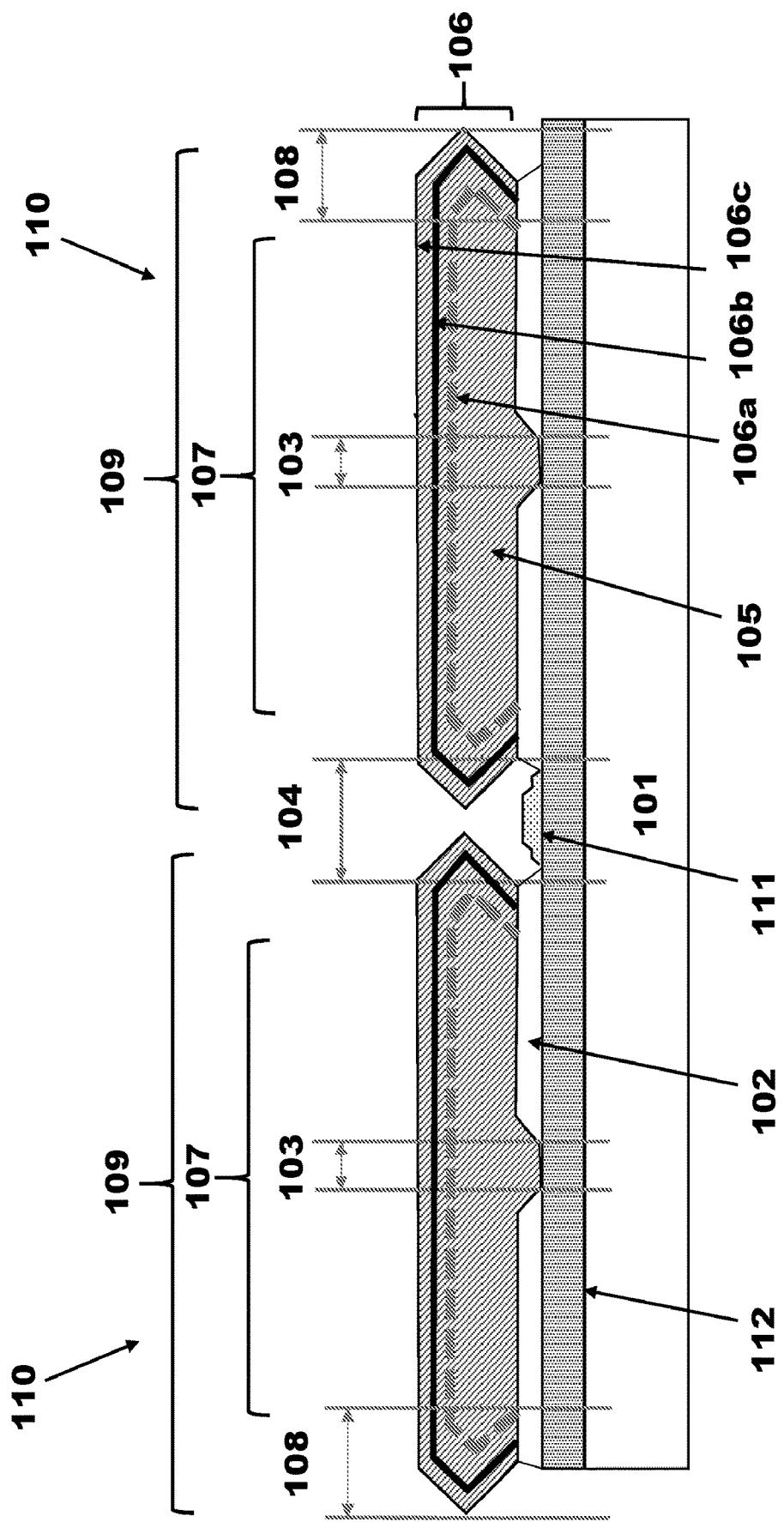

FIGS. 1(a) and 1(b) are cross-sectional views that illustrate a device structure fabricated according to one embodiment of the present invention.

In the embodiment of FIG. 1(a), a III-nitride-based substrate 101 is provided, such as a bulk GaN substrate 101, and a growth restrict mask 102 is formed on or above the substrate 101. Striped opening areas 103 are defined in the growth restrict mask 102.

No-growth regions 104 result when ELO III-nitride layers 105, grown from adjacent opening areas 103 in the growth restrict mask 102, are made not to coalesce on top of the growth restrict mask 102. Preferably, growth conditions are optimized such that the ELO III-nitride layers 105 have a lateral width of 20 μm on a wing region thereof.

Additional III-nitride device layers 106 are deposited on or above the ELO III-nitride layers 105, and may include an active region 106a, an electron blocking layer (EBL) 106b, and a cladding layer 106c, as well as other layers.

The thickness of the ELO III-nitride layers 105 is important, because it determines the width of one or more flat surface regions 107 and layer bending regions 108 at the edges thereof adjacent the no-growth regions 104. The width of the flat surface region 107 is preferably at least 5 and more preferably is 10 μm or more, and most preferably is 20 μm or more.

The ELO III-nitride layers 105 and the additional III-nitride device layers 106 are referred to as island-like III-nitride semiconductor layers 109, wherein adjacent island-like III-nitride semiconductor layers 109 are separated by the no-growth regions 104.

The width of the no-growth region 104 can control the amount of the decomposition of the growth restrict mask 102. The narrower the width of the no-growth region 104, the lesser the amount of the decomposition of the growth restrict mask 102. Reducing the amount of the decomposition can alleviate compensation of p-type layers of the III-nitride device layers 106 by the decomposition of the growth restrict mask 102.

The distance between the island-like III-nitride semiconductor layers 109 adjacent to each other is the width of the no-growth region 104, which is generally 20 μm or less, and preferably 5 μm or less, but is not limited to these values. Each of the island-like III-nitride semiconductor layers 109 may be processed into a separate device 110. The device 110, which may be an LED, LD, Schottky barrier diode, or metal-oxide-semiconductor field-effect-transistor, is processed on the flat surface region 107 and/or the opening areas 103. Moreover, the shape of the device 110 generally comprises a bar.

In the present invention, the bonding strength between the substrate 101 and the ELO III-nitride layer 105 is weakened by the growth restrict mask 102. In this case, the bonding area between the substrate 101 and the ELO III-nitride layer 105 is the opening area 103. The width of the opening area 103 is narrower than the width of island-like III-nitride semiconductor layers 109. The strength of the bonding between the growth restrict mask 102 and the island-like III-nitride semiconductor layers 109 is weak. Moreover, the island-like III-nitride semiconductor layers 109 bond to the substrate 101 generally only at the opening area 103. Consequently, the bonding area is reduced by the growth restrict mask 102, so that this method is preferable for removing the island-like III-nitride semiconductor layers 109.

Finally, a bottom layer 111 may be present, which may form in the no-growth region 104 between the island-like III-nitride semiconductor layers 109. If the island-like III-nitride semiconductor layers 109 are connected to the bottom layer 111, it may be difficult to remove the island-like semiconductor layers 109 from the substrate 101.

Device Fabrication

The steps used to fabricate the device 110 using the present invention are described below.

Step 1: Forming a growth restrict mask 102 with a plurality of opening areas 103 directly or indirectly upon a substrate 101, wherein the substrate 101 is a III-nitride substrate or a hetero-substrate.

Step 2: Growing the ELO III-nitride layers 105 upon the substrate 101 using the growth restrict mask 102, such that the growth extends in a direction parallel to the striped opening areas 103 of the growth restrict mask 102, wherein the ELO III-nitride layers 105 do not coalesce.

Step 3: Removing the substrate 101 with the ELO III-nitride layers 105 from the MOCVD reactor. The growth restrict mask 102 is removed from the substrate 101 by wet etching method with an etchant such as hydrofluoride (HF), or buffered HF (BHF).

Step 4: Growing the III-nitride device layers 106, after the growth restrict mask 102 is removed. The III-nitride device layers 106 are grown on or above the ELO III-nitride layers 105, and on or above the substrate 101 surface between the ELO III-nitride layers 105, due to the removal of the growth restrict mask 102.

Step 5: Fabricating the device 110 at the flat surface region 107 using conventional methods, wherein a ridge structure, p-electrode, pad-electrode etc., are disposed on the island-like III-nitride semiconductor layers 109 at pre-determined positions.

Step 6: Forming a support structure for cleaving at a side facet and a flat surface region 107 of a bar of the device 110.

Step 7: Removing the bar of the device 110 from the substrate 101.

Step 7.1: Attaching a polymer film to the bar of the device 110.

Step 7.2: Applying pressure to the polymer film and the substrate 101.

Step 7.3: Reducing the temperature of the film and the substrate 101 while the pressure is applied.

Step 7.4: Utilizing the different of thermal coefficient between the polymer film and the material of the substrate 101 for removing the bar of the device 110.

Step 8: Fabricating an n-electrode at a separate area of the device 110.

Step 9: Breaking the bars into separate devices 110 or chips.

Step 10: Mounting the devices 110 on a heat sink plate.

Step 11: Coating the facets of a laser diode device 110.

Step 12: Dividing the heat sink plate into separate devices 110.

Step 13: Screening the devices 110.

Step 14: Mounting the devices 110 on or into packages.

These steps are explained in more detail below.

Step 1: Forming a Growth Restrict Mask:

A growth restrict mask 102 comprised of patterned $SiO_2$ is deposited on a substrate 101, such as an m-plane GaN substrate 101, In one embodiment, the growth restrict mask 102 is comprised of stripes separated by the opening areas 103, wherein the stripes have a width of 50 µm, an interval of 50 µm, and are oriented along the <0001> axis. The opening areas 103 are designed with a width of about 2 µm-180 µm, and more preferably, 4 µm-50 µm.

FIG. 1(b) illustrates an alternative embodiment, wherein these techniques are used with a hetero-substrate 101 and a template layer 112, such as a GaN intermediate layer or underlayer of 2-10 µm, is grown on the hetero-substrate 101. However, it is not necessary to grow the template layer 112 on the hetero-substrate 101; instead, the $SiO_2$ of the growth restrict mask 102 can be formed on the hetero-substrate 101, and then the ELO III-nitride layers 105 can be grown directly on the growth restrict mask 102 formed on the hetero-substrate 101.

Step 2: Growing the ELO III-Nitride Layers Upon the Substrate

As shown in FIGS. 1(a) and 1(b), the ELO III-nitride layers 105 are grown on the growth restrict mask 102. Preferably, the ELO III-nitride layers 105 do not coalesce on top of the growth restrict mask 102.

In one embodiment, MOCVD is used for the epitaxial growth of the ELO III-nitride layer 105. The ELO III-nitride layers 105 are preferably GaN or AlGaN layers in order to obtain a smooth surface. Trimethylgallium (TMGa) and/or triethylaluminium (TMAl) are used as the III elements source; ammonia ($NH_3$) is used as the raw gas to supply nitrogen; and hydrogen ($H_2$) and nitrogen ($N_2$) are used as a carrier gas of the III elements sources. It is important to include hydrogen in the carrier gas to obtain a smooth surface for the epi-layer. The thickness of the ELO III-nitride layer 105 is about 3 µm-100 µm.

Step 3: The Substrate with the ELO III-Nitride Layers is Removed the MOCVD Reactor The substrate 101 is removed from the MOCVD reactor to remove the growth restrict mask 102 after the ELO III-nitride layers 105 are grown. The growth restrict mask 102 is removed by wet etching with HF or BHF, etc. By doing this, the area which was covered the by growth restrict mask 102 can be used to grow the III-nitride device layers 106. This increases the growth area on the substrate 101 as compared to before removing the growth restrict mask 102.

Step 4: Growing a Plurality of III-Nitride Device Layers

After removal of the growth restrict mask 102, the substrate 101 is loaded back into the MOCVD reactor, for epitaxial growth of the III-nitride device layers 106.

Tritnethylgallium (TMGa), trimethylindium (TMIn) and triethylaluminium (TMAl) are used as the III elements sources; ammonia ($NH_3$) is used as the raw gas to supply nitrogen; and hydrogen ($H_2$) and nitrogen ($N_2$) are used as a carrier gas of the III elements sources. It is important to include hydrogen in the carrier gas to obtain a smooth surface for the epi-layer.

Saline and Bis(cyclopentadienyl)magnesium ($Cp_2Mg$) are used as n-type and p-type dopants. The pressure setting typically is 50 to 760 Torr. The III-nitride device layers 106 are generally grown at temperature ranges from 700° C. to 1250° C.

For example, the growth parameters include the following: TMG is 12 sccm, $NH_3$ is 8 slm, carrier gas is 3 slm, $SiH_4$ is 1.0 sccm, and the V/III ratio is about 7700. These growth conditions are one example; the conditions can be changed and optimized for each of the layers.

Comparing the Results With and Without the Growth Restrict Mask

The III-nitride device layers 106 obtained with and without the growth restrict mask 102 are illustrated in FIGS. 2(a), 2(b), 2(c), 2(d), 2(e), 2(f), 2(g), 2(h) and 2(i). Specifically, these figures illustrate the results obtained by removing at least part of the growth restrict mask 102.

Figure 2A:
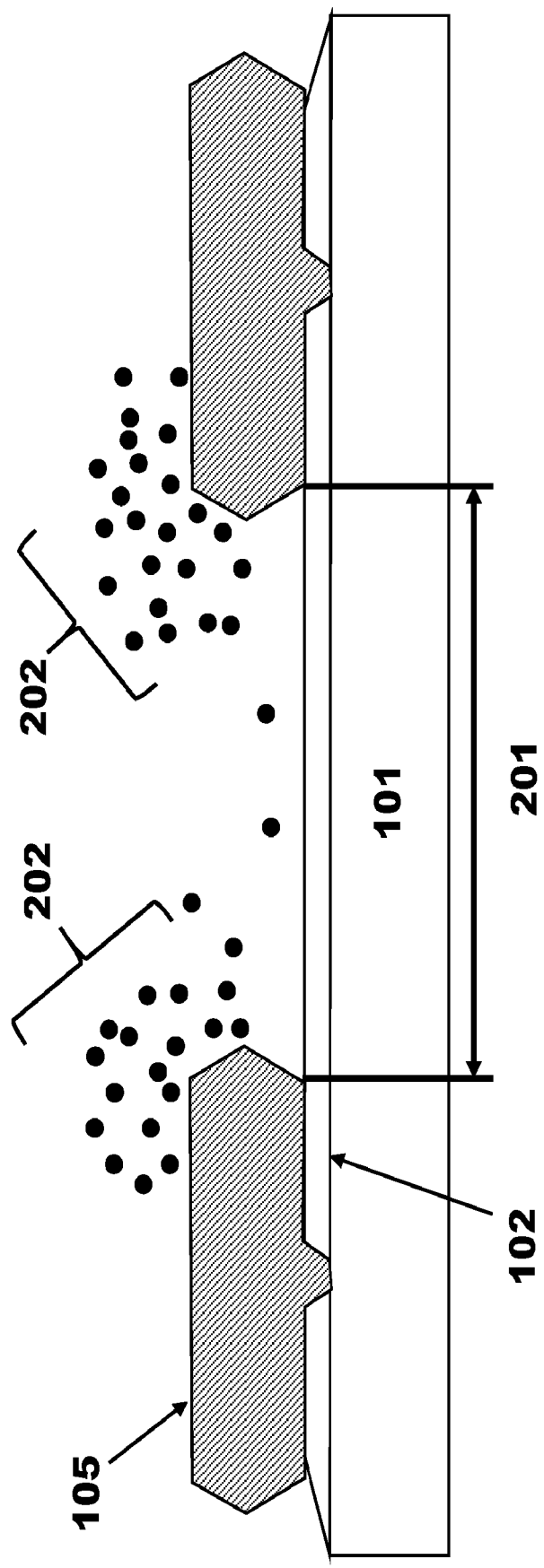

As shown in FIG. 2(a), if the growth restrict mask 102 remains in place when the III-nitride device layers 106 are grown, the supply gases, such as TMGa, TMIn, TMAl, $NH_3$, etc., are not consumed at the exposed area 201 of the growth restrict mask 102. Instead, a large amount of the supply gases 202 are found near the edges of the ELO III-nitride layers 105. This results in a non-uniformity of the supply gases 202.

Figure 2B:
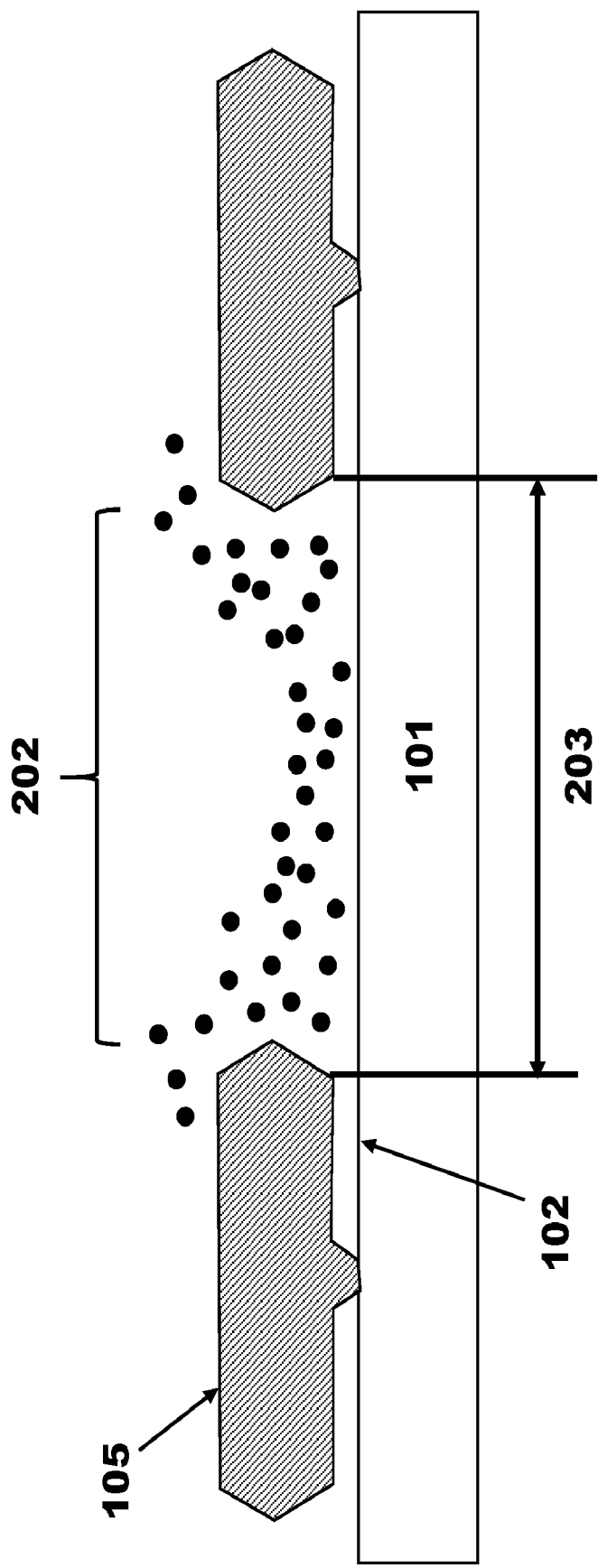
Figure 2E:
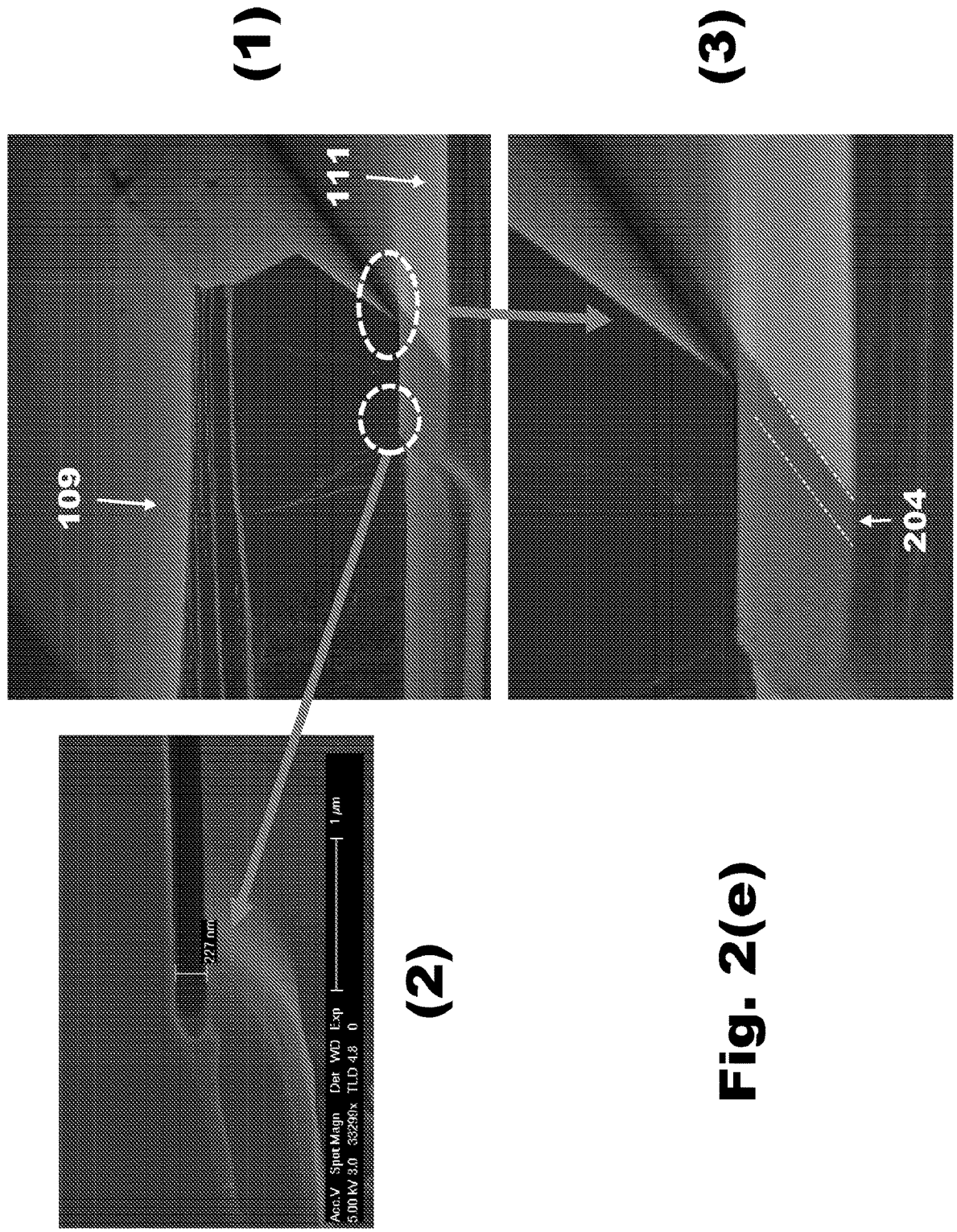

As shown in FIG. 2(b), after the removal of the growth restrict mask 102, the supply gases 202 are consumed in the area 203 where the growth restrict mask 102 was removed. The removal of the growth restrict mask 102 decreases the amount of the supply gases 202 near the edges of the ELO III-nitride layers 105. This results in a more uniformity of the supply gases 202.

In order to confirm the above mechanism, two samples were prepared. The ELO III-nitride layers 105 of the two samples were prepared at the same time. Both samples had a smooth surface. A first sample did not remove the growth restrict mask 102 before growing the III-nitride device layers 106, while a second sample removed the growth restrict mask 102 before growing the III-nitride device layers 106. The two samples were co-loaded into the MOCVD chamber.

In the case where the growth restrict mask 102 was not removed, the excess supply gases 202 at the edges of the ELO III-nitride layer 105 caused a non-uniformity in the growth at the surface of the ELO III-nitride layer 105. As shown in image (1) of FIG. 2(c), the region of the edge on the ELO III-nitride layer 105 sometimes became thicker than the center of the layer. This resulted in a rough surface morphology.

In the case where the growth restrict mask 102 was removed, the excess supply gases 202 at the edges of the ELO III-nitride layers 105 was reduced by eliminating the growth restrict mask 102. Consumption of the supply gases 202 in the area 203 after removal of the growth restrict mask 102 can alleviate the excess supply gases 202 at the edges of the ELO III-nitride layers 105, This results in obtaining a smooth surface as shown in image (2) of FIG. 2(c).

Furthermore, photoluminescence (PL) measurements were also conducted on the two samples. As shown in FIG. 2(d), the surface morphology affected the PL image. The sample with the growth restrict mask 102, shown in image (1) of FIG. 2(d), had a strong fluctuation in the PL image. On the other hand, the sample without the growth restrict mask 102, shown in image (2) of FIG. 2(d), had drastically reduced fluctuations in the PL image. This shows that this technique can result in improved characteristics for the devices 110.

As noted above, the III-nitride device layers 106 can include various type of layers. One type is a low-temperature growth layer or an In-containing layer, such as an active layer. Another type is an Al-containing layer, such as an AlGaN cladding layer and/or an EBL layer. Yet another type is a p-type layer, such as a p-GaN layer, a p-InGaN contact layer, and so on. These layers are susceptible to being affected by the non-uniformity of the supply gases. When growing these layers, the present invention is very effective.

Limited Area Epitaxy (LAE)

According to US Patent Application Publication No. US2017/0092810A1, a number of pyramidal hillocks were observed on the surface of m-plane films after growing the epi-layers. Furthermore, a wavy surface and depressed portion have appeared on the growth surface, which made the surface roughness worse. This is a very severe problem. When an LD structure is fabricated on the surface. For that reason, it is better to grow the epitaxial layer on a non-polar and semi-polar substrate, which is well known to be difficult.

For example, according to some papers, a smooth surface can be obtained by controlling an off-angle (>1 degree) of the substrate's growth surface, as well as by using an $N_2$ carrier gas condition. These are very limiting conditions for mass production, however, because of the high production cost. Moreover, GaN substrates have a large fluctuation of off-angles to the origin from their fabrication methods. For example, if the substrate has a large in-plane distribution of off-angles, it has a different surface morphology at these points in the wafer. In this case, the yield is reduced by the large in-plane distribution of the off-angles. Therefore, it is necessary that the technique does not depend on the off-angle in-plane distribution.

The present invention solves these problem as set forth below.

1. The growth area is limited by the growth restrict mask area from the edge of the substrate.
2. The patterned substrate is a non-polar or semi-polar substrate which has off-angle orientations ranging from −16 degrees to +30 degrees from the m-plane towards the c-plane. In addition, the hetero-substrate with the III-nitride-based semiconductor layer has an off-angle orientation ranging from +16 degrees to −30 degrees from the m-plane towards the c-plane.
3. The island-like III-nitride semiconductor layers 109 have a long side which is the perpendicular to an a-axis of the III-nitride-based semiconductor crystal.
4. During MOCVD growth, a hydrogen atmosphere can be used.
5. The island-like III-nitride semiconductor layers 109 do not coalesce with each other.

Using at least #1, #2 and #3 above, bars with a smooth surface are obtained. It is more preferable that every one of #1, #2, #3, #4 and #5 is conducted.

As shown in FIGS. 3(a), 3(b), 3(c), 3(d), 3(e) and 3(f), the present invention can obtain island-like III-nitride semiconductor layers 109 that have a smooth top surface without pyramidal hillocks and depressed portions, with various planes and various off-angles. The results are explained as following.

Figure 3A:
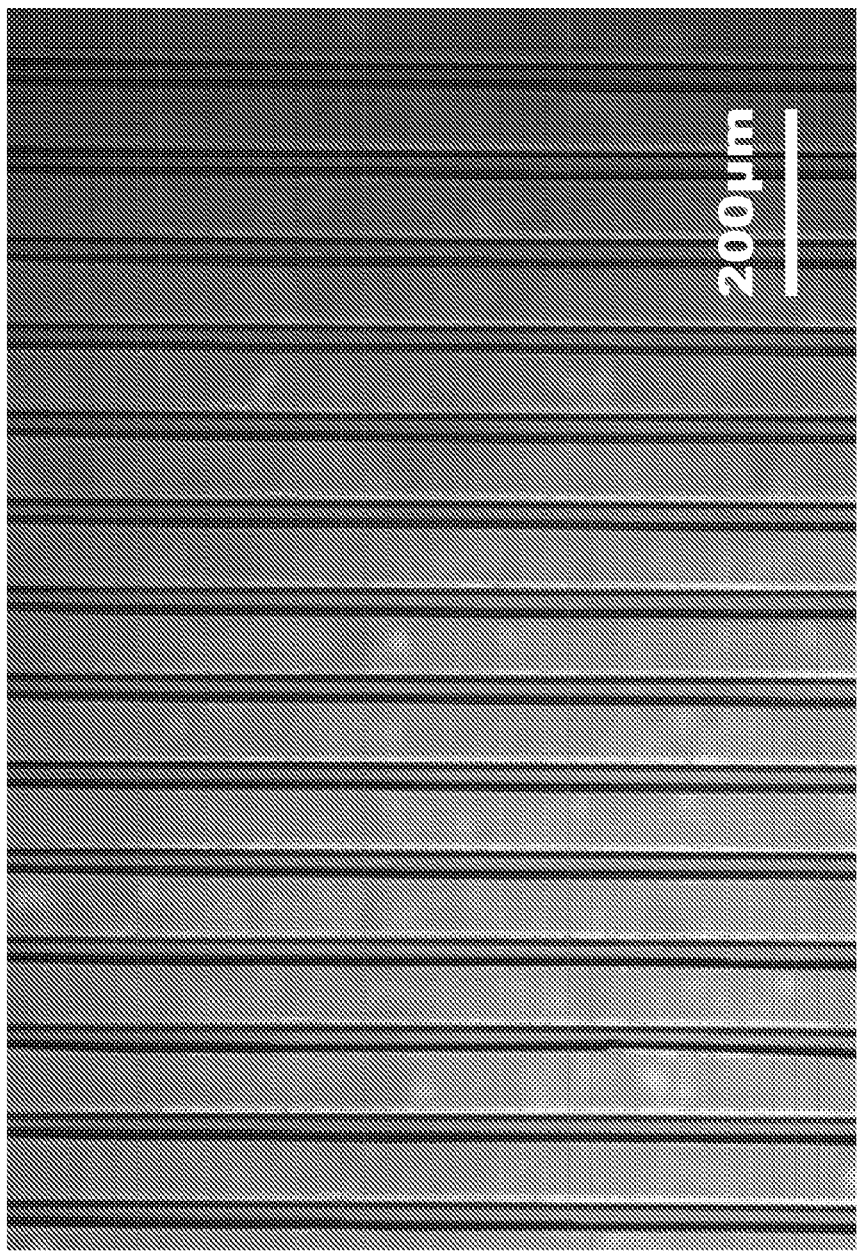

FIG. 3(a) shows an image of the island-like III-nitride semiconductor layers 109 on an m-plane (1-100) with a −1.0 degree miscut towards the c-axis.

FIG. 3(b) shows images of the island-like III-nitride semiconductor layers 109 with different mis-cut orientations of the m-plane (1-100), including (1) 0 degrees, (2) −0.45 degrees, (3) −0.6 degrees, and (4) −1.0 degrees.

FIG. 3(c) shows images of the island-like III-nitride semiconductor layers 109 with different off-angles from the m-plane (1-100) towards the +c-plane, including (1) the (10-10) plane at 0 degrees, (2) the (30-31) plane at +10 degrees, and (3) the (20-21) plane at +15 degrees.

Figure 3D:
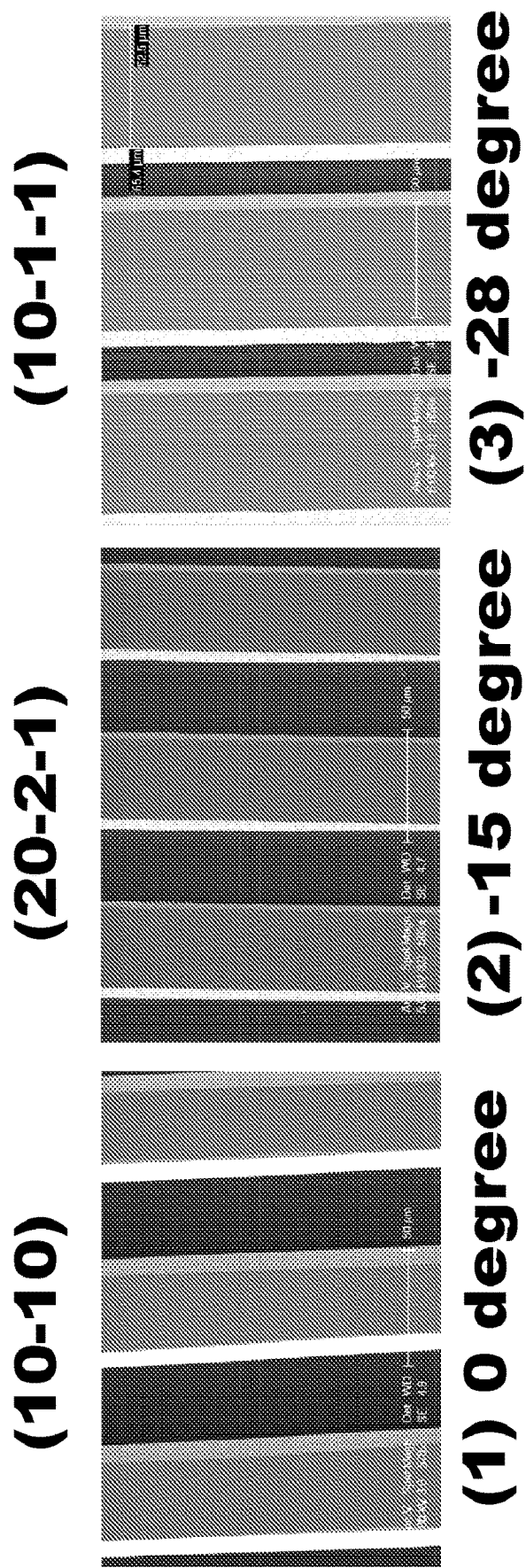

FIG. 3(d) shows images of the island-like III-nitride semiconductor layers 109 with different off-angles from the m-plane (1-100) towards the -c-plane (0001), including (1) the (10-10) plane at 0 degrees, (2) the (20-2-1) plane at −15 degrees, and (3) the (10-1-1) plane at −28 degrees.

FIG. 3(e) shows images of the island-like III-nitride semiconductor layers 109 with different mis-cut orientation from the c-plane (0001) towards the m-plane (1-100), including (1) a 0.2 degree mis-cut, and (2) a 0.8 degree mis-cut.

FIG. 3(f) shows images of the island-like III-nitride semiconductor layers 109 with an AlGaN layer on various planes, including (1-100), (20-21), (20-2-1), (1-100). (20-21) and (20-2-1), wherein the Al composition of the AlGaN layer is 3%-5%. As shown in FIG. 3(f), using the AlGaN layer, a smooth surface can be obtained for the island-like III-nitride semiconductor layers 109.

Those results have been obtained by the following growth conditions.

In one embodiment, the growth pressure ranges from 60 to 760 Torr, although the growth pressure preferably ranges from 100 to 300 Torr to obtain a wide width for the island-like III-nitride semiconductor layers 109; the growth temperature ranges from 900° C. to 1200° C.; the VIII ratio ranges from 1000-30,000 and more preferably 3000-10000; the TMG is from 2-20 sccm; $NH_3$ ranges from 3 to 10 slm; and the carrier gas is only hydrogen gas, or both hydrogen and nitrogen gases. To obtain a smooth surface, the growth conditions of each plane needs to be optimized by conventional methods.

After growing for about 2-8 hours, the ELO III-nitride layer 105 had a thickness of about 8-50 μm and a bar width of about 20-150 μm, wherein the bar width comprises the width of the island-like III-nitride semiconductor layers 109.

This method can obtain a smooth surface for the ELO III-nitride layers 105 using various semipolar and nonpolar plane substrates 101, as well as polar c-plane substrates 101. Thus, the present invention can adopt various planes not depending on an off-angle of the substrate 101.

III-Nitride Device Layers

Figure 4:
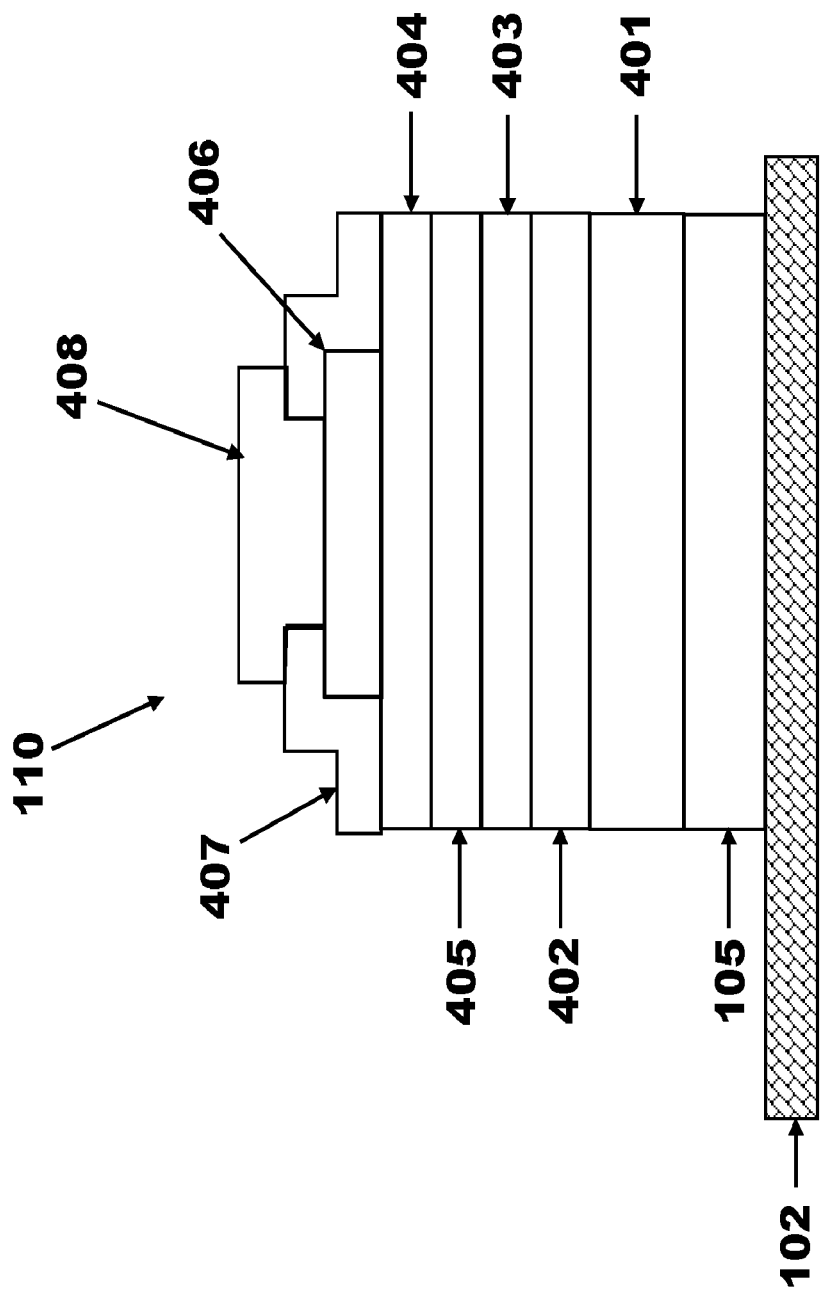
FIG. 4 is a cross-sectional view of a laser diode device formed from the island-like III-nitride-based semiconductor layers, according to one embodiment of the present invention.

FIG. 4 is a cross-sectional side view of a III-nitride semiconductor laser diode device 110 fabricated along a direction perpendicular to an optical resonator.

The device 110 is fabricated at the flat surface region 107 by conventional methods, wherein a ridge structure, p-electrode, n-electrode, pads, etc., are disposed on the island-like III-nitride semiconductor layers 109 at pre-determined positions. (The figure does not describe the bending region 108.)

The laser diode device 110 is comprised of the following III-nitride device layers 106, laid one on top of another, in the order mentioned, grown on the ELO GaN-based layers 105 deposited on the growth restrict mask 102: an n-$Al_{0.06}$GaN cladding layer 401, an n-GaN waveguide layer 402, an InGaN/GaN multiple quantum well (MQW) active layer 403, an AlGaN EBL layer 404, a p-GaN waveguide layer 405, an ITO cladding layer 406, an $SiO_2$ current limiting layer 407, and a p-electrode 408.

MOCVD is used for the epitaxial growth of the III-nitride device layers 106. Trimethylgallium (TMGa), triethylgallium (TEG), trimethylindium (TMIn) and triethylaluminium (TMAl) are used as III elements sources; ammonia ($NH_3$) is used as the raw gas to supply nitrogen; and hydrogen ($H_2$) and nitrogen ($N_2$) are used as a carrier gas of the III elements sources. Saline and Bis(cyclopentadienyl)magnesium ($Cp_2Mg$) are used as n-type and p-type dopants, respectively. The pressure setting typically is 50 to 760 Torr. The III-Nitride device layers 106 are generally grown at temperature ranges from 700 to 1250° C. Other growth parameters include the following: TMG is 12 sccm, $NH_3$ is 8 slm, carrier gas is 3 slm, $SiH_4$ is 1.0 sccm, and the V/III ratio is about 7700. These growth conditions are only one example, and the conditions can be changed and optimized for each of above described layers.

The optical resonator is comprised of a ridge stripe structure, wherein the ridge stripe structure is comprised of the ITO cladding layer 406, the $SiO_2$ current limiting layer 407, and the p-electrode 408. The optical resonator provides optical confinement in a horizontal direction. The width of the ridge stripe structure is on the order of 1.0 to 30 μm and typically is 10 μm.

Conventional methods, such as photo-lithography and dry etching, can be used to fabricate the ridge strip structure. The ridge depth (from the surface to the ridge bottom) is in the p-GaN guide layer 405. The ridge depth is pre-determined before dry etching is performed, based on simulation or previous experimental data.

In one embodiment, the p-electrode 408 may be comprised of one or more of the following materials: Pd, Ni, Ti, Pt, Mo, W, Ag, Au, etc. For example, the p-electrode 408 may comprise Pd—Ni—Au (with thicknesses of 3-30-300 nm). These materials may be deposited by electron beam evaporation, sputter, thermal heat evaporation, etc. In addition, the p-electrode 408 is typically deposited on the ITO cladding layer 406.

The Growth Restrict Mask and the III-Nitride Device Layers

Figure 2F:
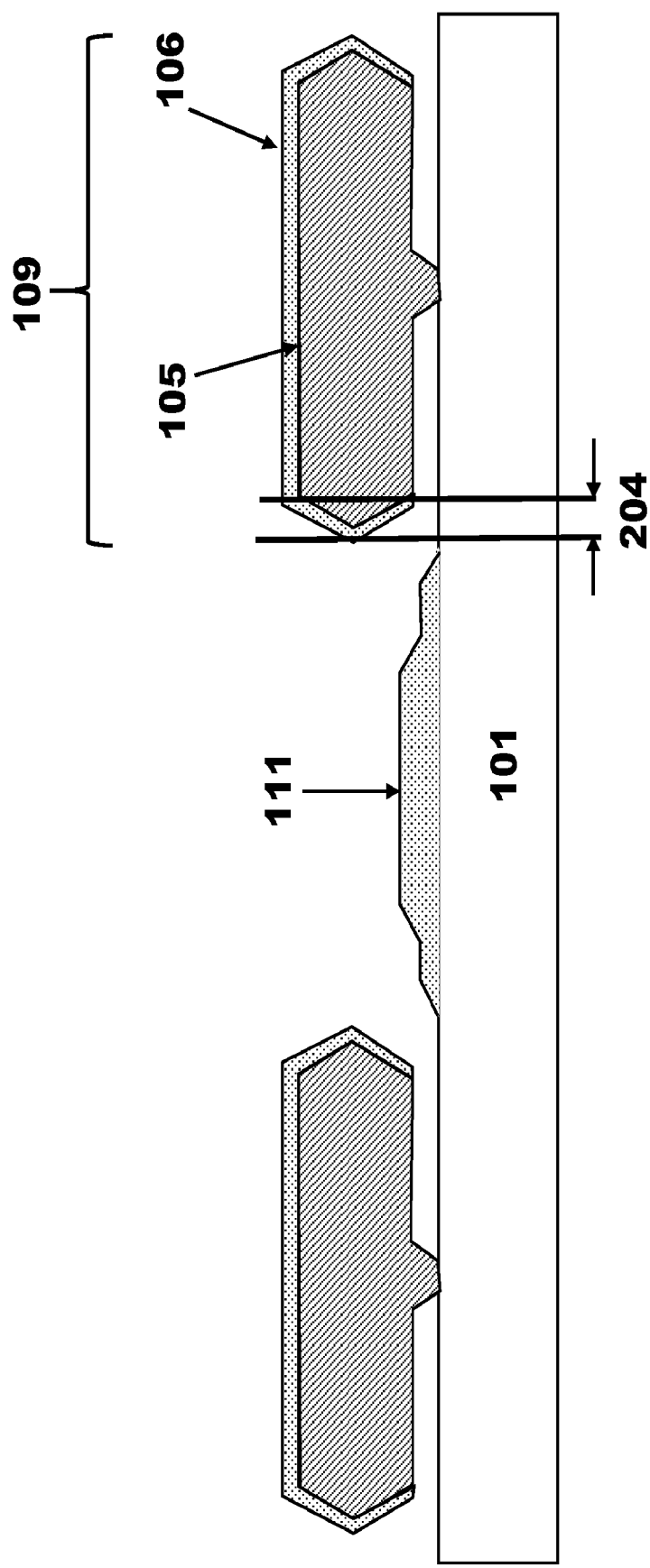
Figure 2G:
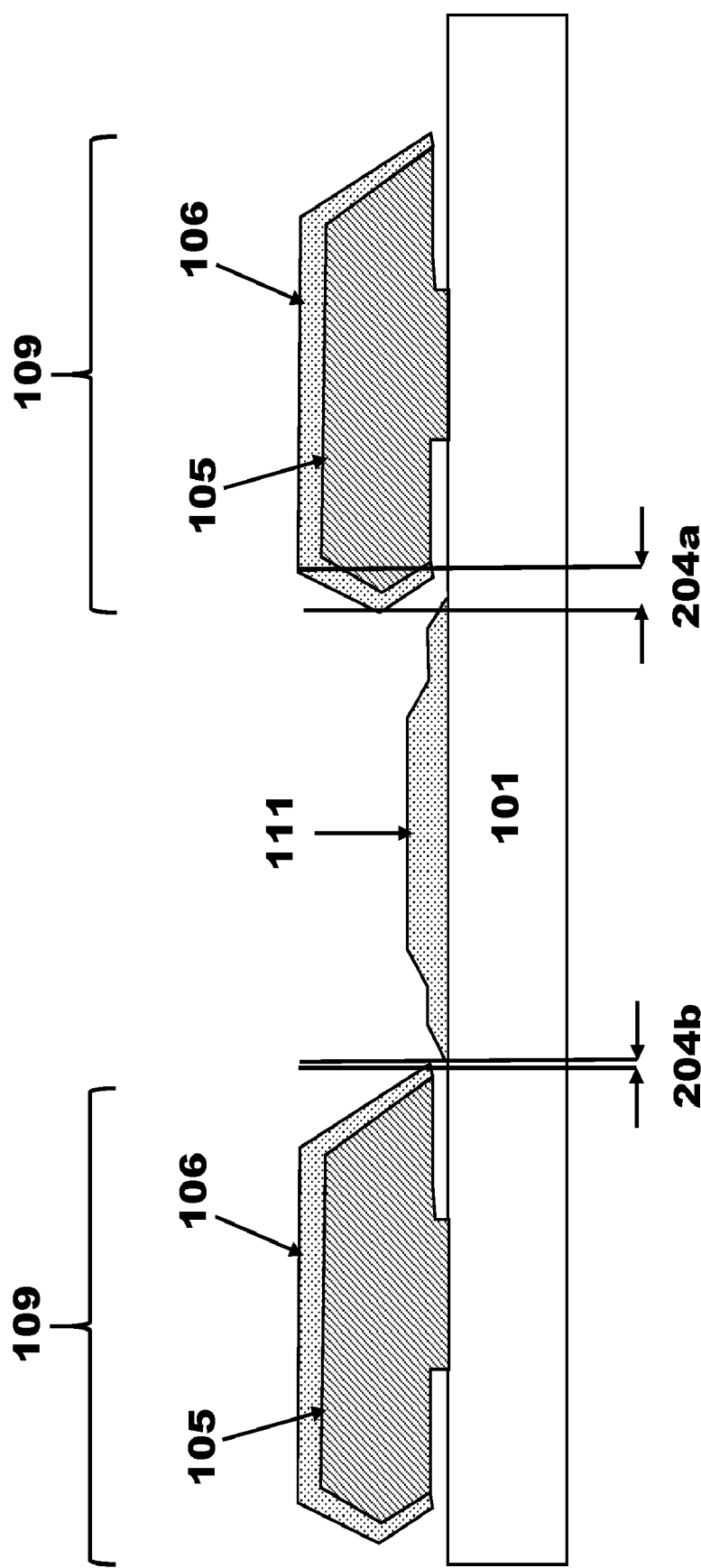

There is a concern in the case where the growth restrict mask 102 is removed before the growth of the III-nitride device layers 106. The concern arises when the island-like III-nitride semiconductor layers 109 connect with the bottom layer 111. If the two layers 109, 111 connect to each other, it is difficult to remove the island-like III-nitride semiconductor layers 109. However, FIGS. 2(f) and 2(g) illustrate a situation where the two layers 109, 111 do not connect to each other, wherein FIG. 2(f) shows the island-like III-nitride semiconductor layers 109 separated from the bottom layer 111 by a bottom area 204, and FIG. 2(g) shows the island-like III-nitride semiconductor layers 109 separated from the bottom layer 111 by bottom areas 204a and 204b. In both instances, the bottom layer 111 does not grow at the edge of the growth restrict mask 102, or has a very slow growth rate. This result occurs because the edge of the growth restrict mask 102 shadows the bottom area 204 from the supply gases 202 used in the growth of the island-like III-nitride semiconductor layers 109.

Step 5: Device Processes

After Step 4, the island-like III-nitride semiconductor layers 109 are separated from each other. The present invention can use either a III-nitride substrate 101 or a hetero-substrate 101, such as sapphire, SiC, $LiAlO_2$, Si, etc., as long as it enables growth of an ELO III-nitride layer 105 through a growth restrict mask 102. In the case using a III-nitride substrate 101, the present invention can obtain high quality ELO III-nitride layers 105, and avoid bowing or curvature of the substrate 101 during epitaxial growth due to homo-epitaxial growth. As a result, the present invention can also easily obtain devices 110 with reduced defect density, such as dislocation and stacking faults.

Step 6: Forming a Structure for Cleaving at the Flat Surface Region and Side Facets As shown in FIGS. 5(a), 5(b), 5(c) and 5(d), the aim of this step is to prepare to divide a bar 501 of the device 110 before the bar 501 of the device 110 is removed from the substrate 101. A dividing support region 502 is formed at periodic lengths, wherein each period is determined by the device 110 length. For example, in the case of a laser diode device 110, one period is set to be 300-1200 µm.

Figure 5A:
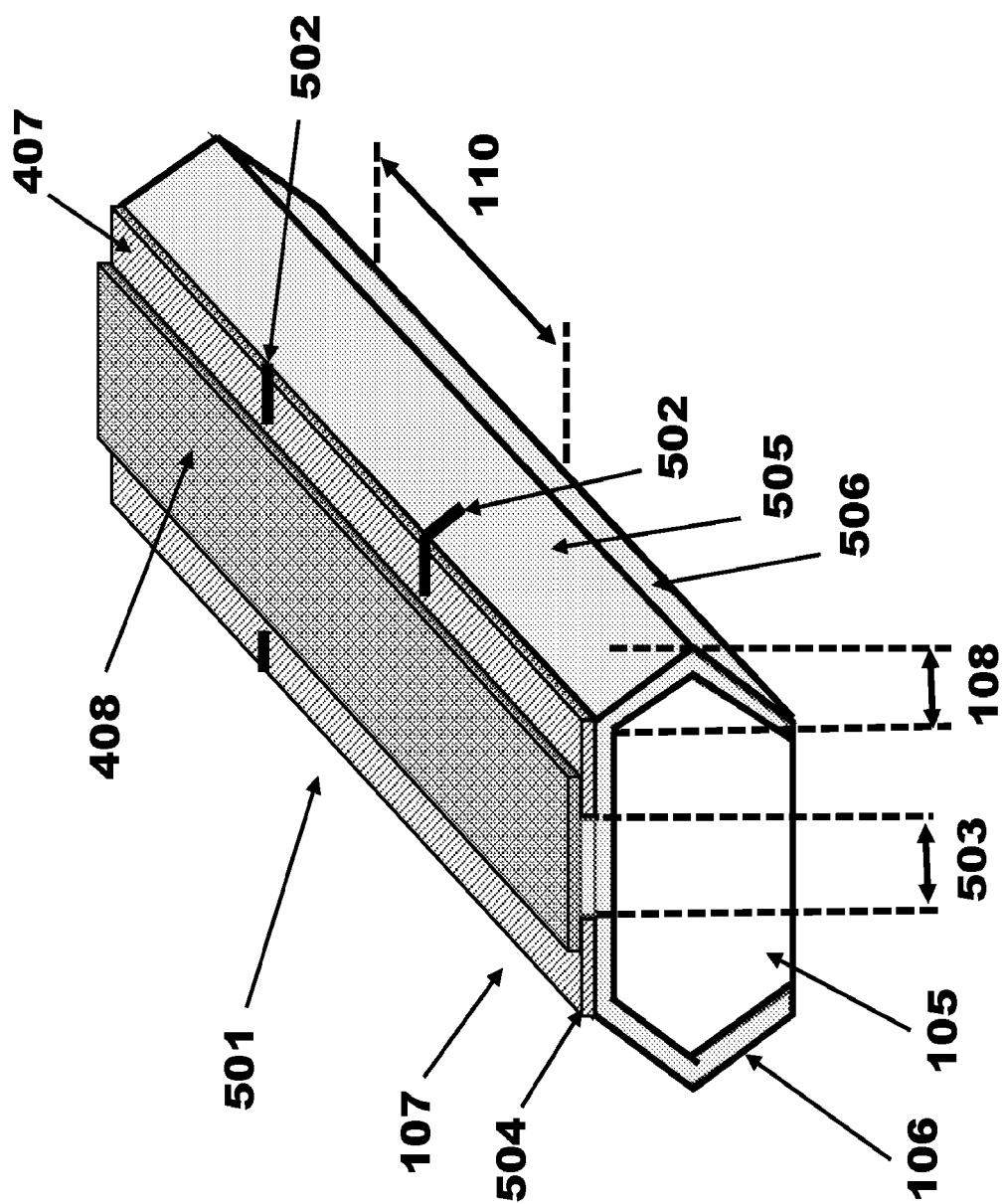
FIGS. 5(a), 5(b), 5(c) and 5(d) illustrate how a dividing support region is formed at periodic lengths along a bar of the device, according to one embodiment of the present invention.
Figure 5B:
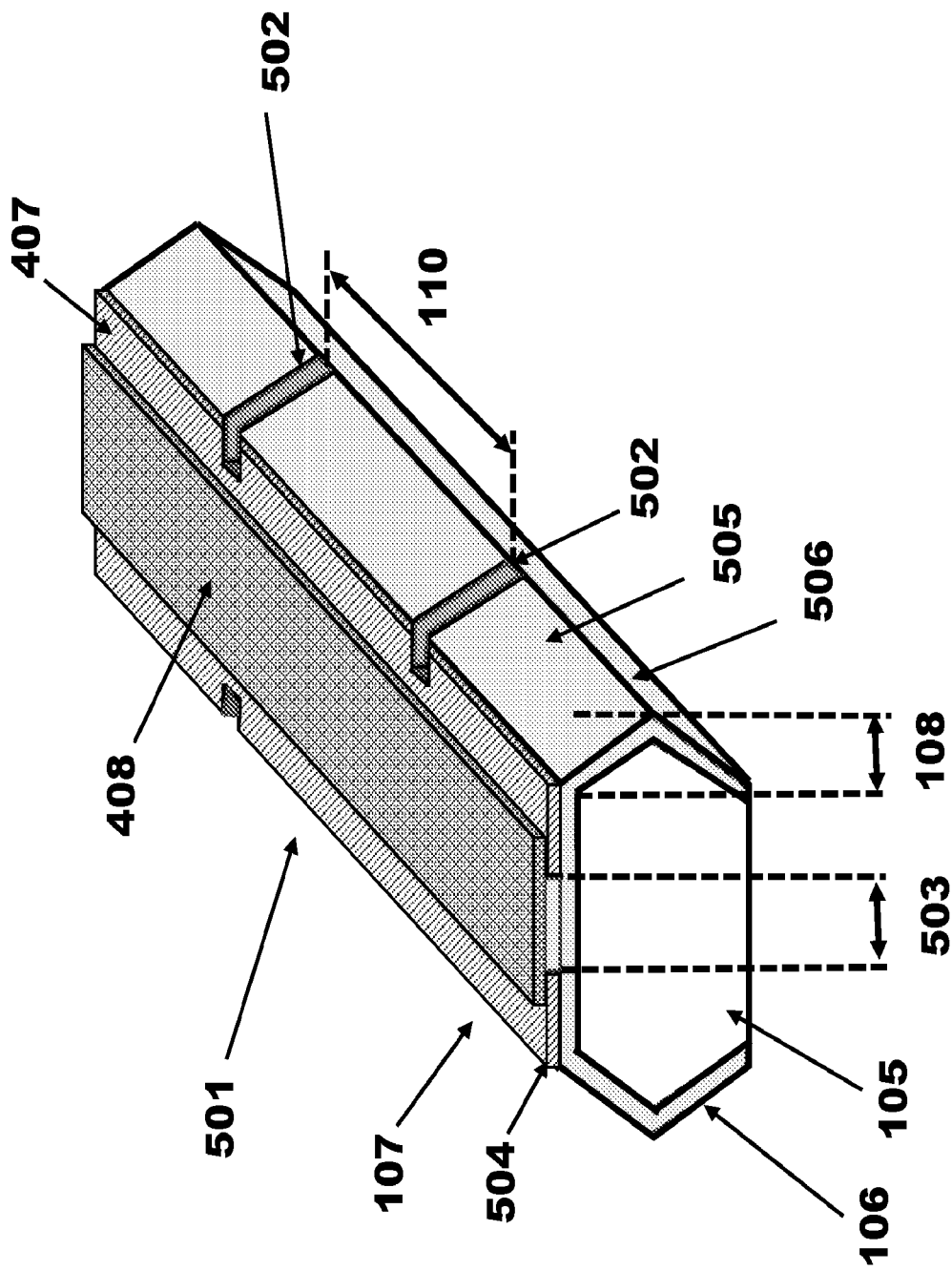

The dividing support region 502 is a line scribed by a diamond tipped scriber or laser scriber, as shown in FIG. 5(a); or a trench formed by dry-etching such as RIE (Reactive Ion Etching) or ICP (Inductively Coupled Plasma), as shown in FIG. 5(b); but is not limited to those methods. The dividing support region 502 may be formed on both sides of the bar 501 or on one side of the bar 501. The depth of the dividing support region 502 is preferably 1 µm or more.

Both cases can divide the bar 501 into separate devices 110 at the dividing support region 502, because the dividing support region 502 is weaker than any other part. The dividing support region 502 avoids breaking the bar 501 at unintentional positions, so that it can precisely determine the device 110 length.

The dividing support region 502 is created at the flat surface region 107 in a manner that avoids a current injection region 503, which is in the ridge structure, and the p-electrode 408, and the layer bending region 108, although it may encompass at least a portion of the $SiO_2$ current limiting layer 407.

As shown in FIGS. 5(a) and 5(b), the dividing support region 502 is formed at a first facet 504, and optionally, a second facet 505, which are easy to process because they are flattened areas. A third facet 506 may be avoided.

Figure 5C:
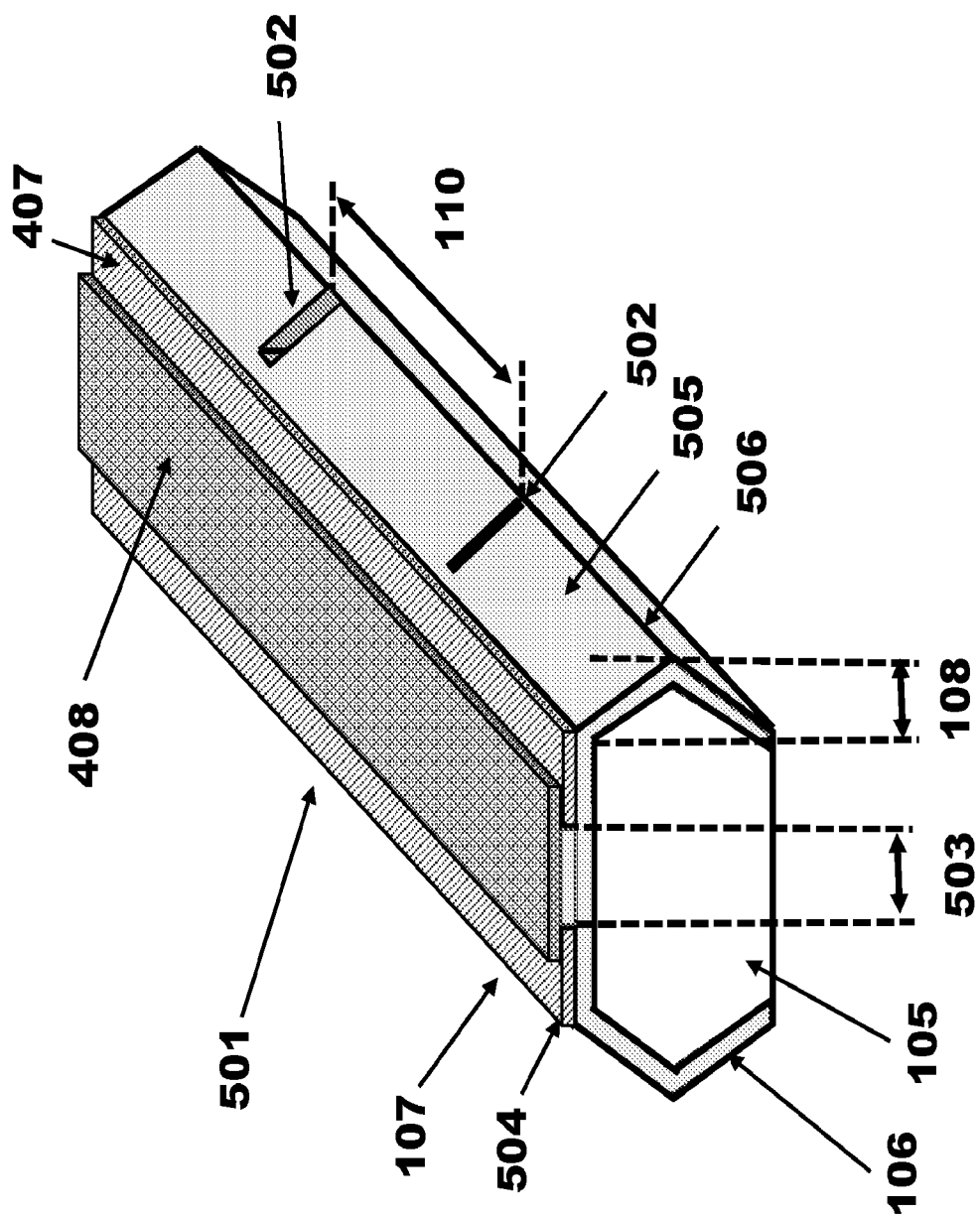

As shown in FIG. 5(c), it may be preferable that the dividing support region 502 is formed only at the second facet 505, in which case, it must use the small width of the island-like III-nitride semiconductor layers 109. In this case, it can divide the bar 501 of the device 110 precisely.

Figure 5D:
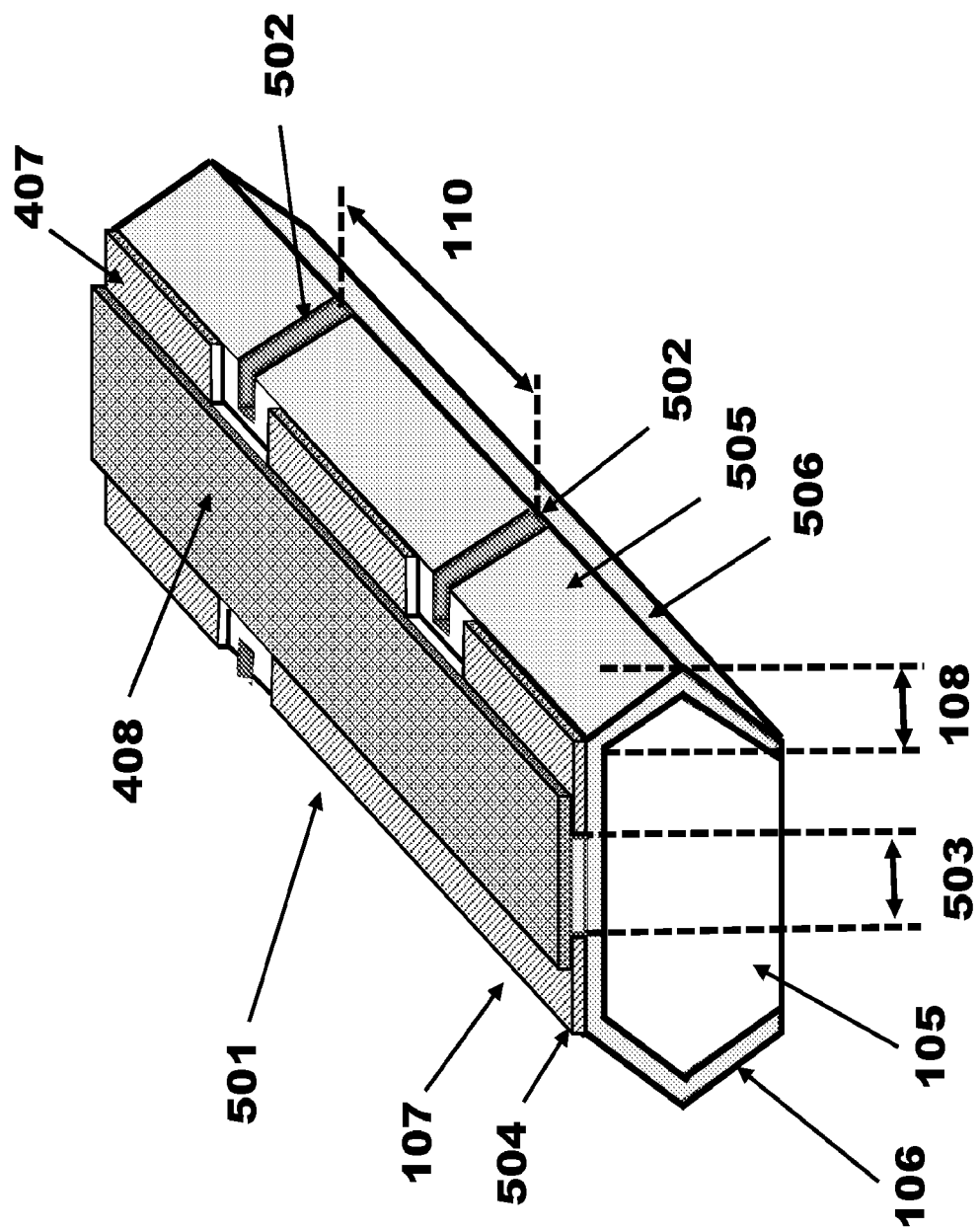

Moreover, as shown in FIG. 5(d), the p-electrode 408, dielectric layer 407, and p-pad for wire bonding and so on, can avoid the dividing support region 502. By doing this, FIG. 6(a) is changed like FIG. 6(b).

As shown in the SEM images of FIG. 7(a), the back side of the bar 501, after being removed, has two different portions: one is a separate area that is between the two dashed white lines; another is a wing region that is outside of the separate area. The two different portions have different surface morphologies, which might be an opportunity to prevent the cleave line from going straight. Besides, there are some fluctuation within the wing region due to the interaction between the mask and the back-side surface of the island-like III-nitride semiconductor layers 109. FIG. 7(b) shows SEM images of the surface of the substrate 101 after the bar 501 has been removed.

Therefore, it is preferable that the dividing support region 502 be formed on the first facet 504 and/or second facet 505, as shown in FIGS. 5(a), 5(b), 5(c) and 5(d). By doing this, the shape of the dividing support region 502 is formed uniformly. It is much preferable that the blade for breaking the bar 501 contact the back-side of the bar 501. By doing this, the cleaving starts from the dividing support region 502 at the top surface of the bar 501.

Step 7: Removing the Bar of the Device from the Substrate

This step of removing the bar 501 is explained using FIGS. 8(a), 8(b), 8(c), 8(d), 8(e), 8(f) and 8(g).

Step 7.1 comprises attaching a polymer film 801 to the bar 501 of the device 110, as shown in FIG. 8(a). In this embodiment, the polymer film 801 is comprised of a base film 802, an adhesive 803 and a backing film 804.

Step 7.2 comprises applying pressure 805 to the polymer film 801 and the substrate 101 using plates 806, as shown in FIG. 8(b). The aim of applying pressure 805 is to put the polymer film 801 in-between the bars 501 of the devices 110. The polymer film 801 is softer than the bars 501 of the devices 110, so the polymer layer 801 can easily surround the bars 501 of the devices 110. Preferably, the polymer film 801 is heated in order to soften it, which makes it easy for the polymer film 801 to cover the bars 501 of the devices 110.

Step 7.3 comprises reducing the temperature of the polymer film 801 and the substrate 101, while maintaining the applied pressure 805. It is not necessary to apply pressure 805 during the changing of the temperature.

Step 7.4 comprises utilizing the differences in thermal coefficients between the polymer film 801 and the substrate 101 for removing the bars 501 of the devices 110.

Figure 8C:
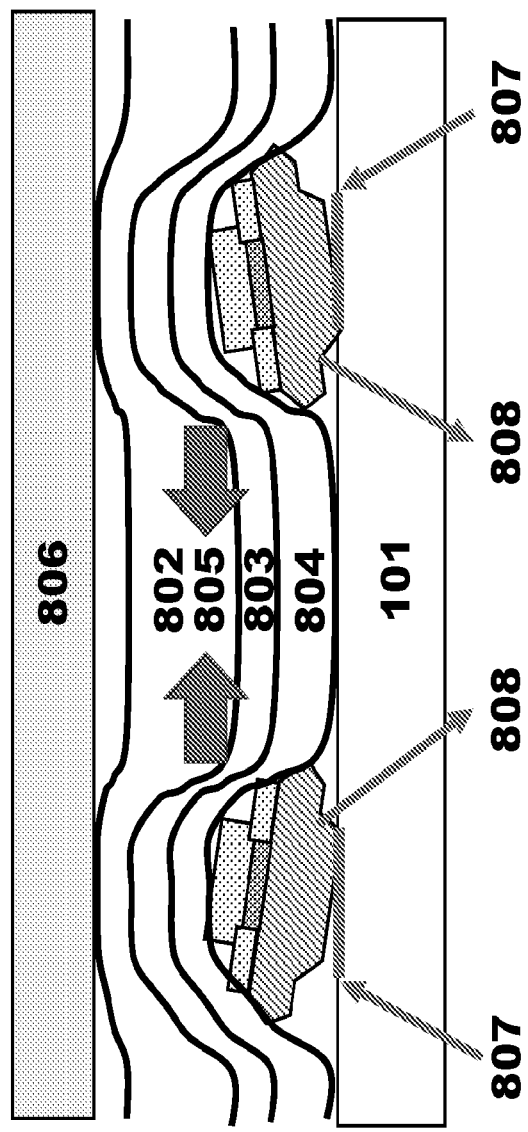

As shown in FIG. 8(c), the polymer film 801 shrinks as the temperature decreases. As a result, the bottom of the polymer film 801 is lower than the top of the bars 501 of the devices 110, as shown in FIG. 8(d).

As shown in FIG. 8(c), the polymer film 801 can apply the pressure 805 in the horizontal direction at side facets of the bars 501 of the devices 110, exposing cleaving points 807 and tilting the bars 501 of the devices 110 downward obliquely 808. This pressure 805 applied from the side facets allows the bars 501 of the devices 110 to be effectively removed from the substrate 101. During low temperature, the polymer film 801 maintains the applied pressure 805 from the top of the polymer film 801 to the bars 501 of the devices 110.

Various methods may be used to reduce the temperature. For example, the substrate 101 and the polymer film 801 can be placed into liquid $N_2$ (for example, at 77° K.) at the same time while applying pressure 805. The temperature of the substrate 101 and the polymer film 801 can also be controlled with a piezoelectric transducer. Moreover, the plate 806 that applies the pressure 805 to the polymer film 801 can be cooled to a low temperature before and/or during contact with the polymer film 801. By doing this, the polymer film 801 is cooled and can apply pressure 805 to the bars 501 of the devices 110 due to a large thermal expansion coefficient.

When reducing the temperature, the substrate 101 and the polymer film 801 may be wetted by atmospheric moisture. In this case, the temperature reduction can be conducted in a dry air atmosphere or a dry $N_2$ atmosphere, which avoids the substrate 101 and the polymer film 801 getting wet.

Thereafter, the temperature increases, for example, to room temperature, and the pressure 805 is no longer applied to the polymer film 801. At that time, the bars 501 of the devices 110 have already been removed from the substrate 101, and the polymer film 801 is then separated from the substrate 101. As shown in FIG. 8(e), when using a polymer film 801, especially a polymer film 801 having adhesive 803, the bars 501 of the devices 110 can be removed using the polymer film 801 in an easy and quick manner.

Figure 8F:
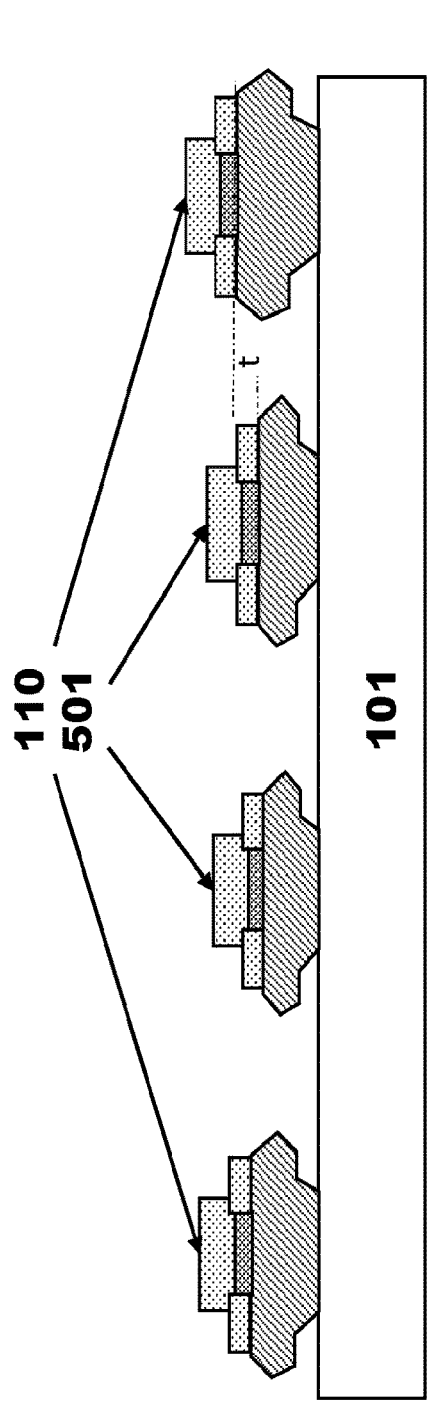
Figure 8G:
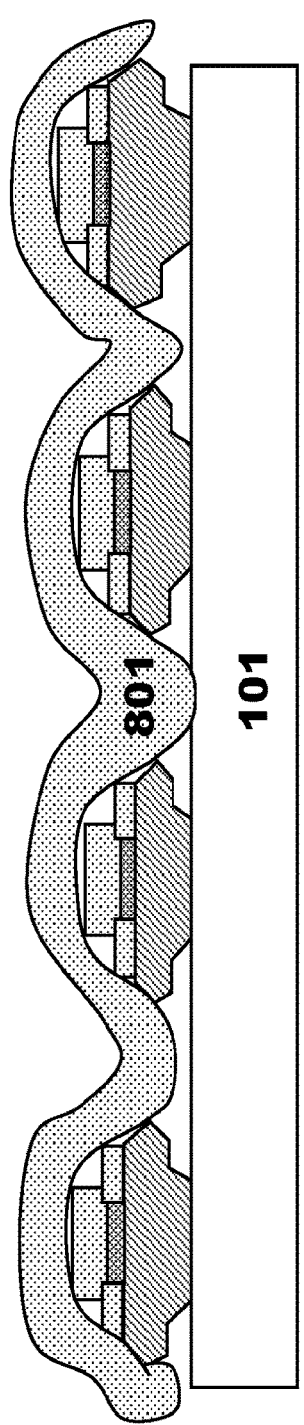

As shown in FIG. 8(f), there may be an occasion having a different height t among the bars 501 of the devices 110, depending on a growth condition. In this case, the removal method with the polymer film 801 is good at removing the different height bars 501 of the devices 110, because these films 801 are flexible and soft, as shown in FIG. 8(g).

The Method of Removing the Bar

Utilizing the different thermal expansion coefficients between the polymer film 801 and the semiconductor material of the devices 110, pressure in the horizontal direction pressure is applied uniformly to the whole substrate 101. The bars 501 of devices 110 can be removed from the substrate 101 without breaking the bars 501 of the devices 110. This has been proven by the high yields achieved in removing the bars 501.

As shown in the SEM images of FIGS. 9(a), 9(b), 10(a), 10(b), 10(c), 10(d) and 10(e), this method can remove the bar 501 of the device 110 from many different substrate 101 planes, such as (1-100) just, (20-21), (20-2-1), and (0001). In these examples, the length of the bar 501 is about 1.2 mm. Moreover, even though the (20-21) and (20-2-1) planes are not cleaved facets of the bulk GaN substrate 101, this method can remove the bar 501 without breaking the bar 501 in an easy manner. In other words, the advantage of this method is that the bar 501 can be removed from different substrate 101 planes with the same method, because this method does not depend on the substrate 101 plane. More preferably, it can utilize the cleavage of the m-plane on the GaII crystal when removing the bar 501. In the case where the substrate 101 is not an m-plane substrate 101, such as (20-21), (20-2-1) or (0001), the surface of the separate area after the removal contained m-plane as part of its surface, and the bar 501 can be removed by the lesser pressure.

The bar 501 of the device 110 is a rectangular shape with long sides and short sides, as shown in FIGS. 11(a) and 11(b). Pressure is applied to the bar 501 of the device 110 having such a shape from a vertical direction and in a horizontal direction against the long side of the bar 501, as shown in FIG. 8(c). By doing this, an effective impact can be given to the cleaving point 807, which removes the bars 501 of the devices 110 from the substrate 101. The growth restrict mask 102 is preferably eliminated from the substrate 101 by wet etching, etc., before attaching the polymer film 801 to the bars 501 of the devices 110. Eliminating the growth restrict mask 102 makes a space to apply pressure at the cleaving point 807 underneath the bars 501 of the devices 110, which can tilt the bars 501 of the devices 110 obliquely downward 808 as shown in FIG. 8(c).

This method using the polymer film 801 can apply the pressure 805 to the bars 501 of the devices 110 uniformly across a large area and in the proper amount. Selecting the kind of polymer film 801 and/or the temperature, and the ramp-up and/or ramp-down rate of the temperature, can control the amount of pressure 805 applied to the bars 501 of the devices 110. In addition, this invention is not limited by the ramp-up and/or ramp-down rate of the temperature, and a thermosetting resin film may be used to remove the bars 501 of the devices 110 when raising the temperature. Again, this results in a high yield for removing the bars 501.

In mass production, it is occasionally difficult to remove every bar 501 of a device 110 on a substrate 101, especially one with a wide area. Sometimes, there is an occasion where some bars 501 of the devices 110 remain on the substrate 101 after the removal of one or more bars 501 of the devices 110. In the prior art method described above, it is hard to repeat a removal process due to a metal bonding process between a wafer and a support metal.

On the other hand, this removal method of using the polymer film 801 and the substrate 101 with the ELO III-nitride layers 105 can be repeated many times. When some bars 501 of the devices 110 remain on the substrate 101, repeating this method allows the remaining bars 501 of the devices 110 to be removed from the substrate 101 completely.

Since this removal method does not include a catastrophic process, such as metal bonding, it can be a repeatable process. By repeating this removal method, almost all of the bars 501 of the devices 110 can be removed from the substrate 101, including substrates 101 such as 2 inch, 4 inch or other wafer sizes.

Cleaving at a Separate Area of the m-Plane

The cleaving method utilizing the m-plane facet is explained here. FIGS. 7(a) and 7(b) show SEM images of the backside of a bar of a device 110 after being removed and the surface of the substrate 101 after removing the bar 501 of the device 110, for the (1-100) just, (20-21), and (20-2-1) planes, respectively. It can be seen that the backside of the bar 501 for the (1-100) just plane is relatively smooth surface, as shown in FIG. 7(a), as is the surface of the substrate 101 after removing the bar 501 for the (1-100)-plane, as shown in FIG. 7(b), as compared to the other planes.

Figure 12B:
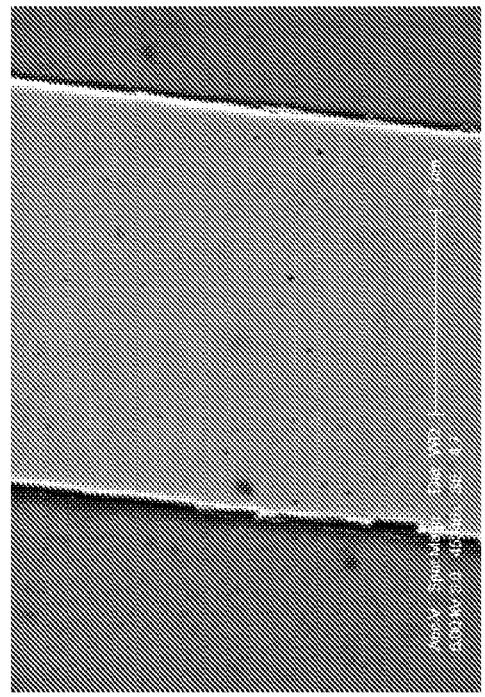
FIGS. 12(a) and 12(b) are SEM images of a very smooth surface for a (1-100) plane without a mis-cut orientation after a bar of a device is removed.
Figure 12A:
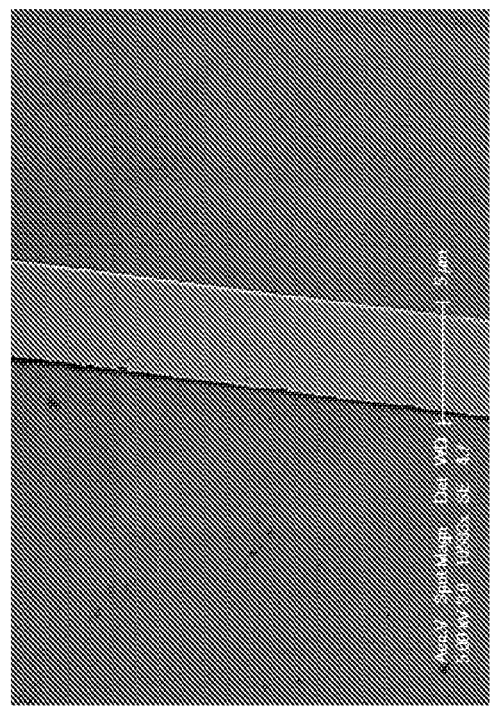
Figure 13B:
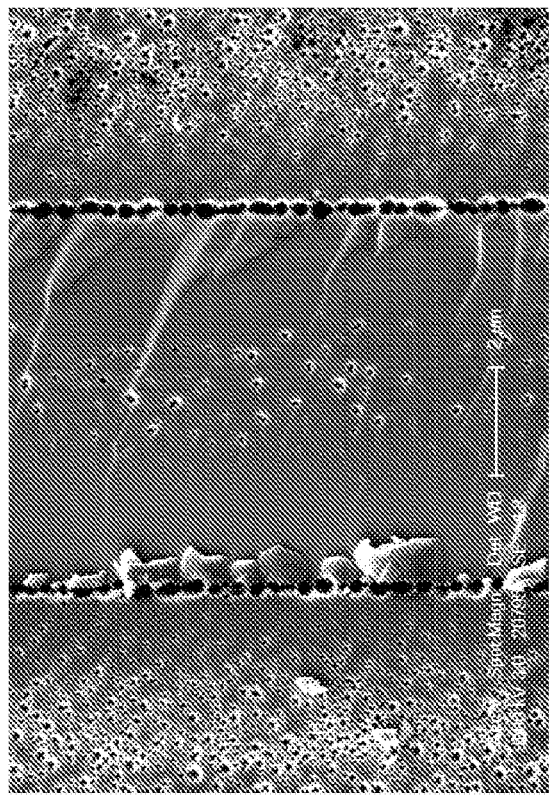
FIGS. 13(a) and 13(b) are SEM images of a surface of a substrate after removing a bar of a device for a (0001) plane with a mis-cut orientation of 0.7 degrees towards the m-plane.
Figure 13A:
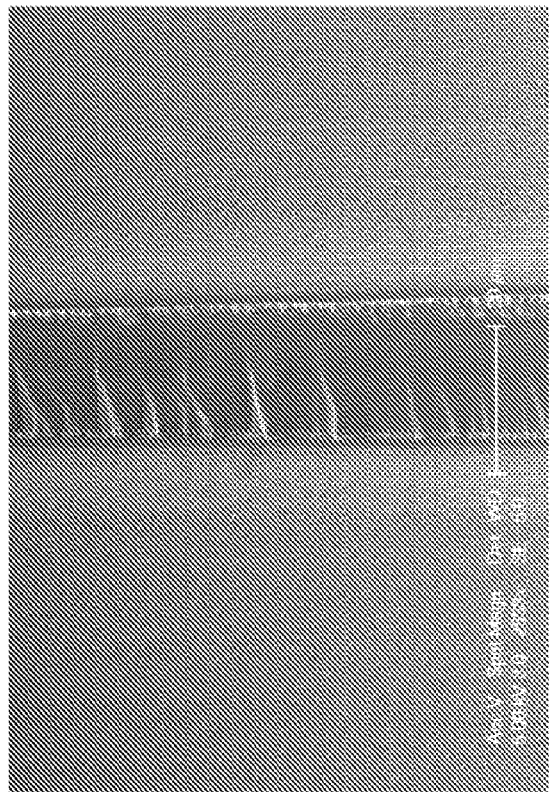

As shown in the image of FIG. 12(a) and its enlargement in FIG. 12(b), it is possible to obtain a very smooth surface for the (1-100) plane without a mis-cut orientation after the bar 501 of the device 110 is removed, wherein the surface is smooth enough to be used as a facet for a VCSEL. As shown in the image of FIG. 13(a) and its enlargement in FIG. 13(b), the surface of the substrate 101 after removing the bar 501 of the device 110 is pitted for the (0001) plane with a mis-cut orientation of 0.7 degrees towards the m-plane.

As shown in FIG. 7(b), the backside of the bar 501 of the device 110 for the semipolar (20-21) and (20-2-1) planes had periodic concavity and convexity. In these results, the interface at the cleaving point was an m-plane facet. The cleaving interface was measured using a Laser Scanning Confocal Microscope (LSCM).

Figure 14:
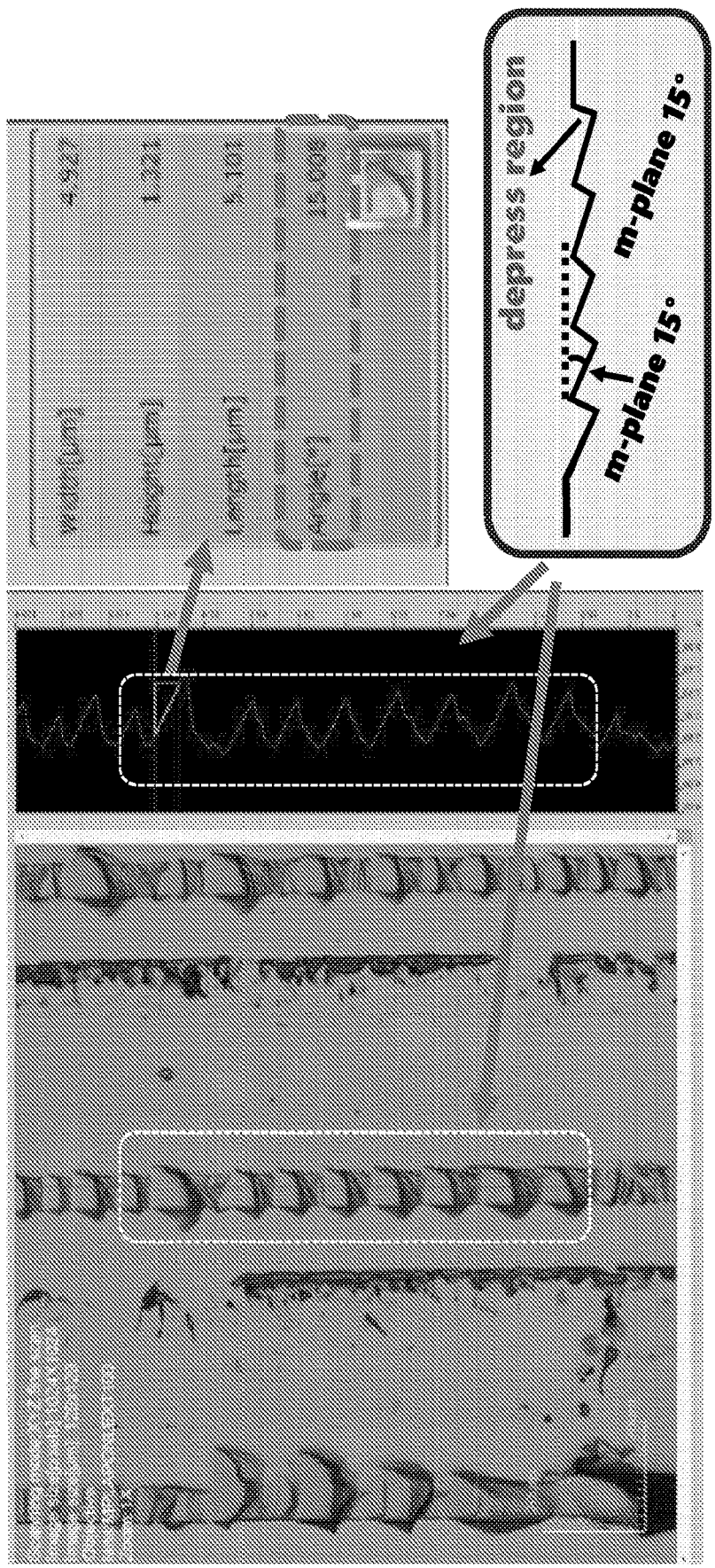
FIG. 14 shows SEM images and material properties for a surface of a (20-21) free standing GaN substrate after removing a bar of a device.

The images of FIG. 14, which include measurements by the LSCM, shows the surface of the (20-21) free standing GaN substrate 101 after removing the bar 501 of the device 110. The surface of the depressed region is tilted 15 degrees from the surface of the (20-21) substrate 101, wherein the surface of the (20-21) substrate 101 is tilted 15 degrees from the m-plane. Therefore, the surface of the depressed region is an m-plane. The m-plane of bulk GaN is well known as a facet with high cleavage, and utilizing the cleavage of m-plane for removing the bar 501 is very important and useful. The method of removing the bar 501 can effectively utilize the cleavage of the in-plane, even though the semipolar (20-21) substrate 101 does not have the m-plane as a main surface.

As shown in FIG. 14, it is preferable that the bar 501, which comprises semipolar III-nitride-based semiconductor layers, has a periodic concavity and convexity shape after being removed from the substrate 101. By being separated in this way, the bar 501 can avoid excess and non-uniform pressure. Consequently, the bar 501 can be divided from the substrate 101 without being broken into a short size. It is much preferable that the backside of the bar 501 comprised of semipolar III-nitride-based semiconductor layers has in-plane at least as part of the back surface. The method could be adopted for different semipolar planes in the same way, which is industrially important.

Cleaving at a Separate Area of the c-Plane

The present invention also attempted this removal method on a c-plane GaII substrate 101, as shown in FIG. 10(a).

As shown in FIGS. 10(b) and 10(c), the growth restrict mask 102 and opening areas 103 are designed as shown in FIG. 11 without a separating region. The length of the long side of the opening area 103 is set to be 15 mm.

The image of FIG. 10(d), which is enlarged in FIG. 10(e), shows the surface of the substrate 101 after removing the bar 501 of the device 110. The c-plane is one of the cleavage planes in bulk GaN, so the separate area on the back side of the bar 501 was very smooth. This shows that this removing method can also be used with a c-plane GaN substrate 101.

Figure 2H:
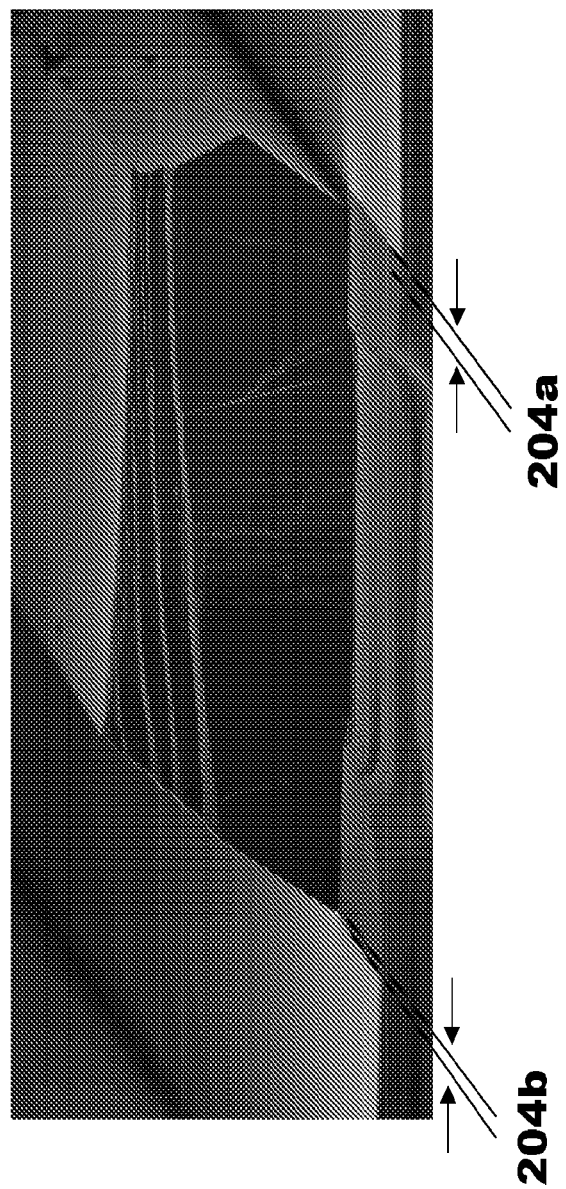
Figure 2I:
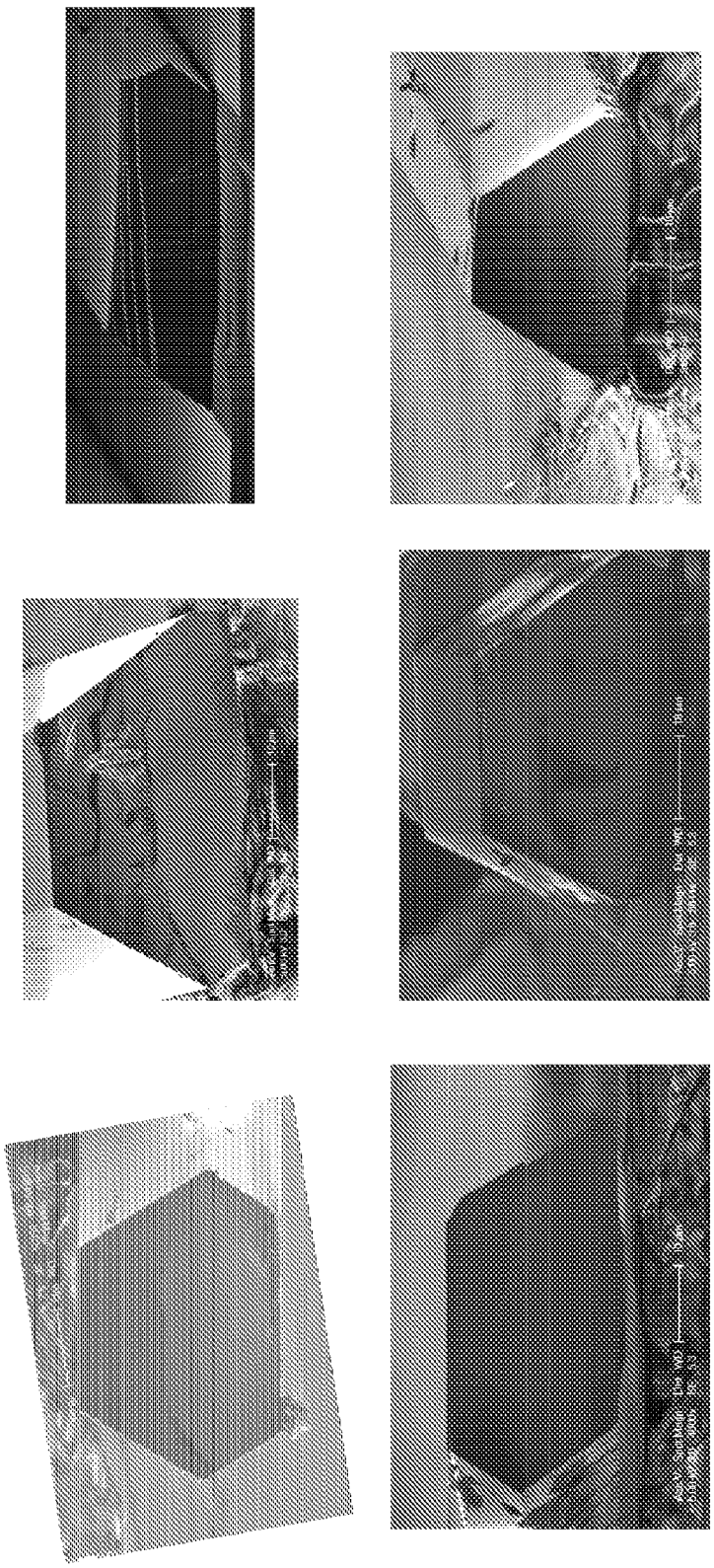

Avoiding the Connection of the Bottom Layer and the Island-Like Semiconductor Layer In the present invention, the growth restrict mask 102 is removed before growing the III-nitride device layers 106. The thickness of the ELO III-nitride layer 105 is at least over 4 μm. The height of the ELO III-nitride layer 105 prevents the bottom layer 111 from growing. In addition, the side facet of the ELO III-nitride layer 105 makes a gap between the island-like III-nitride semiconductor layers 109 and the bottom layer 111 at a bottom area 204, as shown in images (1), (2), and (3) of FIG. 2(e), This area 204 is very low growth rate due to the reduction of the supply gases. FIGS. 2(f), 2(g) and 2(h) illustrate the width of the bottom area 204a 204b depends on the shape of the side facet of the ELO III-nitride layer 105. Various shapes of the side facet of the ELO III-nitride layers 105 are shown in FIG. 2(i).

However, as shown in FIGS. 2(g) and 2(h), the III-nitride device layers 106 generally have two types of shapes for the side facets illustrated by 204a and 204b.

In one example, as illustrated by 204a, the edge of the side facet is located outside a bottom edge of the III-nitride device layers 106. The distance between the bottom edge and the edge of the side facet is the bottom area 204a.

In another example, as illustrated by 204b, an edge of the side facet is located against the bottom edge of the III-nitride device layers 106. The distance between the bottom edge and the edge of the side facet is the bottom area 204b.

The first example may be preferred, as the additional distance makes a connection between the bottom layer 111 and the island-like III-nitride semiconductor layers 109 more likely to be avoided.

Step 8: Fabricating an n-electrode at the Separate Area of the Device

Steps 8, 9, 10 and 11 are illustrated by FIGS. 15(a), 15(b), 15(c), 15(d), 15(e), 15(f) and 16.

Figure 15A:
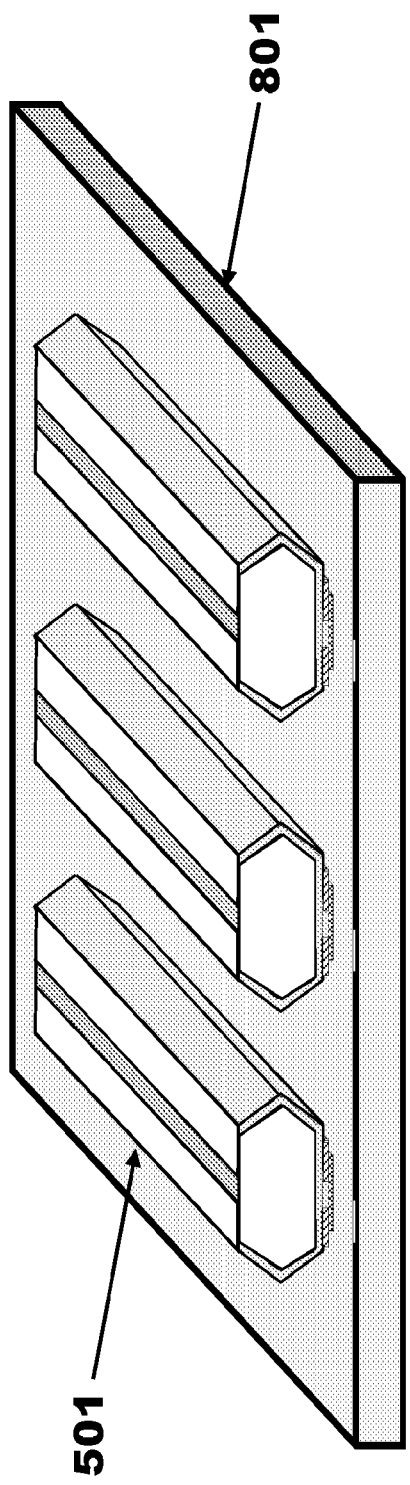
FIGS. 15(a), 15(b), 15(c), 15(d), 15(e) and 15(f) illustrate a procedure for dividing a bar of a device after the bar has been removed from a substrate using a polymer tape, according to one embodiment of the present invention.

After removing the bar 501 from the substrate 101, the bar 501 remains attached to the polymer film 801, which is shown with the bar 501 positioned in an upside-down manner on the film 801, as shown in FIG. 15(a).

Figure 15B:
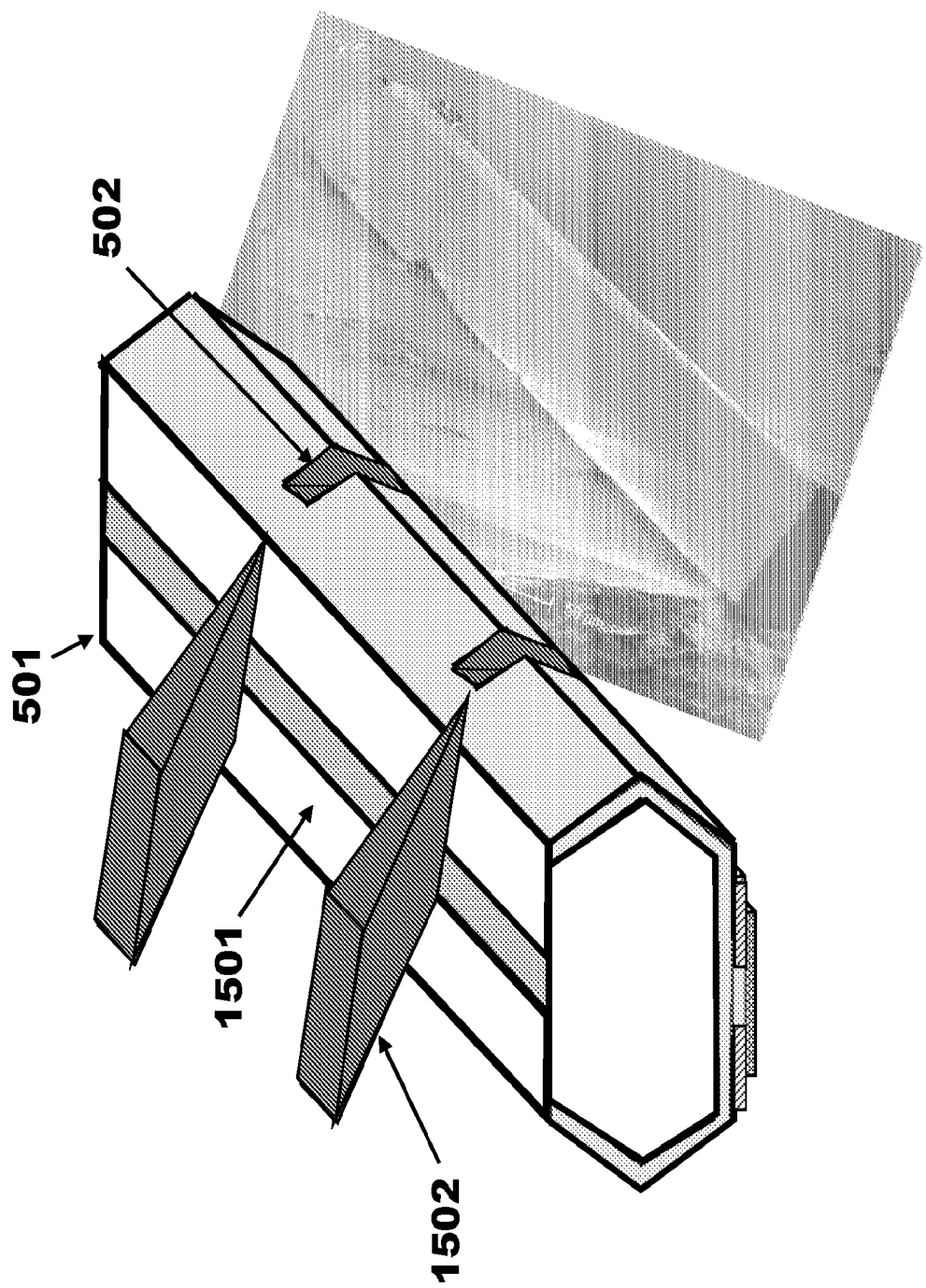

FIG. 15(b) shows the back side of the bar 501, both as a schematic and an SEM image, which has a separate area 1501 between the dividing support regions 502. The separate area 1501 contacts the substrate 101, or the underlying layer directly, but is not on the growth restrict mask 102. Cleaving blades 1502 are used at the dividing support regions 502.

Figure 15C:
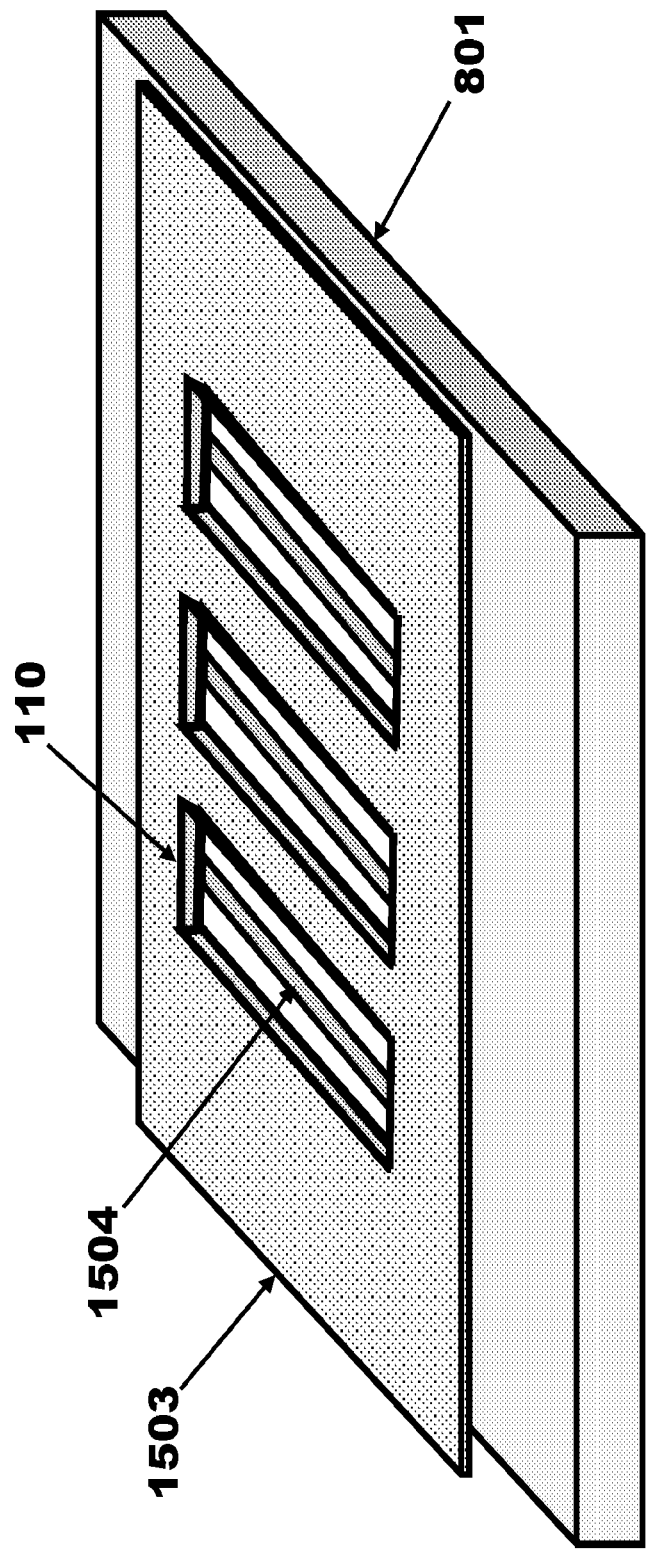

Then, as shown in FIG. 15(c), a metal mask 1503 can be used to dispose an n-electrode 1504 on the back side of the device 110.

In the case of forming the n-electrode 1504 of back side of the bar 501 after removing the bar 501 from the substrate 101, the n-electrode 1504 is preferably formed on the separate area 1501. This separate area 1501 is kept in a good surface condition for the n-electrode 1504 to obtain low contact resistivity. The present invention keeps this area 1501 clean until removing the island-like III-nitride semiconductor layers 109.

The n-electrode 1504 also can be disposed on the top surface of the bar 501, which is the same surface made for a p-electrode 408.

Typically, the n-electrode 1504 is comprised of the following materials: Ti, Hf, Cr, Al, Mo, W, Au. For example, the n-electrode may be comprised of Ti—Al—Pt—Au (with a thickness of 30-100-30-500 nm), but is not limited to those materials. The deposition of these materials may be performed by electron beam evaporation, sputter, thermal heat evaporation, etc.

Step 9: Breaking the Bar into Separate Devices

Figure 15D:
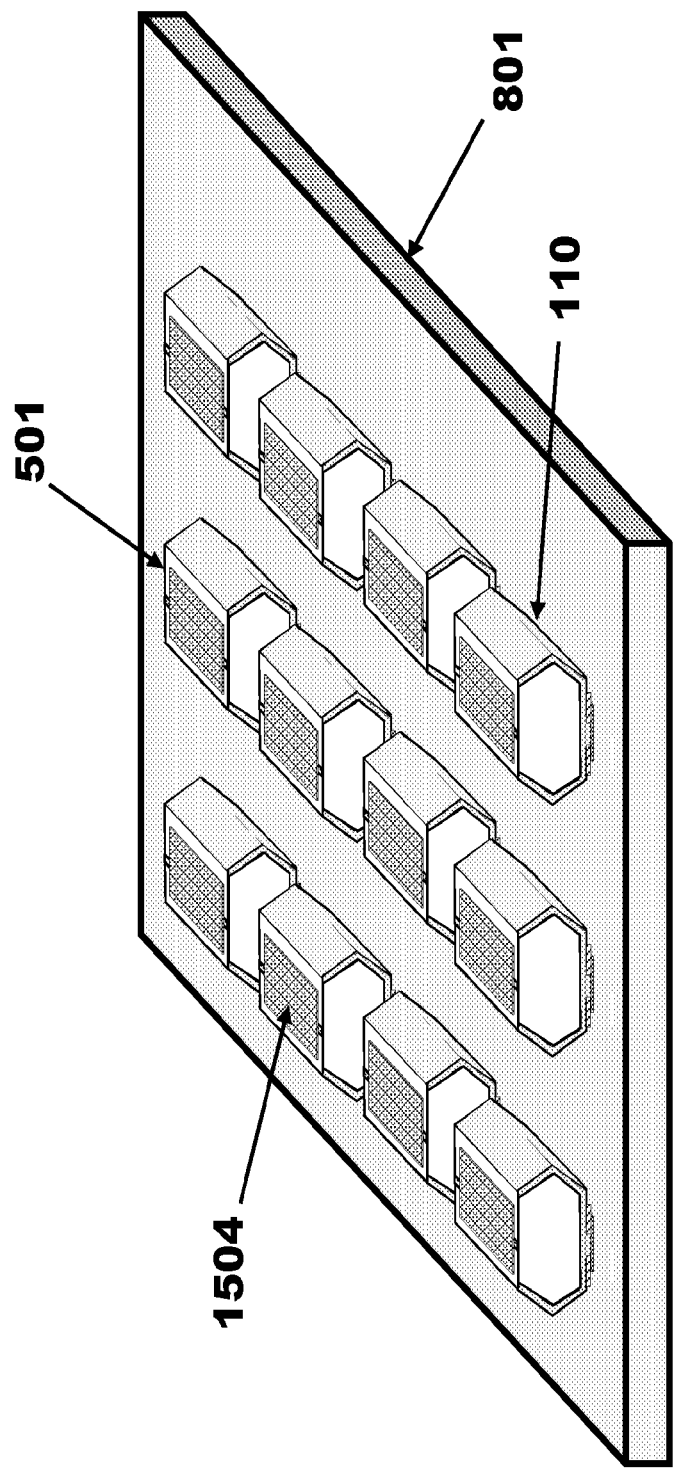

After disposing the n-electrode 1504 in Step 8, each bar 501 is divided into a plurality of devices 110, as shown in FIG. 15(d). The dividing support region 502 helps divide the bar 501 into the devices 110, as shown in FIG. 15(b). A breaking method can be used, as well as other conventional methods, but it is not limited to these methods. It is preferable that the cleaving blade 1502 contact a side of the bar 501 which is not formed by the dividing support region 502, at the position of the dividing support region 502.

As shown in FIG. 15(d), it is possible that multiple bars 501 laterally disposed are both cleaved and broken into separate devices 110 at dividing support regions 502. Moreover, it is also possible that multiple bars 501 both laterally and longitudinally disposed are cleaved at dividing support regions 502. Further, the dividing support regions 502 may be disposed on both sides or one side of the bars 501.

Step 10: Mounting the Device on a Heat Sink Plate

Figure 15E:
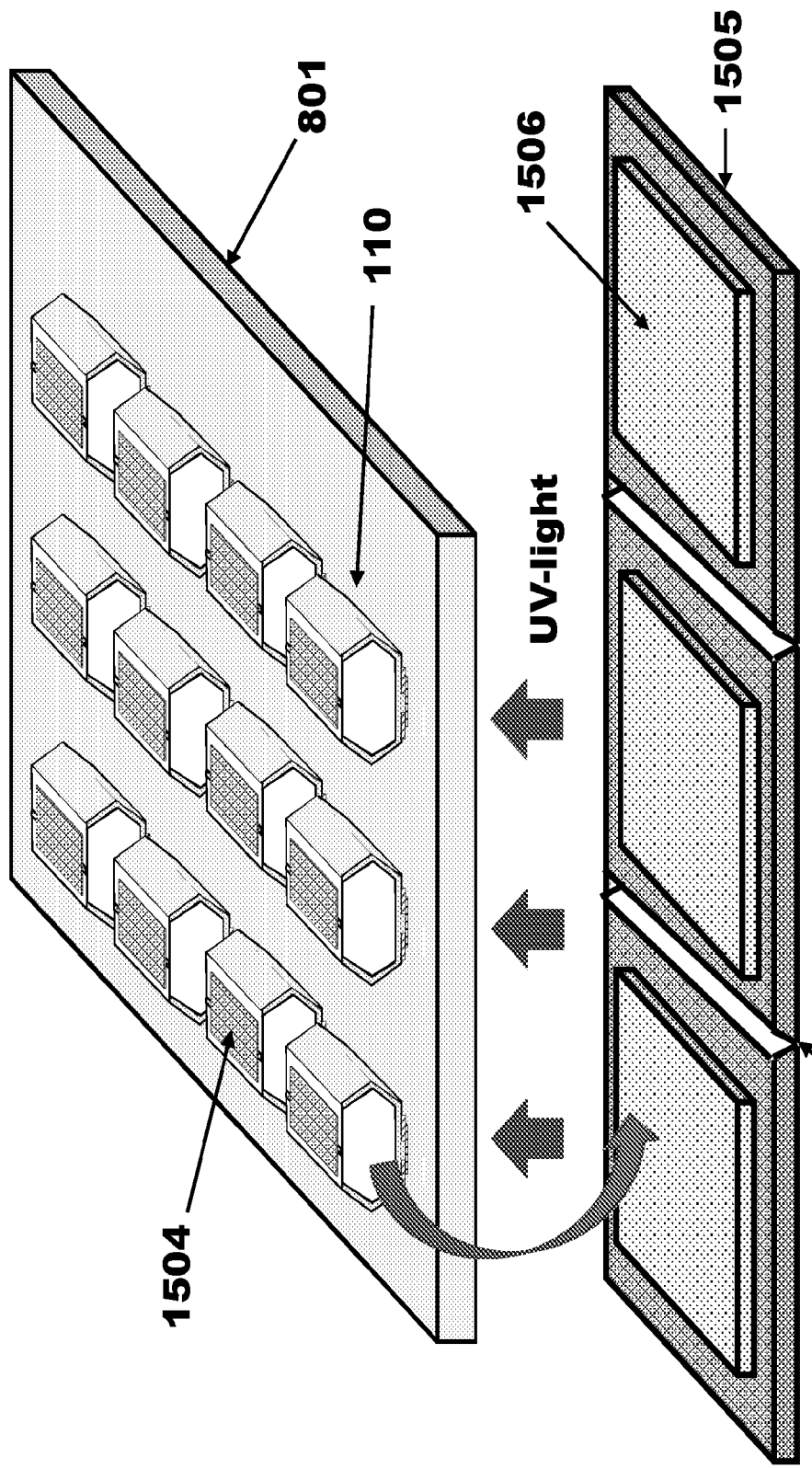

After Step 9, the divided bar 501 is still on the polymer film 801. In one embodiment, the polymer film 801 is an ultraviolet (UV) light-sensitive dicing tape that is exposed to UV light, which can reduce the adhesive strength of the film 801, as shown in FIG. 15(e). This makes it easy to remove the devices 110 from the film 801.

Figure 15F:
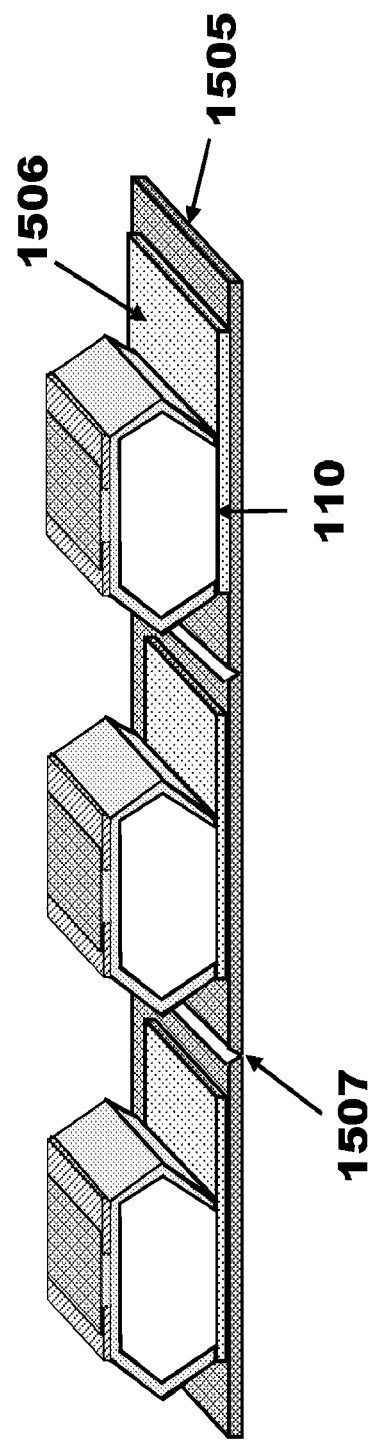

In this step, a heat sink plate 1505 comprised of AlN is prepared. An Au—Sn solder 1506 is disposed on the heat sink plate 1505, the heat sink plate 1505 is heated over the melting temperature of the solder 1506, and the devices 110 on the polymer film 801 are bonded to the heat sink plate 1505 using the Au—Sn solder 1506. The devices 110 can be mounted on the heat sink plate 1505 in two ways: (1) n-electrode 1504 side down or (2) p-electrode 408 side down. FIG. 15(f) shows the devices 110 mounted to the heat sink plate 1505 using the solder 1506 with the n-electrode 1504 side down. Trenches 1507 in the heat sink plate 1505 separate the devices 110, wherein the trenches 1507 are used to divide the heat sink plate 1505, as described in more detail below.

Step 11: Coating the Facets of the Device

Step 11 comprises coating the facets 504 of the device 110. While a laser diode device 110 is lasing, the light in the device 110 that penetrates through the facets 504 of the device 110 to the outside of the device 110 is absorbed by non-radiative recombination centers at the facets 504, so that the facet temperature increases continuously. Consequently, the temperature increase can lead to catastrophic optical damage (COD) of the facet 504.

A facet 504 coating can reduce the non-radiative recombination center. Preventing the COD, it is necessary to coat the facet using dielectric layers, such as AlN, AlON, $Al_2O_3$, SiN, SiON, $SiO_2$, $ZrO_2$, $TiO_2$, $Ta_2O_5$ and the like. Generally, the coating film is a multilayer structure comprised of the above materials. The structure and thickness of the layers is determined by a predetermined reflectivity.

Figure 16:
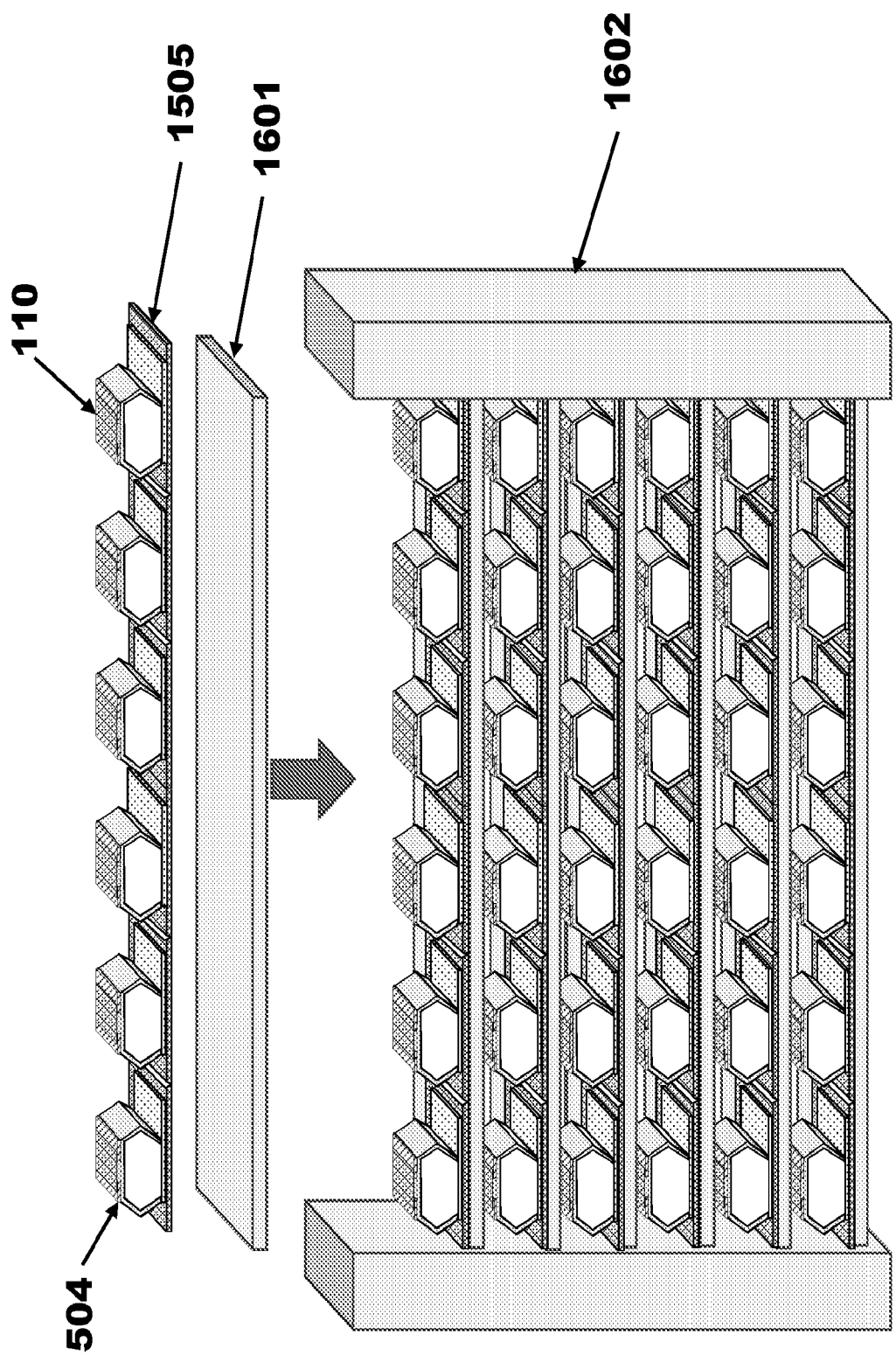
FIG. 16 illustrates a coating process for facets of devices, according to one embodiment of the present invention.

In the present invention, the bar 501 of device 110 may have been divided in Step 9 to obtain cleaved facets 504 for multiple devices 110. As a result, the method of coating the facets 504 needs to be performed on multiple devices 110 at the same time, in an easy manner. In one embodiment, the devices 110 are mounted in a horizontally offset manner on the heat sink plate 1505, e.g., towards one side of the heat sink plate 1505, as shown in FIG. 15(f). Then, as shown in FIG. 16, the devices 110 and the heat sink plate 1505 are placed on a spacer plate 1601, and a plurality of spacer plates 1601 are stored in a coating holder 1602.

Note that it is not always necessary to use a spacer plate 1601, and the heat sink plate 1505 could be used alone. Alternatively, the heat sink plate 1505 could be mounted on another bar or plate, that is then placed on the spacer plate 1601.

By doing this, the facets 504 of a number of devices 110 can be coated simultaneously. In one embodiment, the facet 504 coating is conducted at least two times once for the front facet 504 of the devices 110 and once for the rear facet 504 of the devices 110. The length of the heat sink plate 1505 may be dimensioned to be about the cavity length of the laser diode device 110, which makes it quick and easy to perform the facet 504 coating twice.

Once the spacer plate 1601 is set in the coating holder 1602, both facets 504 of the devices 110 can be coated without setting the spacer plate 1601 in the coating holder 1602 again. In one embodiment, a first coating is performed on a front facet 504 which emits the laser light, and a second coating is performed on the rear facet 504 which reflects the laser light. The coating holder 1602 is reversed before the second coating in the facility that deposits the coating film. This reduces the lead time of the process substantially.

Step 12: Dividing the Heat Sink Plate

Figures 17A, 17B:
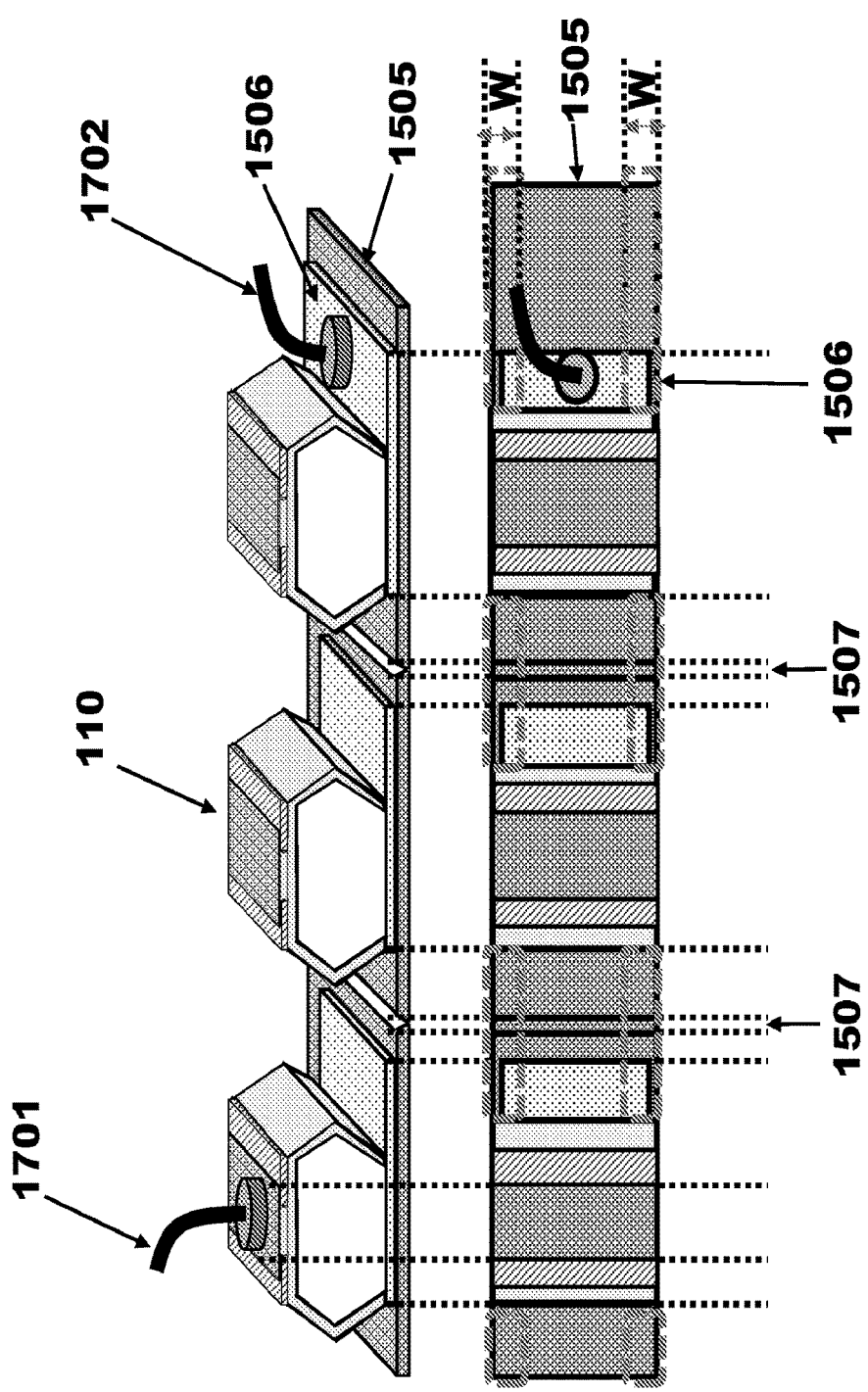
FIGS. 17(a), 17(b) and 17(c) illustrate how wire bonds are attached to devices, and a heat sink plate is divided at trenches, according to one embodiment of the present invention.
Figure 17C:
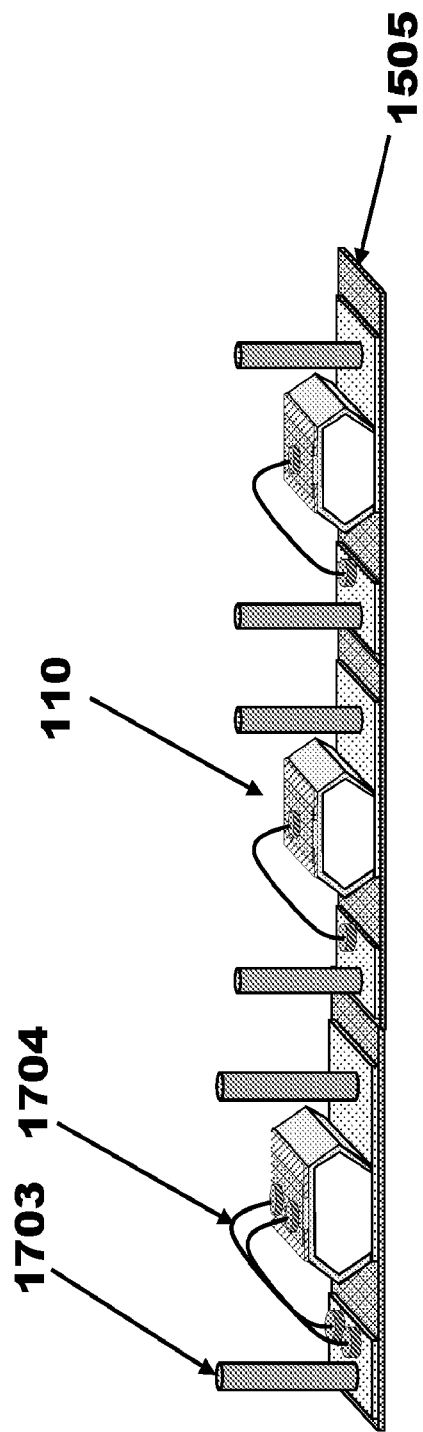

In this step, as shown in FIG. 17(a), wire bonds 1701 and 1702 are attached to the devices 110, and then the heat sink plate 1505 is divided at the trenches 1507, for example, between one or more of the devices 110. FIG. 17(b) is a top view of FIG. 17(a) that shows the relative placements and positions of the devices 110, trenches 1507 and bonds 1701, 1702. FIG. 17(c) shows the use of separated probes 1703 and wire bonds 1704 with the devices 110.

FIGS. 18(a) and 18(b) further show how the heat sink plate 1505 is divided to separate the devices 110, which may occur before or after the attachment of the wire bonds 1701, 1702. By doing this, it is easy to separate the devices 110 after the coating process has been completed.

Step 13: Screening the Device

This step distinguishes between defective and non-defective devices 110. First, various characteristics of the devices 110 are checked under a given condition; such as output power, voltage, current, resistivity, FFP (Far Field Pattern), slope-efficiency and the like. At this point, the devices 110 have already been mounted on the heat sink plate 1505, so it is easy to check these characteristics.

A testing apparatus 1901 is shown in FIGS. 19(a) and 19(b), wherein the p-electrode 408 and the solder 1506, which has an electrical continuity to the n-electrode 1504, are contacted by probes 1902, 1903. Then, non-defective devices 110 can be selected and screened by an aging test (life time test).

In one embodiment, it is preferable that testing apparatus 1901 comprise a box or other container, so that an aging test may be conducted with the devices 110 sealed in a dry air or nitrogen atmosphere. Moreover, a heat stage 1904 may be sed to maintain the temperature of the devices 110 during the screening test, for example, 60 degrees, 80 degrees and so on. Photodetectors 1905 may be used to measure light output power 1906, which identifies non-defective devices 110 that have a constant output power, or which identifies defective devices 110.

In particularly, in the case of a III-nitride-based semiconductor laser diode device 110, it is known that when a laser diode is oscillated in a moisture-containing atmosphere, it deteriorates. This deterioration is caused by moisture and siloxane in the air, so the III-nitride-based semiconductor laser diode device 110 needs to be sealed in dry air during the aging test.

Figure 20:
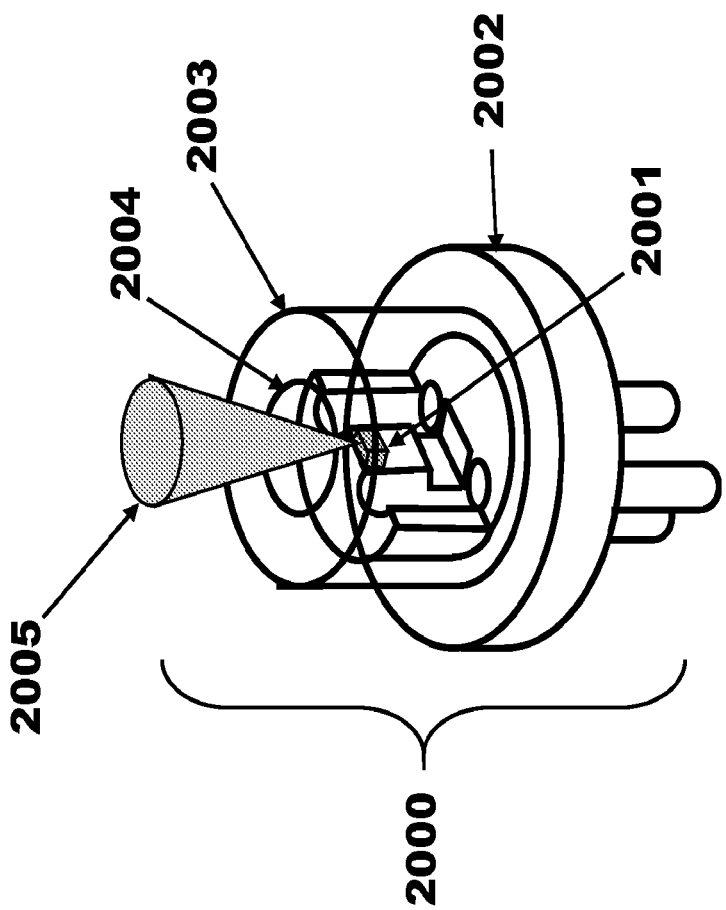
FIG. 20 illustrates a TO-can package for a laser diode device, according to one embodiment of the present invention.

Consequently, as shown in FIG. 20, when a III-nitride-based laser diode 2000 is shipped from a manufacturer, the chip 2001 itself is mounted on a stem 2002 and sealed in a dry air atmosphere using a TO-can package 2003, wherein the package 2003 includes a window 2004 for light emission.

Generally speaking, the screening or ageing tests are conducted before shipping, in order to screen out defective devices 110. For example, the screening condition is conducted according to the specifications of the laser diode device HO, such as a high temperature and a high power.

Moreover, an aging test may be conducted with the device 110 mounted on/into the package 2000, with the package 2000 sealed in dry air and/or dry nitrogen before screening. This fact makes the flexibility of packaging and mounting of the laser device restrictive.

In the prior art, if defective production happens, the defective products are discarded in the whole TO-CAN package 2000, which is a great loss for production. This makes it difficult to reduce the production costs of laser diode devices 110. There is a need to detect defective devices 110 at an earlier step.

In the present invention, coating the facets 504 of the device 110 using a heat sink plate 1505, on which can be mounted a plurality of the devices 110 in a low horizontal position and then, after the coating process, dividing the heat sink plate 1505 and the devices 110 using the trenches 1507, allows the devices 110, with the sub-mount of the heat sink plate 1505, to be checked in the screening test in a dry air or nitrogen atmosphere.

When doing the screening test, the devices 110 already has two contacts, namely the p-electrode 408 and the solder 1506 on the heat sink plate 1505, or in the case of flip-chip bonding, the n-electrode 1504 and the solder 1506 on the heat sink plate 1505. Moreover, the present invention can select defective products using the screening test, when the device 110 is only comprised of the chip and the sub-mount. Therefore, in the case of discarding the defective products, the present invention can reduce the loss more than the prior art, which has great value.

In the case of screening of high-power laser diode devices 110, it may be preferable that the heat sink plate 1505 has two parts of solder 1506 disposed without electrical continuity. One part of solder 1506 is connected to the p-electrode 408 with a wire (not shown), and another part of solder 1506 is connected to the n-electrode 1504 with a wire (not shown). Moreover, it may be preferable that the p-electrode 408 and n-electrode 1504 are connected by two or more wires to the solder parts 1506, for example, as shown in FIG. 17(c), which shows the p-electrode 408 connected by two or more wires 1704 to the solder 1506. In this way, the probes 1703 for applying current to the device 110 can avoid contacting the p-electrode 808 (or n-electrode 1504) directly, which, in the case of screening of a high-power laser diode, is critical. Specifically, the probes 1703 could break the contacted parts, in particular, in the case of applying a high current density.

Step 14: Mounting the Devices on/into the Packages

Figure 21:
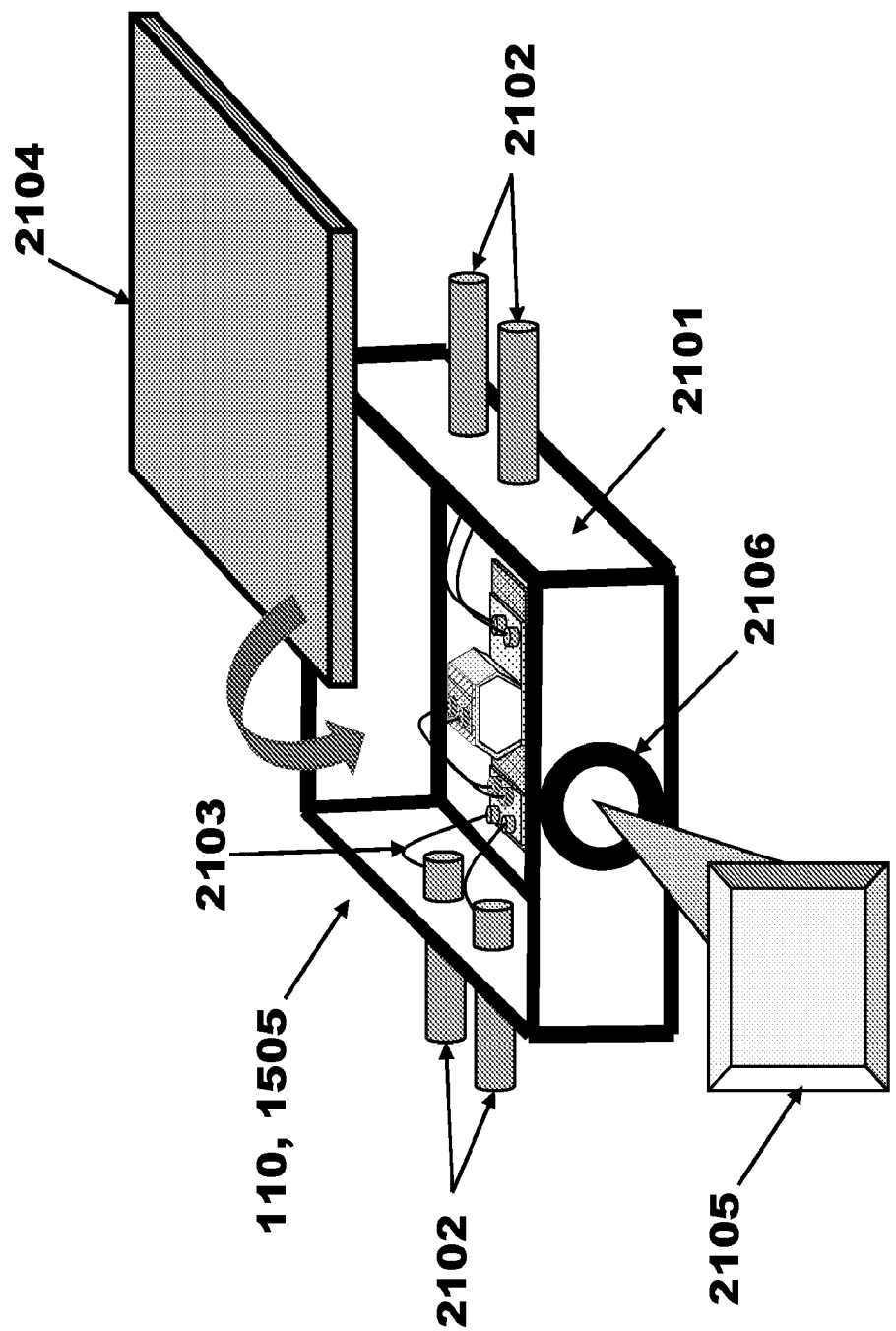
FIG. 21 illustrates a package for a device, including a heat sink plate, according to one embodiment of the present invention.

In this step, as shown in FIG. 21, the device 110 (including the heat sink plate 1505) may be mounted in a package 2101 using solder or another metal to bond the device 110 at the bottom of the package 2101. Pins 2102 of the package 2101 are connected to the device 110 by wires 2103. By doing this, current from an external power supply can be applied to the device 110.

This is more preferable than bonding between the package 2101 and the heat sink plate 1505 using a metal, such as Au—Au, Au—In, etc. This method requires a flatness at the surface of package 2101 and at the back side of the heat sink plate 1505. However, without the solder, this configuration accomplishes a high thermal conductivity and low temperature bonding, which are big advantages for the device process.

Thereafter, a lid 2104 may enclose the package 2101. Moreover, a phosphor 2105 can be set outside and/or inside the package 2101, with a window 2106 allow the light emission to exit the package 2101. By doing this, the package 2101 can be used as a light bulb or a head light of an automobile.

As set forth herein, these processes provide improved methods for obtaining a laser diode device 110. In addition, once the device 110 is removed from the substrate 101, the substrate 101 can be recycled a number of times. This accomplishes the goals of eco-friendly production and low-cost modules. These devices 110 may be utilized as lighting devices, such as light bulbs, data storage equipment, optical communications equipment, such as Li-Fi, etc.

It is difficult to package with a plurality of different types of laser devices 110 in one package 2101. However, this method can overcome this issue, due to being able to perform an aging test without the packaging. Therefore, it is easy to mount the different types of devices 110 in one package 2101.

Fabricating an LED Device

In the case of fabricating an LED device, the same process may be used until Step 5. This discussion explains briefly how to make two types of LEDs. A type 1 LED has two electrodes (a p-electrode and an n-electrode) on one side of the chip, whereas a type 2 LED has an electrode on opposite sides of chip.

First, in the case of the type 1 LED, the p-electrode and n-electrode are formed in Step 5 on the top surface of the device. Then, from Steps 6-10 are the same process and Steps 11-13 are omitted. In Step 14, the removed chips are mounted on packages and heat sink plates. The backside surface of the chips, the package and the heat sink plate, are bonded using an Ag paste.

Second, in the case of the type 2 LED, almost the same process is used until Step 5, where an ITO electrode is formed on the p-GaN contact layer. In this case, the method of dividing the bar is same. Moreover, it is preferable that the layer bending region is eliminated.

Definitions of Terms

III-Nitride-Based Substrate

The III-nitride-based substrate 101 may comprise any type of III-nitride-based substrate, as long as a III-nitride-based substrate 101 enables growth of III-nitride-based semiconductor layers 105, 106, 109 through a growth restrict mask 102, any GaN substrate 101 that is sliced on a {0001}, {11-22}, {1-100}, {20-21}, {20-2-1}, {10-11}, {10-1-1} plane, etc., or other plane, from a bulk GaN and AlN crystal can be used.

Hetero-Substrate

Moreover, the present invention can also use a hetero-substrate 101. For example, a GaN template 112 or other III-nitride-based semiconductor layer 112 may be grown on a hetero-substrate 101, such as sapphire, Si, GaAs, SiC, etc., prior to the growth restrict mask 102. The GaN template 112 or other III-nitride-based semiconductor layer 112 is typically grown on the hetero-substrate 101 to a thickness of about 2-6 μm, and then the growth restrict mask 102 is disposed on the GaN template 112 or other III-nitride-based semiconductor layer 112

Growth Restrict Mask

The growth restrict mask 102 comprises a dielectric layer, such as $SiO_2$, SiN, SiON, $Al_2O_3$, AlN, AlON, MgF, $ZrO_2$, etc., or a refractory metal or precious metal, such as W, Mo, Ta, Nb, Rh, Ir, Ru, Os, Pt, etc. The growth restrict mask may be a laminate structure selected from the above materials. It may also be a multiple-stacking layer structure chosen from the above materials.

In one embodiment, the thickness of the growth restrict mask is about 0.05-3 μm. The width of the mask is preferably larger than 20 μm, and more preferably, the width is larger than 40 μm. The growth restrict mask is deposited by sputter, electron beam evaporation, plasma-enhanced chemical vaper deposition (PECVD), ion beam deposition (IBD), etc., but is not limited to those methods.

On an m-plane free standing GaN substrate 101, the growth restrict mask 102 shown in FIGS. 11(a) and 11(b) comprises a plurality of opening areas 103, which are arranged in a first direction parallel to the 11-20 direction of the substrate 101 and a second direction parallel to the 0001 direction of the substrate 101, periodically at intervals p1 and p2, respectively, extending in the second direction. The length a of the opening area 103 is, for example, 200 to 35000 μm; the width b is, for example, 2 to 180 μm; the interval p1 of the opening area 102 is, for example, 20 to 180 μm; and the interval p2 is, for example, 200 to 35000 μm. The width b of the opening area 103 is typically constant in the second direction, but may be changed in the second direction as necessary.

On a c-plane free standing GaN substrate 101, the opening areas 103 are arranged in a first direction parallel to the 11-20 direction of the substrate 101 and a second direction parallel to the 1-100 direction of the substrate 101.

On a semipolar (20-21) or (20-2-1) GaN substrate 101, the opening areas 103 are arranged in a direction parallel to [−1014] and [10-14], respectively.

Alternatively, a hetero-substrate 101 can be used. When a c-plane GaN template 112 is grown on a c-plane sapphire substrate 101, the opening area 103 is in the same direction as the c-plane free-standing GaN substrate; when an m-plane GaN template 112 is grown on an m-plane sapphire substrate 101, the opening area 103 is same direction as the m-plane free-standing GaN substrate 101. By doing this, an m-plane cleaving plane can be used for dividing the bar 501 of the device 110 with the c-plane GaN template 112, and a c-plane cleaving plane can be used for dividing the bar 501 of the device 110 with the m-plane GaN template 112; which is much preferable.

III-Nitride-Based Semiconductor Layers

The ELO III-nitride layers 105, the III-nitride device layers 106 and the island-like III-nitride semiconductor layers 109 can include In, Al and/or B, as well as other impurities, such as Mg, Si, Zn, O, C, H, etc.

The III-nitride device layers 106 generally comprise more than two layers, including at least one layer among an n-type layer, an undoped layer and a p-type layer. The III-nitride device layers 106 specifically comprise a GaN layer, an AlGaN layer, an AlGaInN layer, an InGaN layer, etc. In the case where the device has a plurality of III-nitride-based semiconductor layers, the distance between the island-like III-nitride semiconductor layers 109 adjacent to each other is generally 30 μm or less, and preferably 10 μm or less, but is not limited to these figures. In the semiconductor device, a number of electrodes according to the types of the semiconductor device are disposed at predetermined positions.

Merits of Epitaxial Lateral Overgrowth

The crystallinity of the island-like III-nitride semiconductor layers 109 grown using epitaxial lateral overgrowth (ELO) upon the growth restrict mask 102 from a striped opening are 103 of the growth restrict mask 102 is very high.

Furthermore, two advantages may be obtained using a III-nitride-based substrate 101. One advantage is that a high-quality island-like III-nitride semiconductor layer 109 can be obtained, such as with a very low defects density, as compared to using a sapphire substrate 101.

Another advantage in using a similar or the same material for both the epilayers 105, 106, 109 and the substrate 101, is that it can reduce strain in the epilayers 105, 106, 109. Also, thanks to a similar or the same thermal expansion, the method can reduce the amount of bending of the substrate 101 during epitaxial growth. The effect, as above, is that the production yield can be high, in order to improve the uniformity of temperature.

The use of a hetero-substrate 101, such as sapphire (m-plane, c-plane), $LiAlO_2$, SiC, Si, etc., for the growth of the epilayers 105, 106, 109 is that these substrates 101 are low-cost substrates. This is an important advantage for mass production.

When it comes to the quality of the device 110, the use of a free standing based substrate 101 is more preferable, due to the above reasons. On the other hand, the use of a hetero-substrate 101 makes it easy to remove the III-nitride-based semiconductor layers 105, 106, 109, due to a weaker bonding strength at the cleaving point 807.

Also, when a plurality of island-like III-nitride semiconductor layers 109 are grown, these layers 109 are separated from each other, that is, are formed in isolation, so tensile stress or compressive stress generated in each of the island-like III-nitride semiconductor layers 109 is limited within the layers 109, and the effect of the tensile stress or compressive stress does not fall upon other III-nitride-based semiconductor layers.

Also, as the growth restrict mask 102 and the ELO III-nitride layers 105 are not bonded chemically, the stress in the ELO III-nitride layers 105 can be relaxed by a slide caused at the interface between the growth restrict mask 102 and the ELO III-nitride layers 105.

Also, the existence of gaps between each the island-like III-nitride semiconductor layers 109, as shown by no-growth region 104, results in the substrate 101 having rows of a plurality of island-like III-nitride semiconductor layers 109, which provides flexibility, and the substrate 101 is easily deformed when external force is applied and can be bent.

Therefore, even if a slight warpage, curvature, or deformation occurs in the substrate 101, this can be easily corrected by a small external force, which avoids the occurrence of cracks. As a result, the handling of substrates 101 by vacuum chucking is possible, which makes the manufacturing process of the semiconductor devices 110 more easily carried out.

As explained, island-like III-nitride semiconductor layers 109 made of high quality semiconductor crystal can be grown by suppressing the curvature of the substrate 101, and further, even when the III-nitride-based semiconductor layers 105, 106, 109 are very thick, occurrences of cracks, etc., can be suppressed, and thereby a large area semiconductor device 110 can be easily realized.

Flat Surface Region

The flat surface region 107 is between the layer bending regions 108. Furthermore, the flat surface region 107 is on the growth restrict mask 102 region.

Fabrication of the semiconductor device is mainly performed on the flat surface region 107. The width of the flat surface region 107 is preferably at least 5 μm, and more preferably is 10 μm or more. The flat surface region 107 has a high uniformity of thickness for each of the semiconductor layers in the flat surface region 107.

It is not a problem if the fabrication of the semiconductor device is partly formed on the layer bending region 108. More preferably, the layer at the bending layer region 108 is removed by etching. For example, it is better that at least a part of active layer in the layer bending region 108 is removed using an etching process, such as dry etching or wet etching.

In the case where the semiconductor device is comprised of the island-like III-nitride semiconductor layers 109, the distance between the island-like III-nitride semiconductor layers 109 adjacent to each other is generally 20 μm or less, and preferably 5 μm or less, but is not limited to these values. The distance between the island-like III-nitride semiconductor layers 109 is the width of a no growth region 104.

Layer Bending Region

Figure 22A:
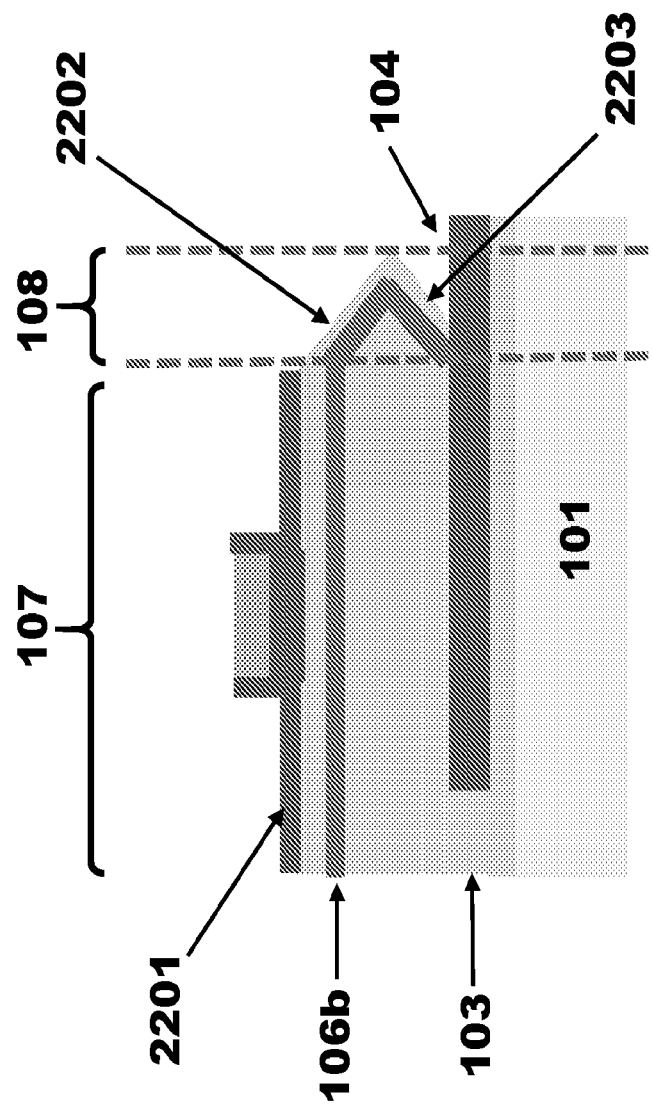
FIGS. 22(a) and 22(b) illustrate the etching of layers in layer bending regions, according to one embodiment of the present invention.
Figure 22B:
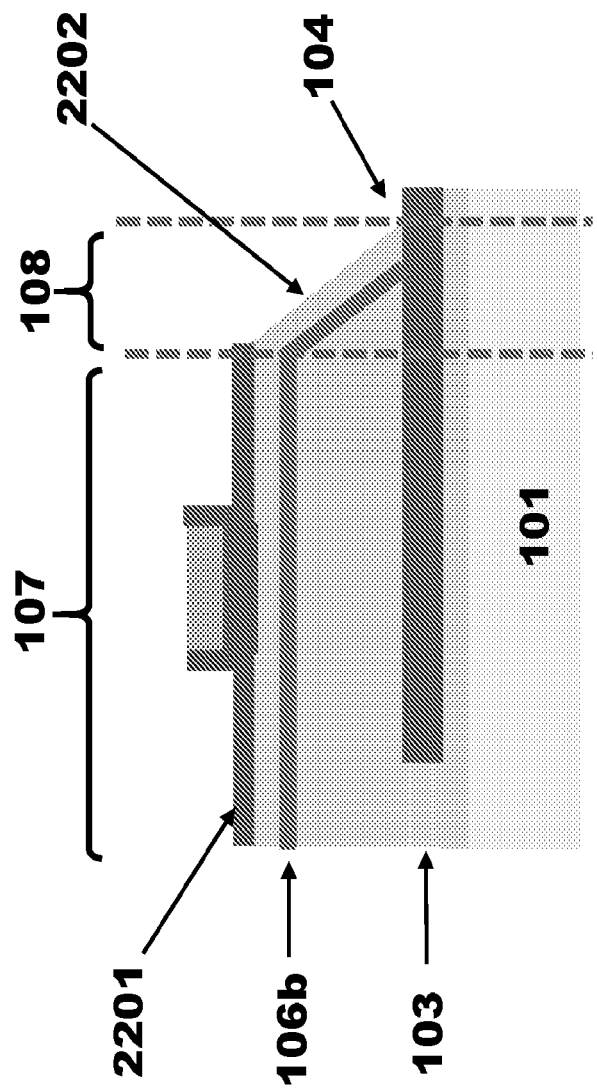

FIGS. 22(*a*) and 22(*b*) illustrate how a bended active region 2201 may remain in the device 110. The definition of a layer bending region 108 is the region outside of the bended active region 2201 including the bended active region 2201.

If a non-polar or semi-polar substrate is used, the island-like III-nitride semiconductor layers 109 have two or three facets at one side of island-like III-nitride semiconductor layers 109. The first facet is the main area for forming a ridge structure, while the second and third facets include the layer bending region 108.

If the layer bending region 108 that includes an active layer remains in the LED chip, a portion of the emitted light from the active layer is reabsorbed. As a result, it is preferable to remove at least a part of the active layer in the layer bending region 108 by etching.

If the layer bending region 108 that includes an active layer remains in the LD chip, the laser mode may be affected by the layer bending region 108 due to a low refractive index (e.g., an InGaN layer). As a result, it is preferable to remove at least a part of the active layer in the layer bending region 108 by etching. Two etchings may be performed, wherein a first etching removes the active layer in the second facet region before removing epi-layers from the substrate 101, and a second etching removes the active layers in the third facet region after removing epi-layers from the substrate 101.

The emitting region is a current injection region. In the case of a laser diode, the emitting region is a ridge structure. In the case of an LED, the emitting region is the region for forming a p-contact electrode.

For both the LD and LED, the edge of the emitting region should be at least 1 μm or more from the edge of the layer bending region, and more preferably 5 μm.

From another point of view, an epitaxial layer of the flat area 107 except for the opening area 103 has a lesser defect density than an epitaxial layer of the opening area 103. Therefore, it is more preferable that the ridge stripe structure should be formed in the flat area 107 including on a wing region.

Semiconductor Device

The semiconductor device 110 is, for example, a light-emitting diode, a laser diode, a Schottky diode, a photodiode, a transistor, etc., but is not limited to these devices. This invention is particularly useful for micro-LEDs and laser diodes, such as edge-emitting lasers and vertical cavity surface-emitting lasers (VCSELs). This invention is especially useful for a semiconductor laser which has cleaved facets.

Polymer Film

Figures 23A, 23B:
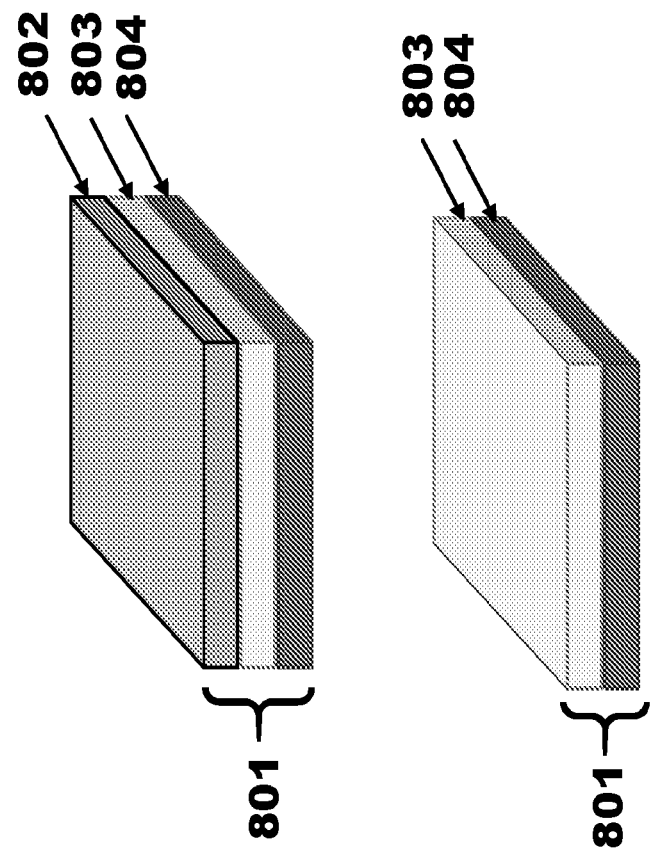
FIGS. 23(a) and 23(b) illustrate the structure of a polymer film, according to one embodiment of the present invention.

The polymer film 801 is used in order to remove the island-like III-nitride semiconductor layers 109 from the III-nitride-based substrate 101 or the GaN template 112 used with the hetero-substrate 101. In the present invention, dicing tape, including UV-sensitive dicing tape, which are commercially sold, can be used as the polymer film 801. For example, the structure of the polymer film 801 may comprise triple layers 802, 803, 804 or double layers 803, 804, as shown in in FIGS. 23(a) and 23(b), but is not limited to those examples. The base film 802 material, for example, having a thickness of about 80 μm, may be made of polyvinyl chloride (PVC). The backing film 804 material, for example, having a thickness of about 38 μm, may be made of polyethylene terephthalate (P.E.T.). The adhesive layer 803, for example, having a thickness of about 15 μm, may be made of acrylic UV-sensitive adhesive.

When the polymer film 801 is a UV-sensitive dicing tape and is exposed to UV light, the stickiness of the film 801 is drastically reduced. After removing the island-like III-nitride semiconductor layers 109 from the substrate 101, the polymer film 801 is exposed by the UV light, which makes it is easy to remove.

Heat Sink Plate

As noted above, the removed bar 501 may be transferred to a heat sink plate 1505, Which may be AlN, SiC, Si, Cu, CuW, and the like. As shown in FIG. 15(e), the solder 1506 for bonding, which may be Au—Sn, Su—Ag—Cu, Ag paste, and the like, is disposed on the heat sink plate 1505. Then, an n-electrode 1504 or p-electrode 408 is bonded to the solder 1506. The devices 110 can also be flip-chip bonded to the heat sink plate 1505.

In the case of bonding LED devices 110 to the heat sink plate 1505, the size of the heat sink plate 1505 does not matter, and it can be designed as desired.

In the case of bonding laser diode devices 110 to the heat sink plate 1505, it is preferable that the length of the heat sink plate 1505 be the same or shorter than the length of the laser diode devices 110 for the facet 504 coating process, wherein the length of the laser diode devices 110 is almost the same as the length of the laser cavity. By doing this, it is easy to coat both facets 504 of the laser cavity. If the length of the heat sink plate 1505 is longer than laser cavity, then the heat sink plate 1505 may prevent uniform coating of the laser facets 504.

Long Width Heat Sink Plate

A long width for the heat sink plate 1505 makes the process of fabricating the laser device 110 more productive. As shown in FIG. 16, the heat sink plate 1505 is placed on a spacer plate 1601, and then both are stacked with other heat sink plates 1505 and spacer plates 1601 in the coating holder 1602 for coating a plurality of the devices 110 at the same time. Consequently, a single coating process can coat a large number of devices 110.

Heat Sink Plate with Trenches

It is preferable that the heat sink plate 1505 have trenches 1507 for dividing the devices 110 as shown in FIGS. 15(e) and 15(f). This structure is useful after the facet 504 coating process, where the heat sink plate 1505 is divided into one or more devices 110, for example, single devices 110 or an array of devices 110. After dividing the heat sink plate 1505, the devices 110 can be fabricated into packages or modules, such as lighting modules. The trenches 1507 in the heat sink plate 1505 guide the division into the devices 110. The trenches 1507 can be formed by a wet etching method and mechanically processed before the device 110 is mounted on the heat sink plate 1505. For example, if the heat sink plate 1505 is made of silicon, wet etching can be used to form the trenches 1507. Using the trenches 1507 in this manner, reduces the lead time of the process.

Heat Sink Plate with Solder

It is preferable that the length of the solder 1506 be shorter than the device 110 length on the heat sink plate 1505, as shown in FIG. 15(f). This prevents any wraparound of the solder 1506 to the facets 504, Which could cause a deterioration of the device 110 characteristics. In particular, wraparound should be avoided for flip-chip mounting.

As shown in FIG. 17(b), after the coating process, the heat sink plate 1505 has wraparound areas, which are the areas surrounded by the dashed lines. The wraparound area has a width W of about 10-20 μm. The coating film will have coated these areas. It is also difficult to avoid coating the solder 1506 with the coating film. Generally, the coating film is selected from one or more dielectric materials, which is why this area does not have conductivity. This is a problem for both conductivity and adhesiveness when a wire 1702 is bonded to the solder 1506. Therefore, it is preferable that the wire 1702 be placed to avoid the wraparound area. At least, the place of wire bond 1702 should be about 25 μm away from the edge of the heat sink plate 1505.

ALTERNATIVE EMBODIMENTS

First Embodiment

Figure 24A:
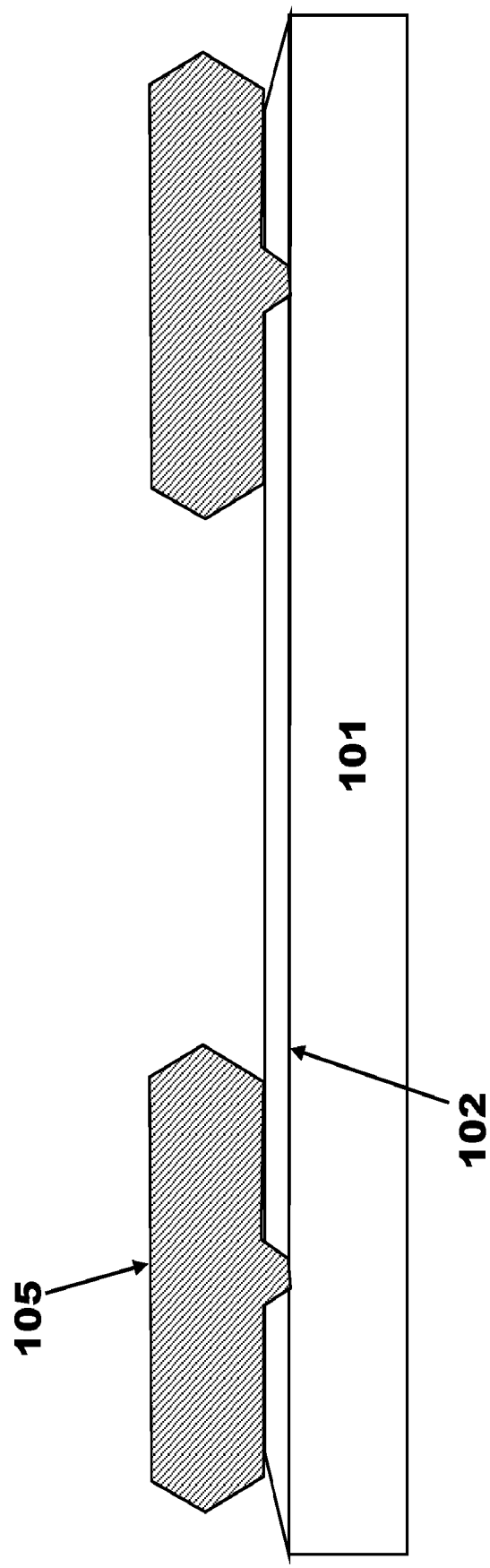
Figure 24C:
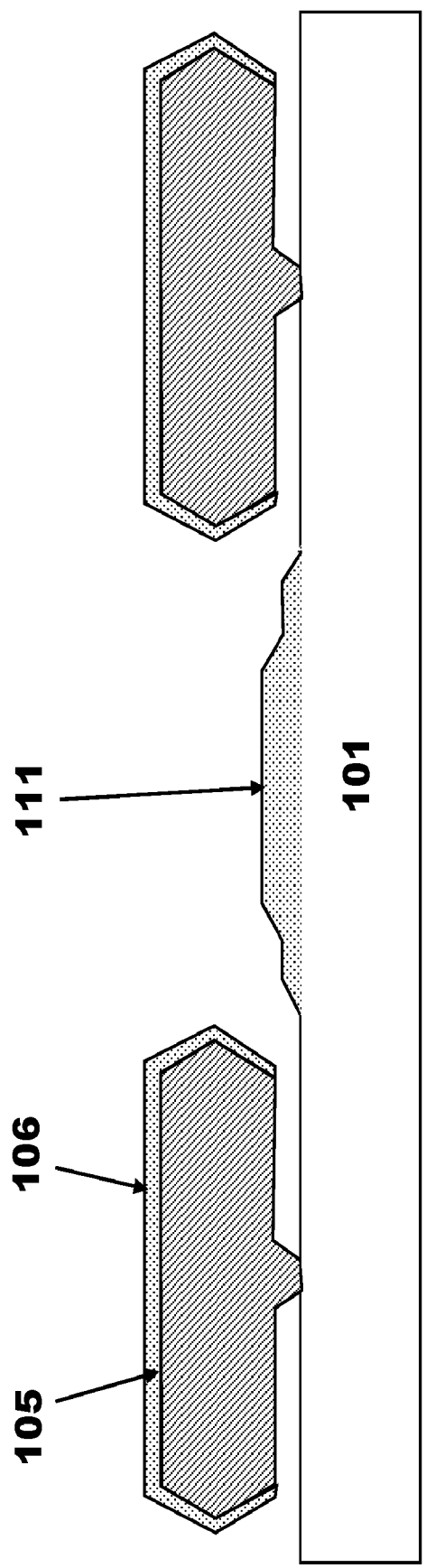

An III-nitride-based semiconductor device and a method for manufacturing thereof, according to a first embodiment is illustrated in FIGS. 24(a), 24(b) and 24(c).

In the first embodiment, a base substrate 101 is first provided, and a growth restrict mask 102 that has a plurality of striped opening areas 103 is formed on the substrate 101. In this embodiment, the base substrate 101 is an m-plane substrate made of III-nitride-based semiconductor, which has a mis-cut orientation toward c-axis with −1.0 degree.

The ELO III-nitride layers 105 are grown on or above the substrate 101 and the growth restrict mask 102. As shown in FIG. 3(a), and image (4) of FIG. 3(h), the ELO III-nitride layers 105 are largely uniform with a very smooth surface.

After the growth of the ELO III-nitride layers 105, the substrate 101 with the layers 105 is removed from the MOCVD reactor in order to remove the growth restrict mask 102. The growth restrict mask 102 is removed by a wet etching, using an etchant such as HF, BHF, etc., as shown in FIG. 24(b).

Then, the III-nitride device layers 106 are grown on the substrate 101, as shown in FIG. 24(c). At this time, the III-nitride device layers 106 are grown on both the ELO III-nitride layers 105 and an exposed portion of the substrate 101 where the growth restrict mask 102 has been removed, resulting in the bottom layer 111.

After the III-nitride device layers 106 are grown, sometimes there is deterioration of the surface morphology, as shown in image (1) of FIG. 2(c). It was generally thought that deviations from optimized growth conditions caused the deterioration of the surface roughness. The III-nitride device layers 106 are comprised many layers which are active layers or waveguide layers, so that it is difficult to control the growth conditions. Notably, the excess supply gases to the side facet of the island-like III-nitride semiconductor layers 109 make this deviation from the optimized conditions worse. The optimization of the growth condition avoiding the deterioration of the surface roughness is difficult due to the gases from the side facet.

Therefore, in the present invention, to decrease the effect of the gases at the side facets of the ELO III-nitride layers 105, the growth restrict mask 102 is removed before growing the III-nitride device layers 106, at least before the active layer. By doing this, the gases at the side facets of the ELO III-nitride layers 105 are consumed at the exposed area of the substrate 101 where the growth restrict mask 102 has been removed before reaching the side facets of the ELO III-nitride layers 105, which avoids supplying excess gases to the side facets.

By doing this, in-plane distribution in terms of the p-type layer thickness improves, which can increase a yield of the mass production. For example, the fluctuation of the p-type layer affects the characteristics of the resulting laser diode. Generally, when forming the laser diode's ridge structure, part of the p-type layer is etched until above the active layer by dry etching method. If there is a fluctuation of the p-type layer's thickness, the remaining p-type layer's thickness after the dry etching also has a fluctuation. This affects the characteristics of the laser diode. Reducing the fluctuations of the p-type layer's thickness is a very important to improve the yields in mass production.

Moreover, removing the growth restrict mask 102 until finishing the growth of the p-type layer at least is also preferable in that it avoids incorporation of decomposed atoms, such as Silicon and Oxygen, from the growth restrict mask 102, which compensates the dopant of the p-type layer.

Thereafter, the island-like III-nitride semiconductor layers 109 can be processed by the remaining ones of Steps 1-14 as set forth above, in order to obtain a laser diode device.

Second Embodiment

A second embodiment is almost the same as the first embodiment except for the etching of the growth restrict mask 102. In the first embodiment, the growth restrict mask 102 is totally removed, as shown in FIGS. 24(a) and 24(b). However, the growth restrict mask 102 also can also be at least partly removed, as shown in FIGS. 25(a), 25(b), 25(c) and 25(d), as well as FIGS. 26(a) and 26(b). In both cases, the surface of the island-like III-nitride semiconductor layers 109 is substantially flattened.

Figure 25A:
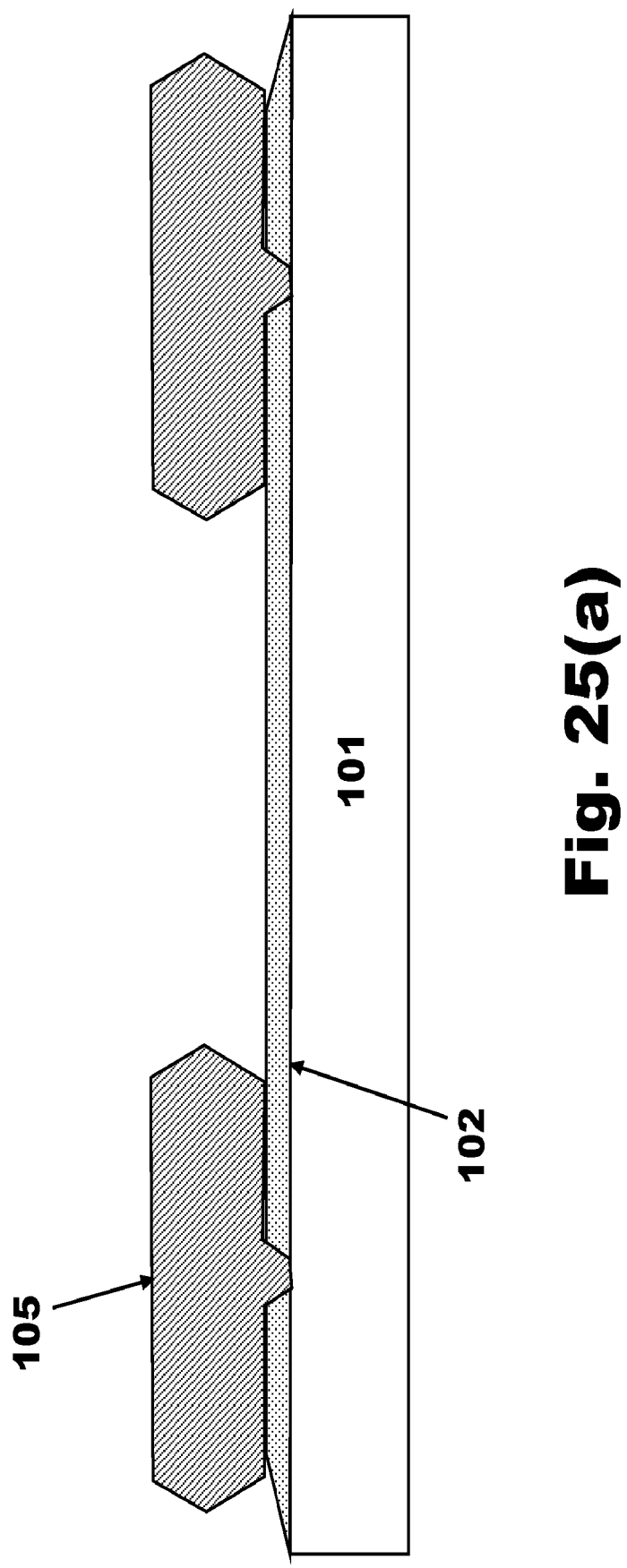
FIGS. 25(a), 25(b), 25(c) and 25(d) are schematics illustrating growth with and without the growth restrict mask, according to embodiments of the present invention.
Figure 25B:
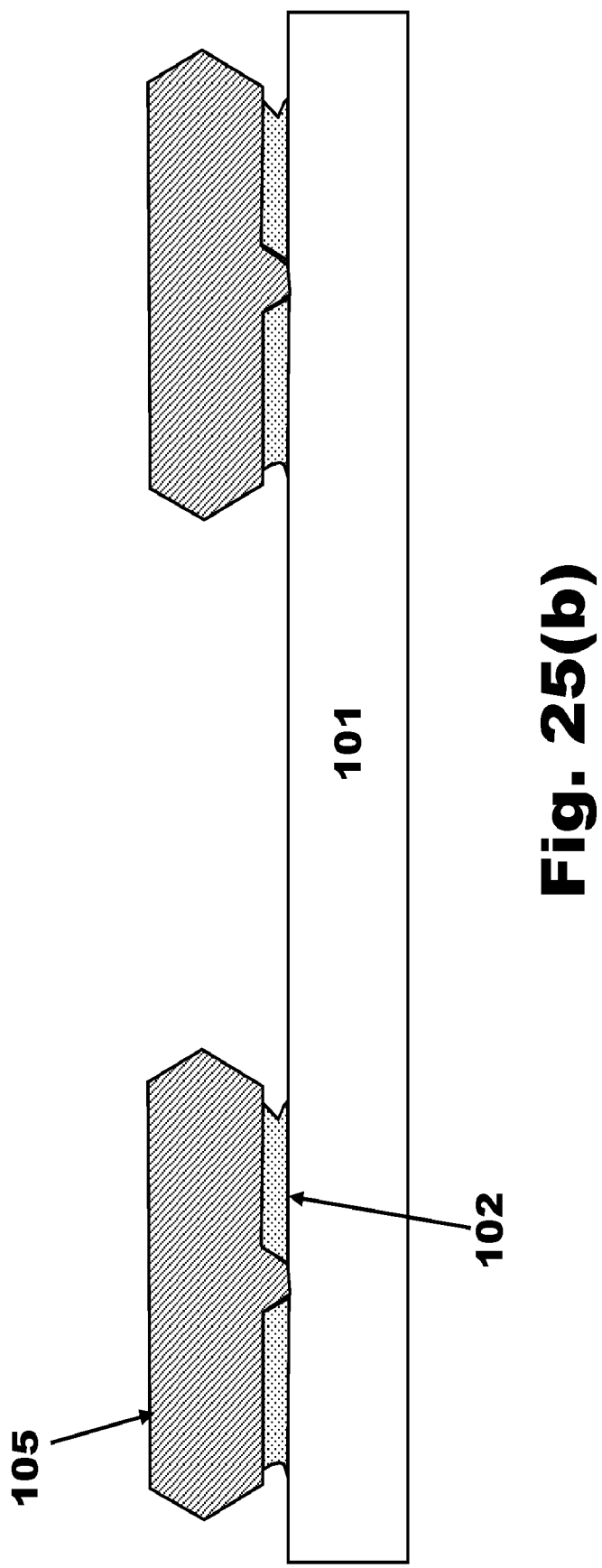
Figure 25C:
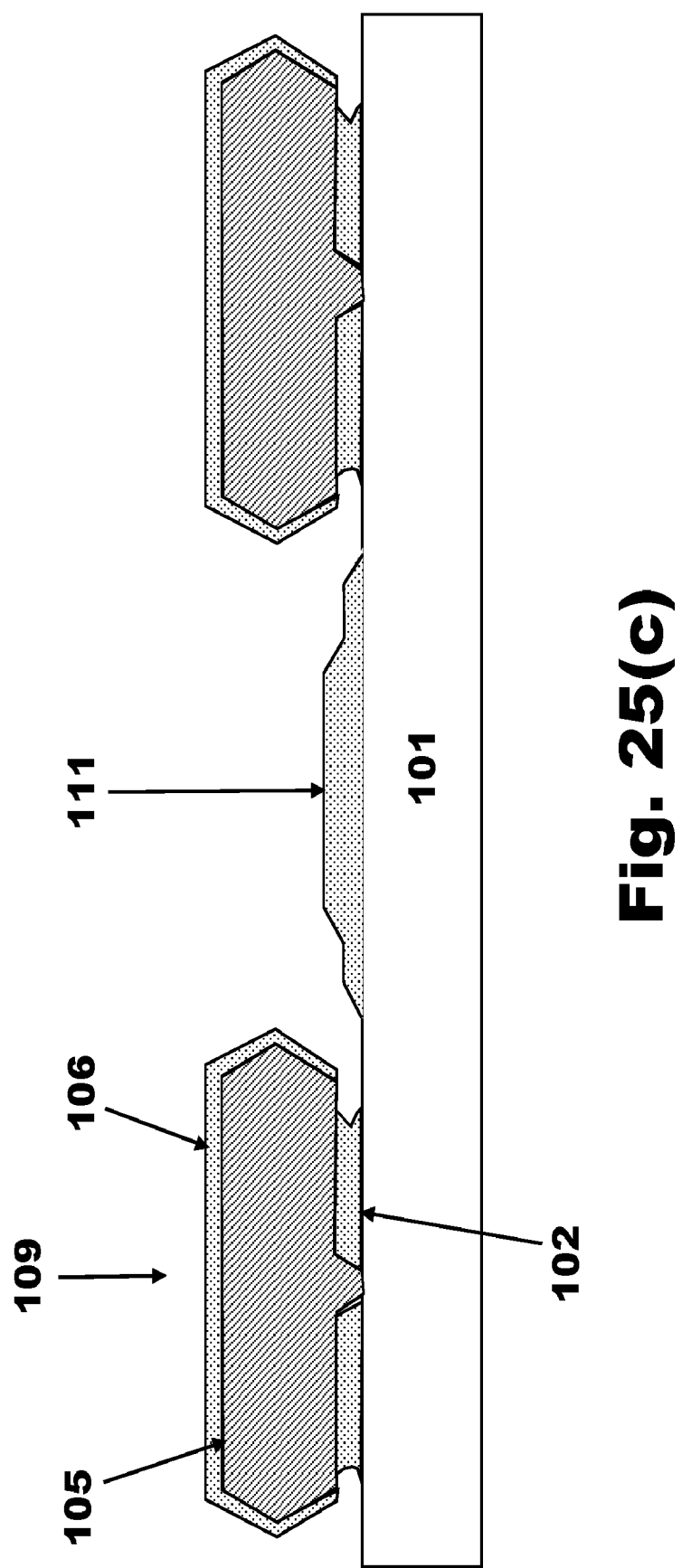
Figure 25D:
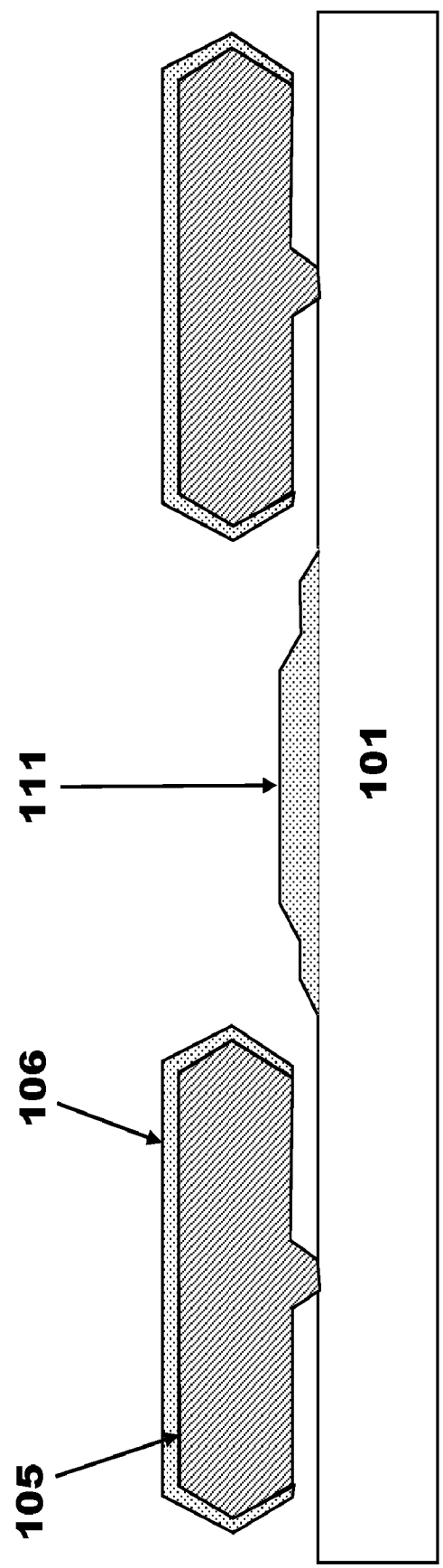

As shown in FIGS. 25(a), 25(b) and 25(c), at least a portion of the growth restrict mask 102 is removed by wet etching. Preferably, the portion of the growth restrict mask 102 not covered by the island-like III-nitride semiconductor layers 109 is removed, while the portion of the growth restrict mask 102 covered by the island-like III-nitride semiconductor layers 109 remains. As in the first embodiment, the removal of the growth restrict mask 102 decreases the excess gases supply to the side facets of the island-like III-nitride semiconductor layers 109. Moreover, the portion of the growth restrict mask 102 remaining under the ELO III-nitride layers 105 is useful when removing the island-like III-nitride semiconductor layers 109 from the substrate 101. As shown in FIG. 25(d), the remaining portion of the growth restrict mask 102 may be removed by wet etching after growth of the III-nitride device layers 106.

Figure 26A:
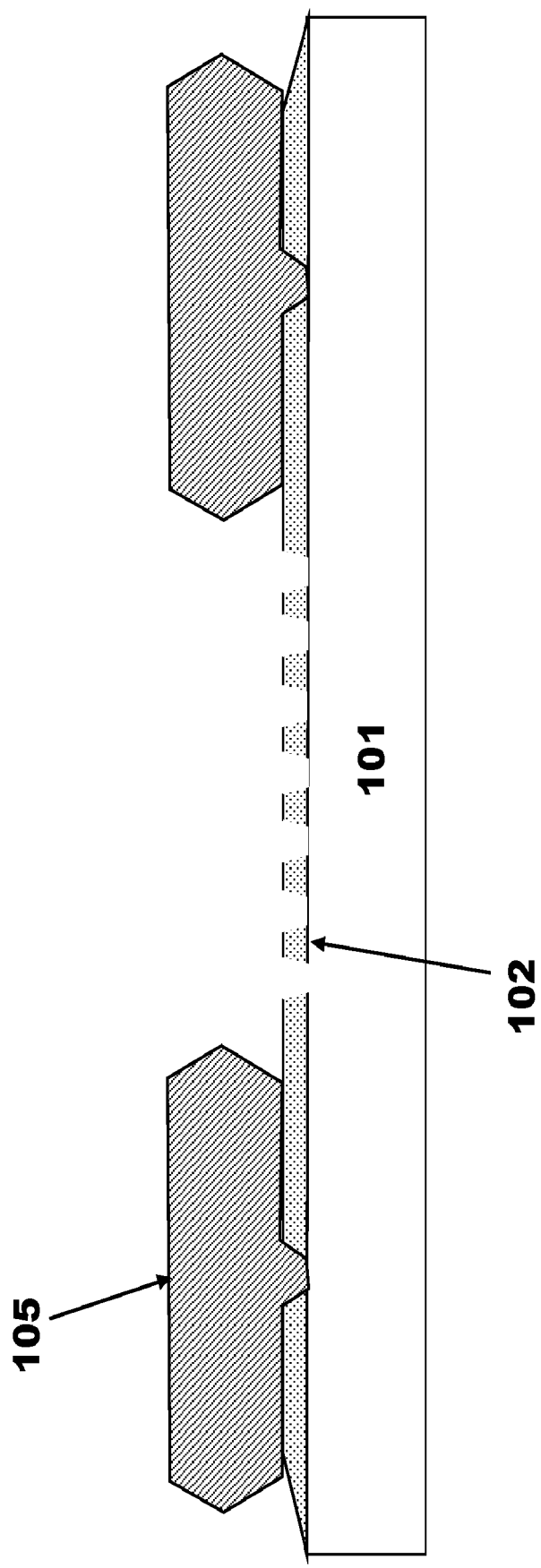
FIGS. 26(a) and 26(b) are schematics illustrating growth with and without the growth restrict mask, according to embodiments of the present invention.
Figure 26B:
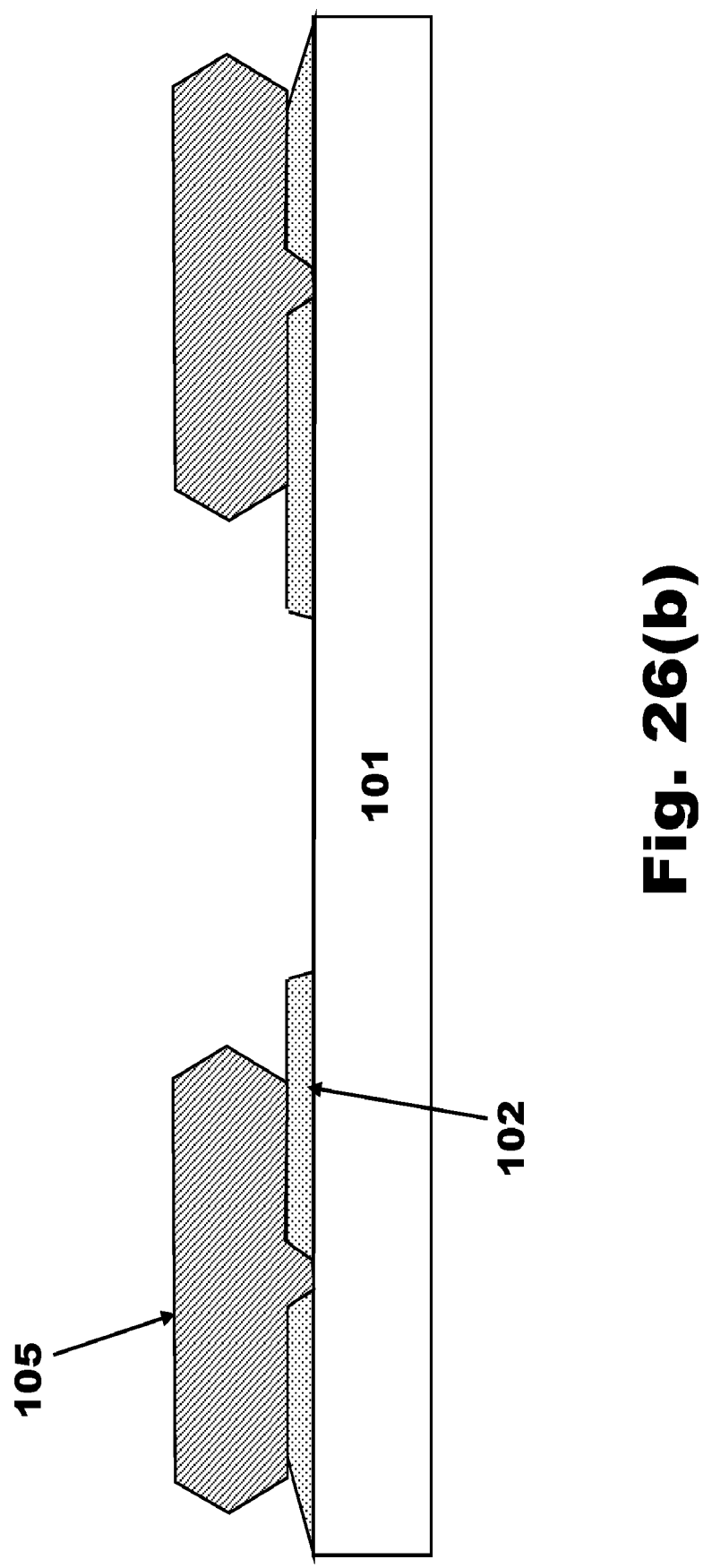

FIGS. 26(a) and 26(b) show alternative embodiments where at least a portion of the growth restrict mask 102 is removed by wet etching. However, in these examples, additional portions of the growth restrict mask 102 not covered by the island-like III-nitride semiconductor layers 109 remain after etching. As with FIGS. 25(a), 25(b), 25(c) and 25(d), the removal of the growth restrict mask 102 decreases the excess gases supply to the side facets of the island-like III-nitride semiconductor layers 109. Moreover, the portion of the growth restrict mask 102 remaining under the ELO III-nitride layers 105 is useful when removing the island-like III-nitride semiconductor layers 109 from the substrate 101.

Figure 27B:
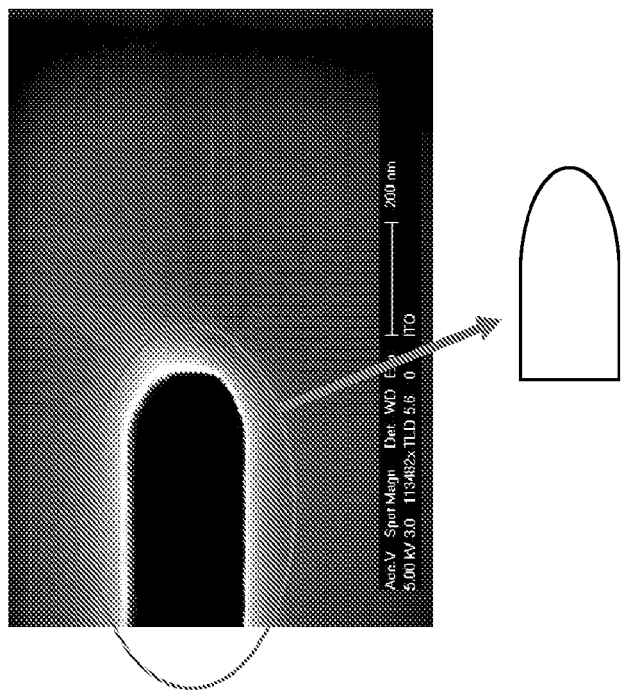
FIGS. 27(a) and 27(b) are SEM images and schematics illustrating the shape of the remaining space after growing ELO III-nitride layers and III-nitride device layers with and without the growth restrict mask, according to embodiments of the present invention.
Figure 27A:
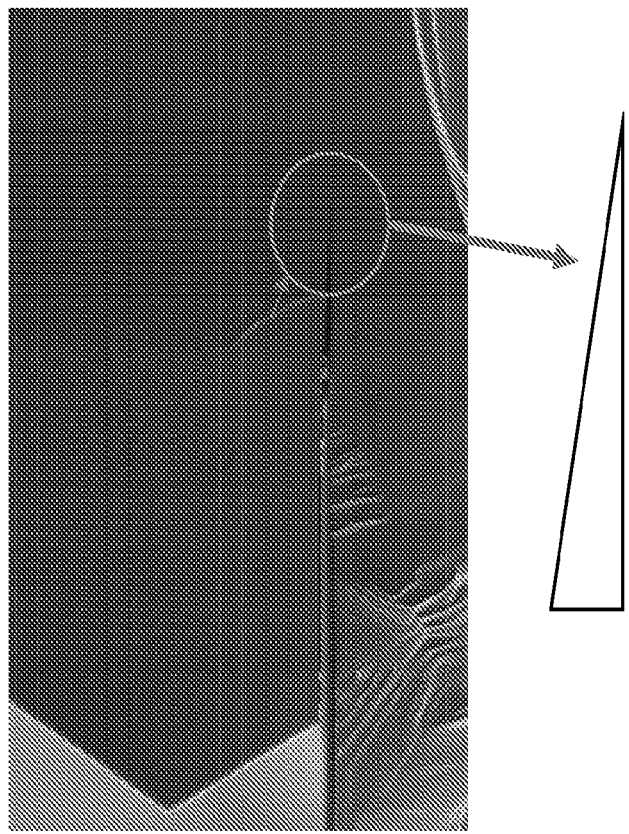

Before the removal of the growth restrict mask 102, the shape at the edge of the growth restrict mask 102 is sharp. Thus, the remaining space after the removal of the mask 102 is the same shape. When the III-nitride device layers 106 are grown, the shape of the remaining space is transformed from sharp to round due to the high-temperature conditions when growing in MOCVD, as shown in FIGS. 27(a) and 27(b). Even if the transformation occurred, it is possible to remove the island-like III-nitride semiconductor layers 109. More preferably, the shape of the remaining space is sharp to determine precisely the breaking point and be easy to remove.

If the growth restrict mask 102 remain, the growth restrict mask 102 prevents the shape at the edge from transforming. As shown in FIG. 25(c), when the III-nitride device layers 106 are grown, part of the growth restrict mask 102 still remains on the substrate 101. However, since the mask 101 only remains under the ELO III-nitride layer 105, the decomposition of the mask 102 is extremely decreased, which reduces the possibility of compensating the p-type layer. The remaining mask 102, which is under the ELO III-nitride layer 105, is removed before the removal of the island-like III-nitride semiconductor layers 109.

Third Embodiment

In a third embodiment, a GaN layer is grown as an ELO III-nitride layer 105 on various off angle substrates 101. FIGS. 3(c) and 3(d) each include three SEM images with various off angles substrates 101 used with the island-like III-nitride semiconductor layers 109. The off-angle orientations range from 0 to +15 degrees in FIG. 3(c) and 0 to −28 degrees in FIG. 3(d), from the m-plane towards the c-plane. The present invention can remove the bar from various off angle substrates 101 without breaking the bars, as shown in FIGS. 9(a) and 9(b).

When using a semi-polar substrate 101, it can obtain the same effect as the first embodiment.

Fourth Embodiment

In a fourth embodiment, a GaN layer is grown as an ELO III-nitride layer 105 on c-plane substrates 101 with two different mis-cut orientation. FIG. 3(e) shows SEM images of two different mis-cut orientation substrates 101 with island-like III-nitride semiconductor layers 109. The island-like III-nitride semiconductor layers 109 have been removed using the method shown in FIGS. 8(a)-8(e).

When using a semi-polar substrate 101, as shown in FIGS. 5(a)-5(d), it can obtain the same effect as the first embodiment.

Fifth Embodiment

In a fifth embodiment, a sapphire substrate is used as the hetero-substrate 101. FIG. 1(b) shows the structure of the island-like III-nitride semiconductor layers 109 on the substrate 101. This structure is almost the same as the first embodiment structure, except for using the sapphire substrate 101 and a buffer layer 112. The buffer layer 112 is generally used with III-nitride-based semiconductor layers grown on a sapphire substrate 101. In this embodiment, the buffer layer 112 includes both a nucleation layer and n-GaN layer or undoped GaN layer. The buffer layer 112 is grown at a low temperature of about 500-700° C. degrees. The n-GaN layer or undoped GaN layer is grown at a higher temperature of about 900-1200° C. degrees. The total thickness is about 1-3 mm. Then, the growth restrict mask 102 is disposed on the n-GaN layer or undoped GaN layer. The rest of process to complete the device is the same as the first embodiment.

On the other hand, it is not necessary to use the buffer layer 112. For example, the growth restrict mask 102 can be disposed on the hetero-substrate 101 directly. After that, the ELO III-nitride layer 105 and/or III-nitride device layers 106 can be grown. In this case, the interface between the hetero-substrate 101 surface and the bottom surface of the ELO III-nitride layer 105 divides easily due to the hetero-interface, which includes a lot of defects.

Sixth Embodiment

Figure 28:
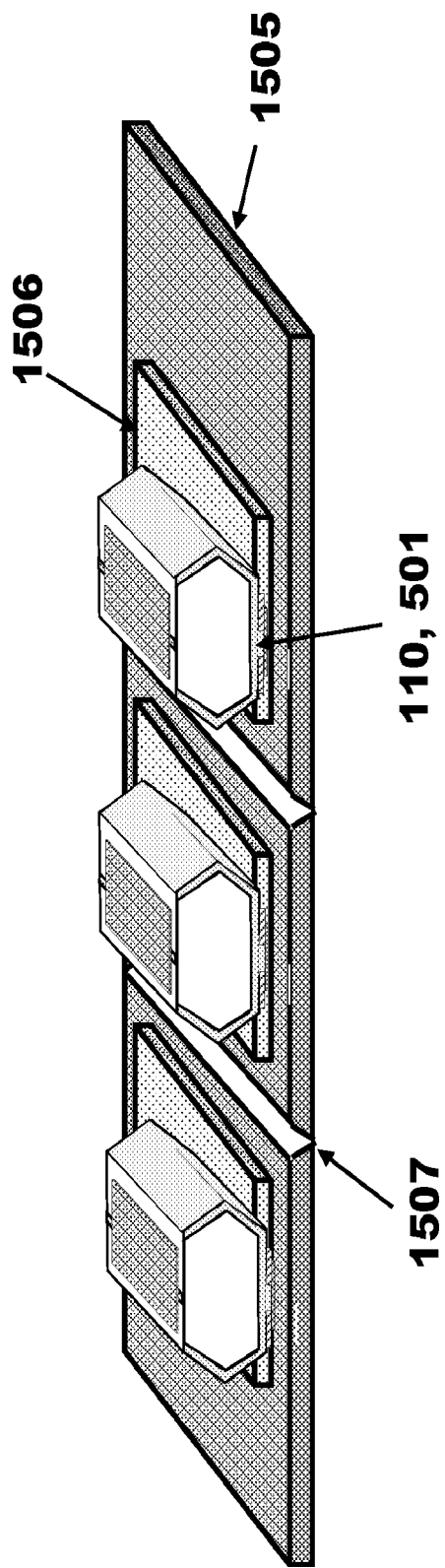
FIG. 28 illustrates devices mounted with their top-side down to the heat sink plate, according to one embodiment of the present invention.

This embodiment mounts devices with their top-side down to the heat sink plate 1505, as shown in FIG. 28. This embodiment can obtain the bar 501 without an edge-growth, such as shown in the bars of FIG. 2(h).

Image (1) of FIG. 2(d) shows the bar with an edge growth having a height. Preferably, the height is 0.3 μm or less. In this invention, an edge growth is defined follow, it locates at the edge of the bar and has a height h over 0.3 μm. The height is defined the difference of the height between the center of the bar 501 and the edge of the bar 501. By doing this, the top of the bar 501 can be flattened. In a junction-down mounting case, as shown in FIG. 28, there can be a wider contact area to the heat sink plate 1505 as compared to the bar 501 having edge-growth.

This can improve thermal conductivity. Moreover, it is much preferable that suppressing the edge growth can make a p-type layer thickness uniform.

Seventh Embodiment

In this embodiment, the width of the mask 102 area is changed. In the image shown in FIG. 29(a), the width of the opening area 103 is 50 μm and the width of the mask 102 area is 100 μm. On the other hand, in the image shown in FIG. 29(b), the width of the opening area 103 is 50 μm and the width of the mask 102 area is 50 μm.

In the image of FIG. 29(a), this contrast almost disappears. It can be seen that the contrast to the surface of the bar is a stripe, which is an edge growth.

A wider width of the mask 102 area would increase the supply of gases to the side facet of the bar, which enhances edge growth. The image of FIG. 29(b) is evidence of this edge growth.

Thus, the edge growth can be controlled by designing the width of the mask 102 area. It is much preferable that the width of the mask 102 area 100 μm or less. Using the present invention, it can reduce the height of the edge growth.

Eighth Embodiment

The aim of this embodiment is to avoid a connection between the substrate 101 and the island-like III-nitride semiconductor layers 109 at the edge of a bar 501 after removing the growth restrict mask 102. When a total thickness of the III-nitride device layers 106 is thicker or the thickness of the growth restrict layer 102 is thinner, a part of the III-nitride device layers 106 can be connected on the substrate 101, as shown in FIGS. 29(a) and 29(b). The p-layer, which is doped with Mg as a p-type dopant, is apt to grow side facets on the bar.

Whether both parts are connecting or not is dependent on the thickness of the III-nitride device layers 106 after the removal of the growth restrict mask 102. Therefore, the growth of the III-nitride device layers 106 can be stopped before connecting the two parts, as shown in the image of FIG. 30(a) and its enlargement in FIG. 30(b). It is more preferable to remove the bar 501 in this manner. The thickness of the p-type layer is preferably less than 1 μm.

Process Steps

Figure 31:
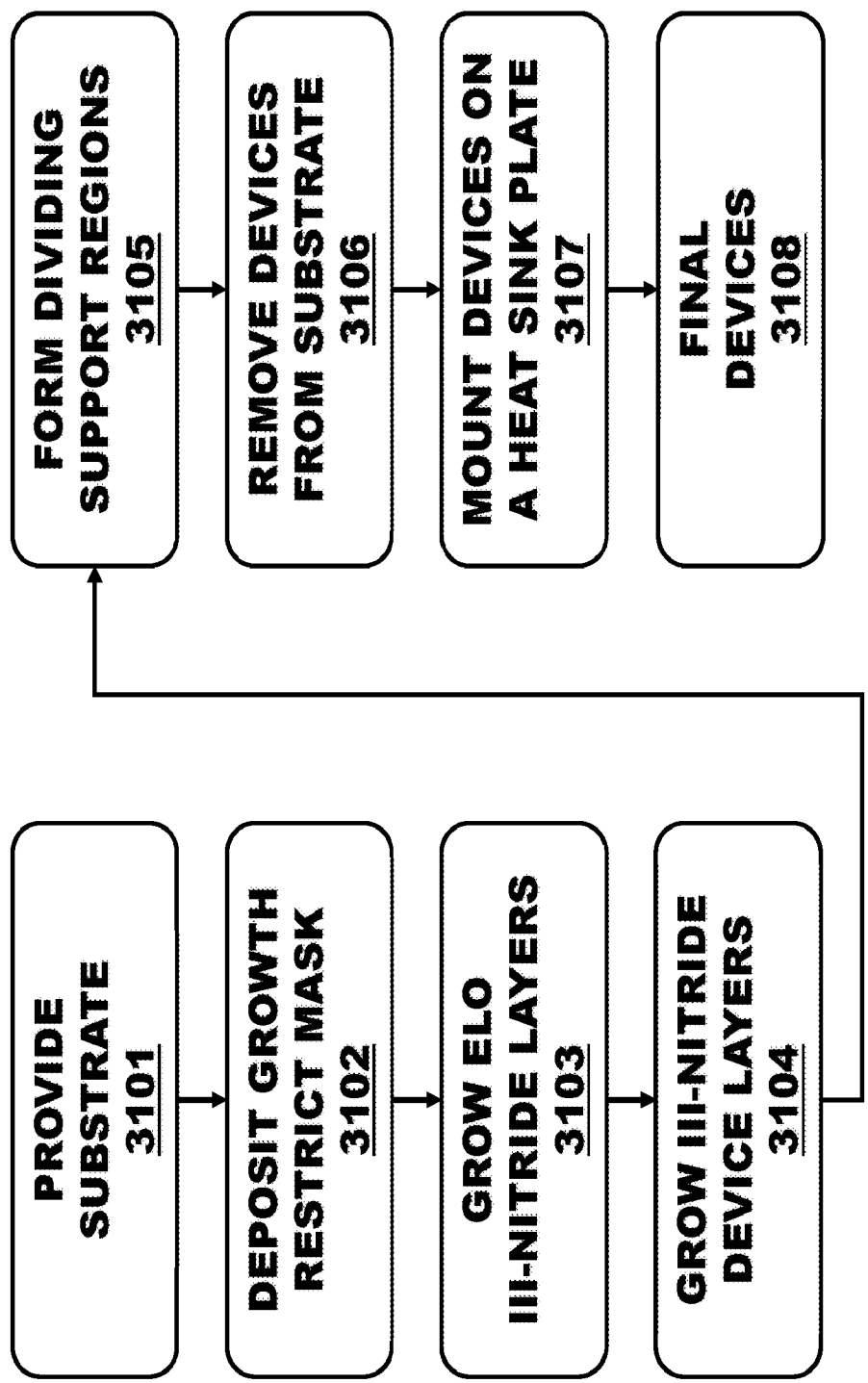
FIG. 31 is a flowchart that illustrates a method for dividing a bar of one or more devices.

FIG. 31 is a flowchart that illustrates a method for flattening a surface on the ELO nitride layers 105, resulting in obtaining a smooth surface with the island-like III-nitride semiconductor layers 109. The island-like III-nitride semiconductor layers 109 are formed by stopping growth of the ELO III-nitride layers 105 before the ELO III-nitride layers 105 coalesce to each other, and then growing one or more III-nitride device layers 106 on or above the ELO III-nitride layers 106. The growth restrict mask 102 is removed before growing at least some of the III-nitride device layers 106, in order to decrease an excess gases supply to side facets of the island-like III-nitride semiconductor layers 109. The method further comprises preventing compensation of a p-type layer of the III-nitride device layers 106 by decomposed n-type dopants from the growth restrict mask 102. The steps of the method are described in more detail below.

Block 3101 represents the step of providing a base substrate 101. In one embodiment, the base substrate 101 is a III-nitride based substrate 101, such as a GaN-based substrate 101, or a hetero-substrate 101, such as a sapphire substrate 101. This step may also include an optional step of depositing a template layer 112 on or above the substrate 101, wherein the template layer 11 may comprise a buffer layer or an intermediate layer, such as a GaN underlayer.

Block 3102 represents the step of forming a growth restrict mask 102 on or above the substrate 101, i.e., on the substrate 101 itself or on the template layer 112. The growth restrict mask 102 is patterned to include a plurality of striped opening areas 103.

Block 3103 represents the step of growing one or more III-nitride based layers 105 on or above the growth restrict mask 102 using epitaxial lateral overgrowth (ELO). This step includes stopping the growth of the ELO III-nitride layers 105 before adjacent ones of the ELO III-nitride layers 105 coalesce to each other.

Block 3104 represents the step of growing one or more additional III-nitride device layers 106 on or above the ELO III-nitride layer 105, thereby forming a bar 501. These additional III-nitride device layers 106, along with the ELO III-nitride layer 105, create one or more of the island-like III-nitride semiconductor layers 109. Preferably, the III-nitride device layers 106 do not have an edge growth.

This step may include removing at least part of the growth restrict mask 102 after growing the ELO III-nitride layers 105 and before growing at least some of the III-nitride device layers 106, in order to obtain a smooth surface for the III-nitride device layers 106.

The III-nitride device layers 106 may include a low-temperature growth layer, an Indium-containing layer, an Aluminum-containing layer, and/or a p-type layer, and the growth restrict mask 102 may be removed before growing the low-temperature growth layer, Indium-containing layer, Aluminum-containing layer, and/or p-type layer. The growth restrict mask 102 may be removed before growing the p-type layer to avoid compensation of the p-type layer due to decomposition of the growth restrict mask 102. The growth restrict mask 102 also may be removed before growing at least an active layer of the III-nitride device layers 106.

The growth restrict mask 102 may be removed before growing the III-nitride device layers 106 to avoid a non-uniformity of supply gases near edges of the ELO III-nitride layers 105, by decreasing an amount of the supply gases near the edges of the ELO III-nitride layers 105.

The growth restrict mask 102 may be removed before growing the III-nitride device layers 106 and growth of the III-nitride device layers 106 results in growth of a bottom layer 111 where the growth restrict mask 102 is removed. Preferably, the bottom layer 111 does not connect to the island-like III-nitride semiconductor layers 109. The bottom layer 111 does not grow, or has a slow growth rate, at an area at an edge of the growth restrict mask 102, because the edge of the growth restrict mask 102 shadows the area from supply gases. In addition, the ELO III-nitride layers 105 may have a height that prevents the bottom layer 111 from growing or slows the growth of the bottom layer 111.

A side facet of the ELO III-nitride layers 105 may make a space at a bottom area that reduces the supply gases to the bottom layer 111, wherein a width of the bottom area depends on a shape of the side facet. An edge of the side facet is located outside a bottom edge line, so that the edge of the side facet reduces the supply gases, which makes a width of the bottom area longer. Alternatively, the side facet does not have an edge located outside a bottom edge line, which makes a width of the bottom area shorter. The supply gases at the side facet are consumed at the growth area before reaching the side facet of the island-like III-nitride semiconductor layers 109, which avoids supplying the excess gases to the side facet.

Block 3105 represents the step of forming one or more dividing support regions 502 along the bar 501. The dividing support regions 502 may be formed on a first facet 505 and/or second facet 506 of the bar 501. In addition, the dividing support regions 502 may be formed on one side or both sides of the bar 501. The dividing support regions 502 are formed at periodic lengths, wherein each period is determined by the device's length, and each of the dividing support regions 502 comprises a scribed line. In addition, the dividing support regions 502 are created at a flat surface region 107 in a manner that avoids a current injection region 503.

Block 3106 represents the step of removing devices 110 from the substrate 101. This step may include applying a polymer film 801 to the bar 501 to remove the bar 501 from the substrate 101 using a cleaving technique on a surface of the substrate 101, which includes mechanically separating or peeling the island-like III-nitride semiconductor layers 109 from the substrate 101. The polymer film 801 is applied to the bar 501 by applying pressure to the film 801 and the substrate 101 using plates 806. The method may also include changing a temperature of the film 801 and the substrate 101, while the pressure is applied, thereby utilizing a difference in thermal coefficients between the film 801 and the substrate 101 for removing the bar 501 from the substrate 101. This step may include dividing the bar 501 into one or more devices 110 by cleaving at the dividing support regions 502 formed along the bar 501. This step may also include the creating of one or more facets 504 on each of the laser diode devices 110.

Block 3107 represents the step of mounting each of the devices 110 on a heat sink plate 1505 for coating one or more of the facets 504 of the devices 110 created by the cleaving. This step also includes separating the devices 110 by dividing the heat sink plate 1505 at trenches 1507 in the heat sink plate 1505. The heat sink plate 1505 may be divided before or after wire bonds 1701, 1702 are attached to the devices 110.

Block 3108 represents the resulting product of the method, namely, one or more III-nitride based semiconductor devices 110 fabricated according to this method, as well as a substrate 101 that has been removed from the devices 110 and is available for recycling and reuse.

The device 110 may comprise one or more ELO III-nitride layers 105 grown on or above a growth restrict mask 102 on a substrate 101, wherein the growth of the ELO III-nitride layers 105 is stopped before adjacent ones of the ELO III-nitride layers 105 coalesce to each other. The device 110 may further comprise one or more III-nitride device layers 106 grown on or above the ELO III-nitride layers 105 and the substrate 101, wherein at least part of the growth restrict mask 102 is removed after the ELO III-nitride layers 105 are grown and before at least some of the III-nitride device layers 106 are grown, in order to obtain a smooth surface for the III-nitride device layers 106.

Modifications and Alternatives

A number of modifications and alternatives can be made without departing from the scope of the present invention.

For example, the present invention may be used with III-nitride substrates of various orientations, including c-plane (0001), basal nonpolar m-plane {10-10} families; and semipolar plane families that have at least two nonzero h, i, or k Miller indices and a nonzero 1 Miller index, such as the {20-2-1} planes. Semipolar substrates of (20-2-1) are especially useful, because of the wide area of flattened ELO growth.

In another example, the present invention is described as being used to fabricate different opto-electronic device structures, such as a light-emitting diode (LED), laser diode (LD), Schottky barrier diode (SBD), or metal-oxide-semiconductor field-effect-transistor (MOSFET). The present invention may also be used to fabricate other opto-electronic devices, such as micro-LEDs, vertical cavity surface emitting lasers (VCSELs), edge-emitting laser diodes (EELDs), and solar cells.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for manufacturing a semiconductor layer, comprising:
preparing a plurality of epitaxial lateral overgrowth (ELO) III-nitride layers grown on or above a growth restrict mask on a substrate, wherein adjacent ones of the plurality of ELO III-nitride layers are separated from each other by a no-growth region;
removing of the growth restrict mask in the no-growth region, wherein the growth restrict mask does not remain between adjacent ones of the plurality of ELO III-nitride layers and a portion of the growth restrict mask remains between the substrate and the plurality of ELO III-nitride layers; and growing a plurality of III-nitride device layers on or above the plurality of ELO III-nitride layers and the substrate, wherein adjacent ones of the plurality of III-nitride device layers are separated from each other by the no-growth region;

wherein:

the growth restrict mask is removed after growing the plurality of ELO III-nitride layers and before growing at least some of the plurality of III-nitride device layers; and the plurality of ELO III-nitride layers are grown to a height that prevents growth of a bottom layer in the no-growth region where the growth mask is removed, during the growth of the III-nitride device layers.

2. The method of claim 1, wherein the III-nitride device layers include a p-type layer.

3. The method of claim 1, wherein at least a part of the growth restrict mask is removed where the growth restrict mask is not covered by the ELO III-nitride layers.

4. The method of claim 1, wherein the III-nitride device layers include a low-temperature growth layer, an Indium-containing layer, an Aluminum-containing layer, and/or a p-type layer, and the growth restrict mask is removed before growing the low-temperature growth layer, Indium-containing layer, Aluminum-containing layer, and/or p-type layer.

5. The method of claim 4, wherein the growth restrict mask is removed before growing the p-type layer to avoid compensation of the p-type layer due to decomposition of the growth restrict mask.

6. The method of claim 1, wherein the growth restrict mask is removed before growing at least an active layer of the III-nitride device layers.

7. The method of claim 1, wherein the ELO III-nitride layers and the III-nitride device layers together comprise island-like III-nitride semiconductor layers, and adjacent ones of the island-like III-nitride semiconductor layers are separated from each other by the no-growth region.

* * * * *